US006776173B2

(12) United States Patent
Kamikawa

(10) Patent No.: US 6,776,173 B2
(45) Date of Patent: Aug. 17, 2004

(54) LIQUID PROCESSING APPARATUS

(75) Inventor: Yuji Kamikawa, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 266 days.

(21) Appl. No.: 09/888,380

(22) Filed: Jun. 26, 2001

(65) Prior Publication Data

US 2002/0000240 A1 Jan. 3, 2002

(30) Foreign Application Priority Data

Jun. 30, 2000 (JP) ........................................ 2000-198645
Jun. 30, 2000 (JP) ........................................ 2000-198646
Dec. 15, 2000 (JP) ........................................ 2000-381717

(51) Int. Cl.[7] .............................................. B08B 3/04
(52) U.S. Cl. ...................... 134/57 R; 134/66; 134/153; 134/158; 134/161; 134/902
(58) Field of Search .............................. 134/57 R, 63, 134/66, 153, 158, 161, 902; 18/52, 53, 500, 501

(56) References Cited

U.S. PATENT DOCUMENTS 3,889,632 A * 6/1975 Brunner et al. ............. 118/730
5,055,036 A * 10/1991 Asano et al. ................... 432/5
5,873,177 A * 2/1999 Honda et al. ................... 34/58
6,009,890 A * 1/2000 Kaneko et al. ............. 134/133
6,068,002 A * 5/2000 Kamikawa et al. ........... 134/66
6,559,461 B1 * 5/2003 Seo ........................ 250/492.21

FOREIGN PATENT DOCUMENTS

JP        2001-77075        3/2001

* cited by examiner

Primary Examiner—Frankie L. Stinson
Assistant Examiner—Joseph L Perrin
(74) Attorney, Agent, or Firm—Smith, Gambrell & Russell, LLP

(57) ABSTRACT

A liquid processing apparatus has a substrate rotating device including a holder for holding a substrate and a motor, a chamber for applying the liquid processing to the substrate, a posture changing mechanism for changing the posture of the substrate rotating device at outside of the chamber such that a state of the substrate held by the holder changes between vertical and horizontal, and a position adjusting mechanism for relatively adjusting the positions of the chamber and the substrate rotating device together with the posture changing mechanism such that the holder is housed in the chamber. The substrate is taken out from the container and held by the holder in a horizontal state. After the posture of the holder was changed to vertical, a process liquid is supplied to the substrate of vertical state.

20 Claims, 31 Drawing Sheets

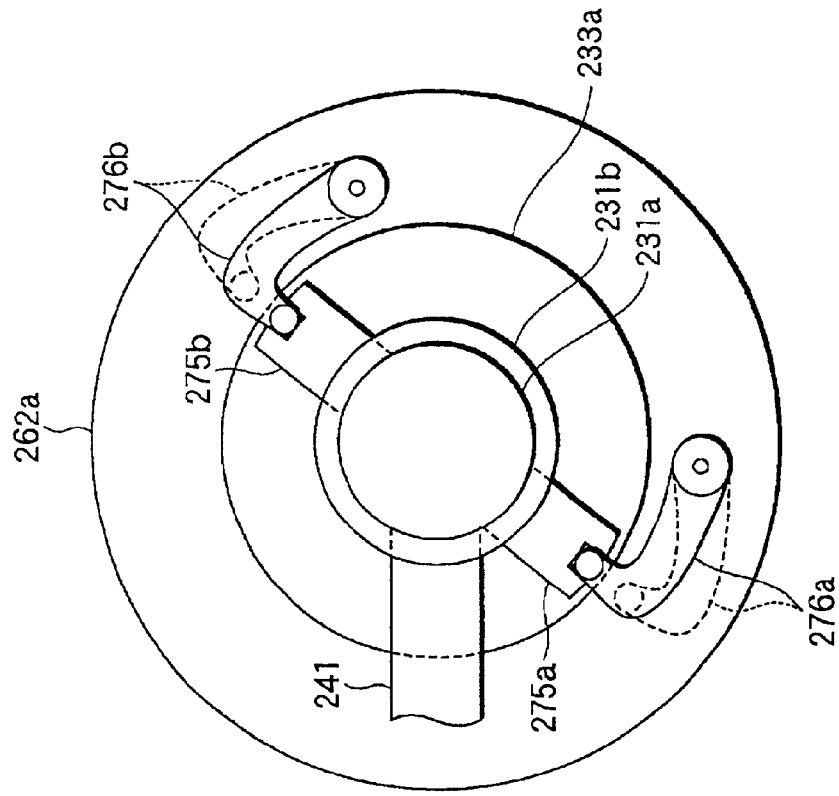
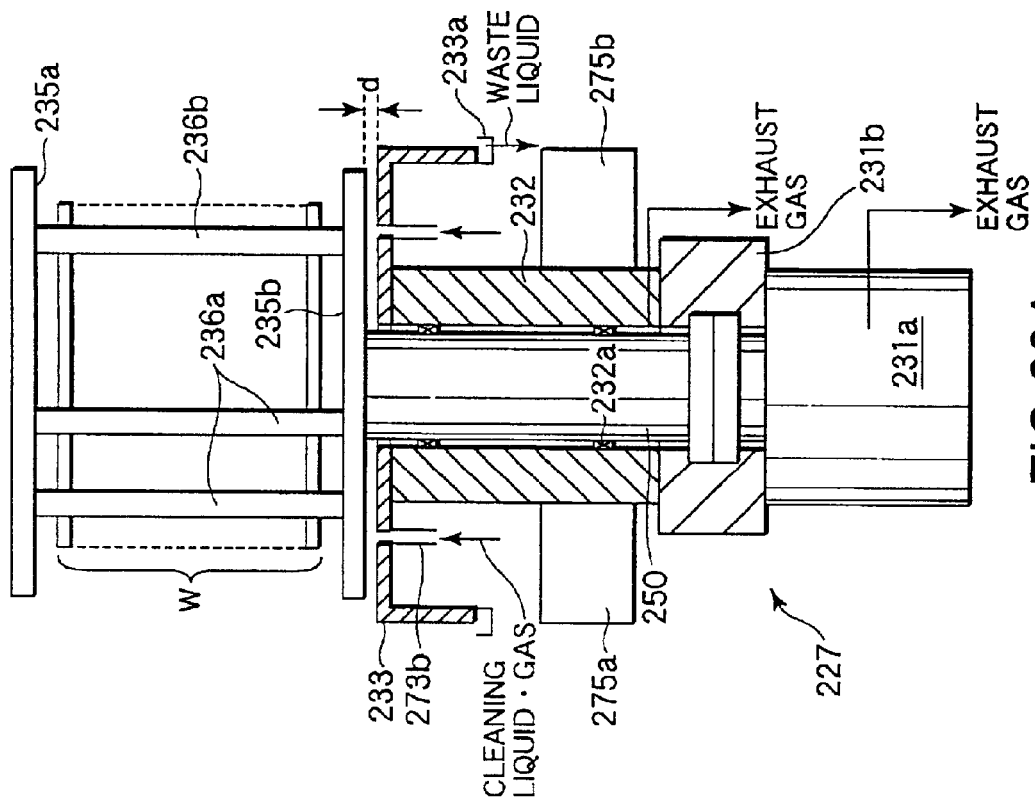
FIG.23A
FIG.23B (STATE AT POSITION P1)

(STATE AT POSITION P2)
DOTTED LINE:VERTICAL POSTURE
SOLID LINE:LATERAL POSTURE

DOTTED LINE:LATERAL POSTURE
AT POSITION P2
SOLID LINE:STATE AT POSITION P3

DOTTED LINE:
STATE AT POSITION P3
SOLID LINE:
STATE AT POSITION P4

(WHEN NOT SEALED)

(WHEN SEALED)

LIQUID PROCESSING APPARATUS

BACKGROUND OF THE INVENTION

1. Field of the Invention

The present invention relates to a liquid processing apparatus used for applying a predetermined liquid processing or drying processing to various substrates such as a semiconductor wafer and a LCD substrate.

2. Description of the Related Art

In, for example, the manufacturing process of a semiconductor device, used are a wafer cleaning apparatus for cleaning a semiconductor wafer (wafer) used as a substrate with a predetermined chemical liquid or a pure water for removing from the wafer the contaminants such as particles, an organic contaminant and metallic impurities, and a wafer drying apparatus for removing liquid droplets from the wafer by using an inert gas such as a nitrogen gas ($N_2$ gas) or an IPA vapor having a high volatility and a high hydrophilic nature so as to dry the wafer.

Known are a single wafer type cleaning apparatus or drying apparatus in which the wafers are processed one by one and a batch type cleaning apparatus or drying apparatus in which a plurality of wafers are housed in a wafer cleaning chamber or a wafer drying chamber for processing these wafers in a batch system.

Known as a single wafer cleaning apparatus is an apparatus called scrubber, in which a wafer is held at its peripheral portion or back surface and a process liquid is spurted to the front and back surfaces of the wafer while rotating the wafer within a horizontal plane, or a brush or the like, which is kept rotated, is scanned on the front surface of the wafer.

However, where a cleaning treatment is performed with the wafer held horizontal, a problem is generated that, when the wafer is rotated after the cleaning treatment for removing the cleaning liquid attached to the wafer, it is difficult to remove the cleaning liquid satisfactorily. Also, where the cleaning treatment is performed with the wafer held horizontal, the inner volume of the cleaning process chamber is increased in general, with the result that the amount of the exhaust gas is increased when the cleaning process chamber is exhausted. Therefore, the temperature of the chemical liquid used tends to be lowered, leading to an additional problem that it is rendered difficult to use a chemical liquid of a high temperature. Further, where the cleaning process chamber is of a hermetic structure for the control of the atmosphere, another problem is generated that the control program for controlling the opening-closing mechanism of the cleaning process chamber and the delivery mechanism to the cleaning process chamber of the wafer is rendered complex. In addition, where the wafer is disposed horizontal, it is difficult to superpose a plurality of wafers one upon the other in a vertical direction for processing the wafers.

On the other hand, a wafer cleaning apparatus 500 shown in, for example, FIG. 31 is known as a batch type cleaning process apparatus. As shown in the drawing, the wafer cleaning apparatus 500 comprises a process chamber 502 forming a wafer cleaning chamber 501. A rotor 505 arranged to be capable of holding a wafer W and rotatable is movable into and out of the process chamber 502 through a wafer delivery port 503 formed forward of the process chamber 502. Delivery of the wafer W can be performed between the rotor 505 and wafer chucks 509a, 509b of a transfer arm, with the rotor 505 moved forward of the process chamber 502. A reference numeral 507 shown in FIG. 31 represents a driving mechanism for moving back and forth and rotating the rotor 505. A reference numeral 508 represents a rotary shaft. A reference numeral 504 represents a lid of the process chamber 502. Further, a reference numeral 506 shown in FIG. 31 represents a holding member of the rotor 505.

However, in the wafer cleaning apparatus 500 shown in FIG. 31, it is necessary to control the operation of the apparatus 500 in a manner to prevent the collision between the wafer chucks 509a, 509b and the holding member 506 of the rotor 505, leading to a problem that the operating program is rendered complex.

In recent years, the wafer size is increased from 200 mmφ to 300 mmφ in accordance with progress in the miniaturization, degree of integration and mass production of semiconductor devices. A container capable of housing wafers in a vertical state was used for storing and transferring the wafers when it comes to the wafers of 200 mmφ. However, a container housing the wafers in a horizontal state has come to the used when it comes to the wafers of 300 mmφ because the wafer is large and heavy.

Even where the wafers are transferred in a horizontal state, it is desirable to carry out the cleaning treatment itself of the wafers, with the wafers held substantially vertical as in the prior art. Under the circumstances, it is necessary to arrange, for example, a posture changing mechanism for changing the posture of the wafer between the horizontal state and the vertical state in the conventional apparatus in which the wafers were held substantially vertical for the transfer including the wafer cleaning apparatus 500 shown in FIG. 31. As a result, problems are generated that the transfer mechanism of the wafers is rendered complex and that the wafers tend to be contaminated and broken because the number of times of transplanting the wafers among the mechanisms handling the wafers is increased.

It should also be noted that, if the mechanism and member of each section handling the wafers is rendered bulky to conform with the size of the wafer without changing the construction of the conventional cleaning process apparatus, it is unavoidable for the entire cleaning process apparatus to be rendered bulky. Under the circumstances, it is highly desirable to improve the construction of the apparatus so as to suppress the enlargement of the apparatus as much as possible. It is also highly desirable to suppress the enlargement of the cleaning process apparatus in respect of the single wafer cleaning process apparatus.

BRIEF SUMMARY OF THE INVENTION

A first object of the present invention is to provide a liquid processing apparatus capable of carrying out the liquid processing such as the cleaning of a substrate with a high precision and with a high efficiency.

A second object of the present invention is to provide a liquid processing apparatus, which is basically an apparatus for applying a liquid processing to a single substrate and capable of easily coping with the processing of a plurality of substrates.

Further, a third object of the present invention is to provide a compact liquid processing apparatus, which permits suppressing the enlargement of the processing apparatus when the design of the apparatus is changed for applying a liquid processing to a substrate having a large outer diameter.

According to a first aspect of the present invention, there is provided a liquid processing apparatus, in which a process liquid is supplied to a substrate for performing a liquid processing, comprising a substrate rotating device including a holder for holding a substrate and a rotating device for rotating said holder; a posture changing mechanism for changing the posture of said substrate rotating device such that a state of the substrate held by said holder changes between substantially vertical and substantially horizontal; a process chamber for applying a predetermined liquid processing to the substrate held substantially vertical by said holder; and a position adjusting mechanism for relatively adjusting the positions of said process chamber and said holder such that said holder is housed in said process chamber.

According to a second aspect of the present invention, there is provided a liquid processing apparatus, in which a process liquid is supplied to a substrate for performing a liquid processing, comprising: a holder for holding substantially in parallel a plurality of substrates a predetermined distance apart from each other; a container delivery section for delivering a container having a plurality of substrates housed therein substantially horizontal a predetermined distance apart from each other; a substrate transfer device for transferring a plurality of substrates in a substantially horizontal state between a container disposed in said container delivery section and said holder; a posture changing mechanism for changing the posture of said holder such that a state of the substrates held by said holder changes between substantially vertical and substantially horizontal; a process chamber, which houses said holder, for applying a predetermined liquid processing to the substrate held substantially vertical by said holder; a moving mechanism for sliding both said holder and said posture changing mechanism such that said holder is housed in said process chamber; and a holder transfer/rotation driving mechanism for transferring said holder within said process chamber and rotating said holder.

According to a third aspect of the present invention, there is provided a liquid processing apparatus, in which a process liquid is supplied to a substrate for performing a liquid processing, comprising: a holder for holding a substrate; rotor for rotating said holder; a process chamber, which includes a delivery port for moving said holder into and out of said process chamber and houses said holder, for applying a predetermined liquid processing to the substrate held by said holder; and a lid for closing the delivery port formed in said process chamber under the state that said holder is housed in said process chamber; wherein said holder, said rotor and said lid are formed as an integral structure.

The liquid processing apparatus according to any of the first to third aspects of the present invention described above employs a method that was not employed in the past, i.e., the method that the posture of the holder for holding the substrate is changed such that a state of the substrate can change between substantially horizontal and substantially vertical. The particular method employed in the present invention permits suppressing the enlargement of the entire liquid processing apparatus so as to realize a compact liquid processing apparatus, compared with the case where the conventional liquid processing apparatus is simply enlarged to conform with the increase in the size of the substrate. It should also be noted that, even where the substrates are held in a container in a horizontal state, it is unnecessary to arrange another posture changing mechanism between the container and the holder because it is possible to change the posture of the holder holding the substrates. It follows that it is possible to simplify the transfer process of the substrates, making it possible to simplify the construction of the entire liquid processing apparatus. Further, since the number of times of transplanting the substrate is decreased, it is possible to suppress the particle generation so as to suppress the contamination of the substrate. In addition, the substrate is unlikely to be damaged. Still further, since a liquid processing is applied to the substrate that is held substantially vertical, the process liquid attached to the substrate can be removed easily. Also, a liquid processing can be applied uniformly on any of the front and back surfaces of the substrate. What should also be noted is that, since the atmosphere within the process chamber can be controlled easily, the drying operation can also be performed easily.

BRIEF DESCRIPTION OF THE SEVERAL VIEWS OF THE DRAWING

FIG. 23A is a cross sectional view schematically showing the construction of the rotor rotating mechanism included in the cleaning process apparatus shown in FIG. 19;

FIG. 23B is a front view showing the state that the rotor rotating mechanism shown in FIG. 23A is inserted into the outside chamber;

DETAILED DESCRIPTION OF THE INVENTION

Some embodiments of the present invention will now be described in detail with reference to the accompanying drawings. The liquid cleaning apparatus of the present invention can be used as, for example, a cleaning process apparatus or a drying process apparatus with various substrates used as target objects to be processed. In this embodiment, the liquid processing apparatus is used as a cleaning process apparatus constructed such that the transfer of a semiconductor wafer (wafer) into a process chamber, the cleaning of the wafer, the drying of the wafer and the transfer of the wafer out of the process chamber can be consistently performed.

Figure 1:
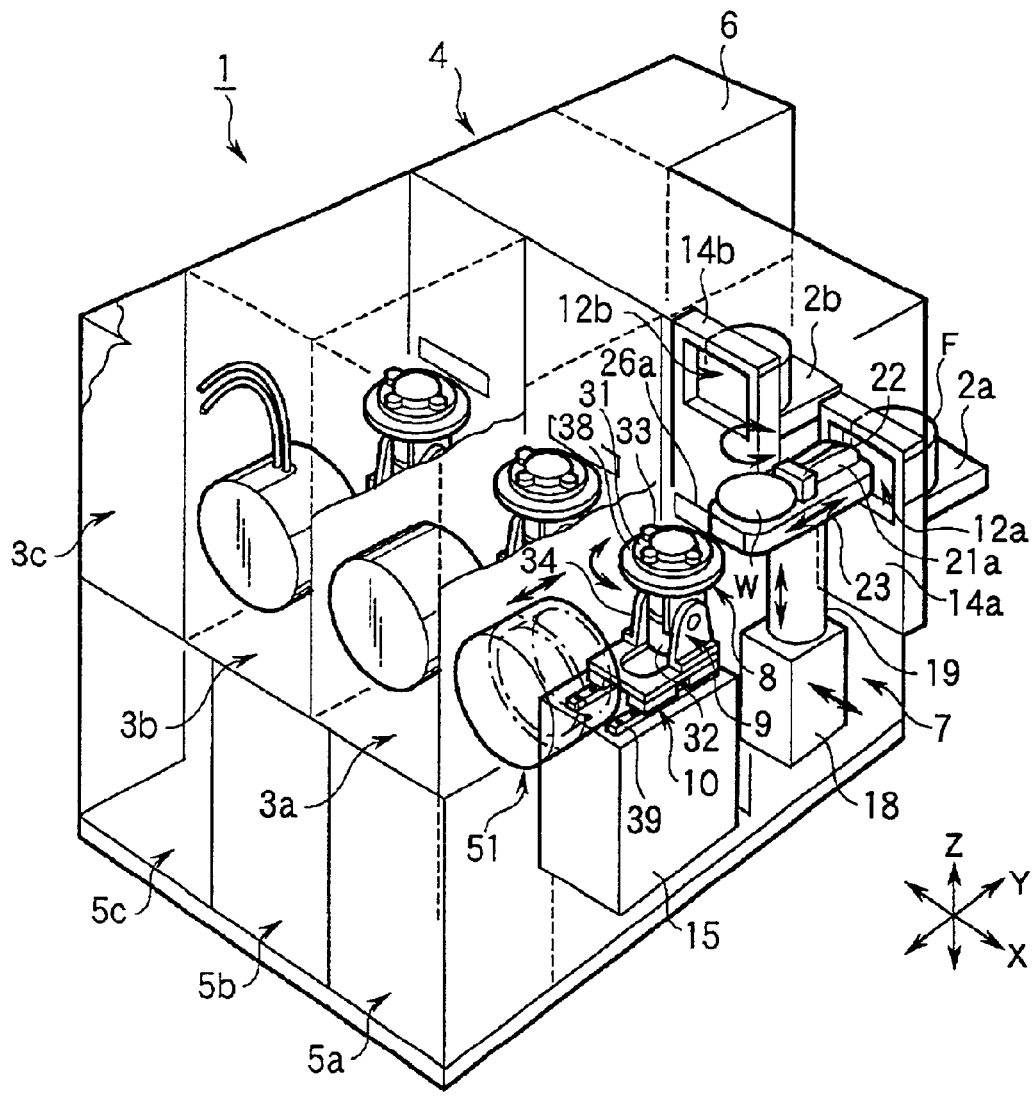
FIG. 1 is an oblique view schematically showing the construction of a single wafer cleaning process apparatus according to one embodiment of the liquid processing apparatus of the present invention.
Figure 2:
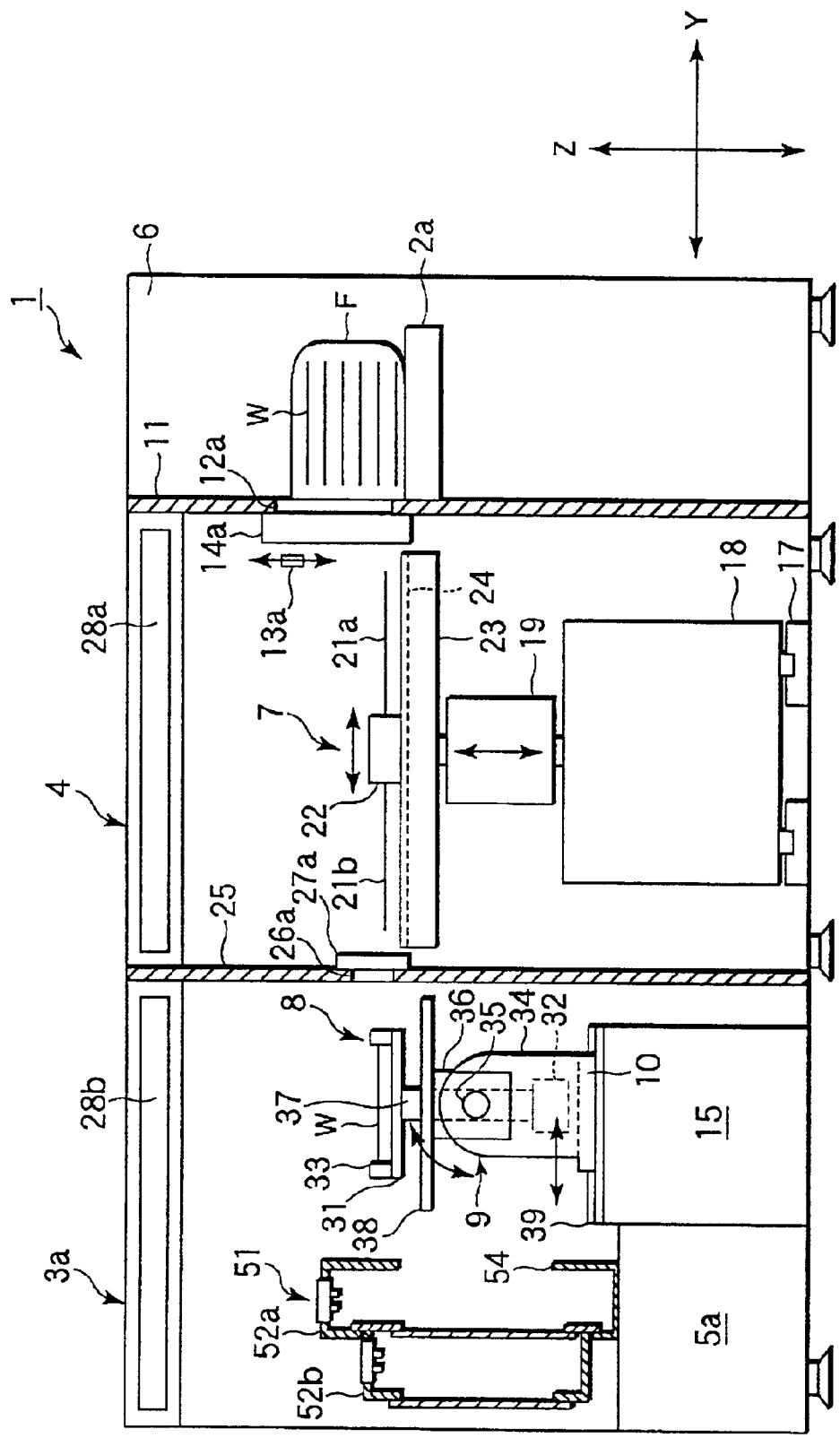
FIG. 2 is a vertical sectional view schematically showing the construction of the cleaning process apparatus shown in FIG. 1.
Figure 3:
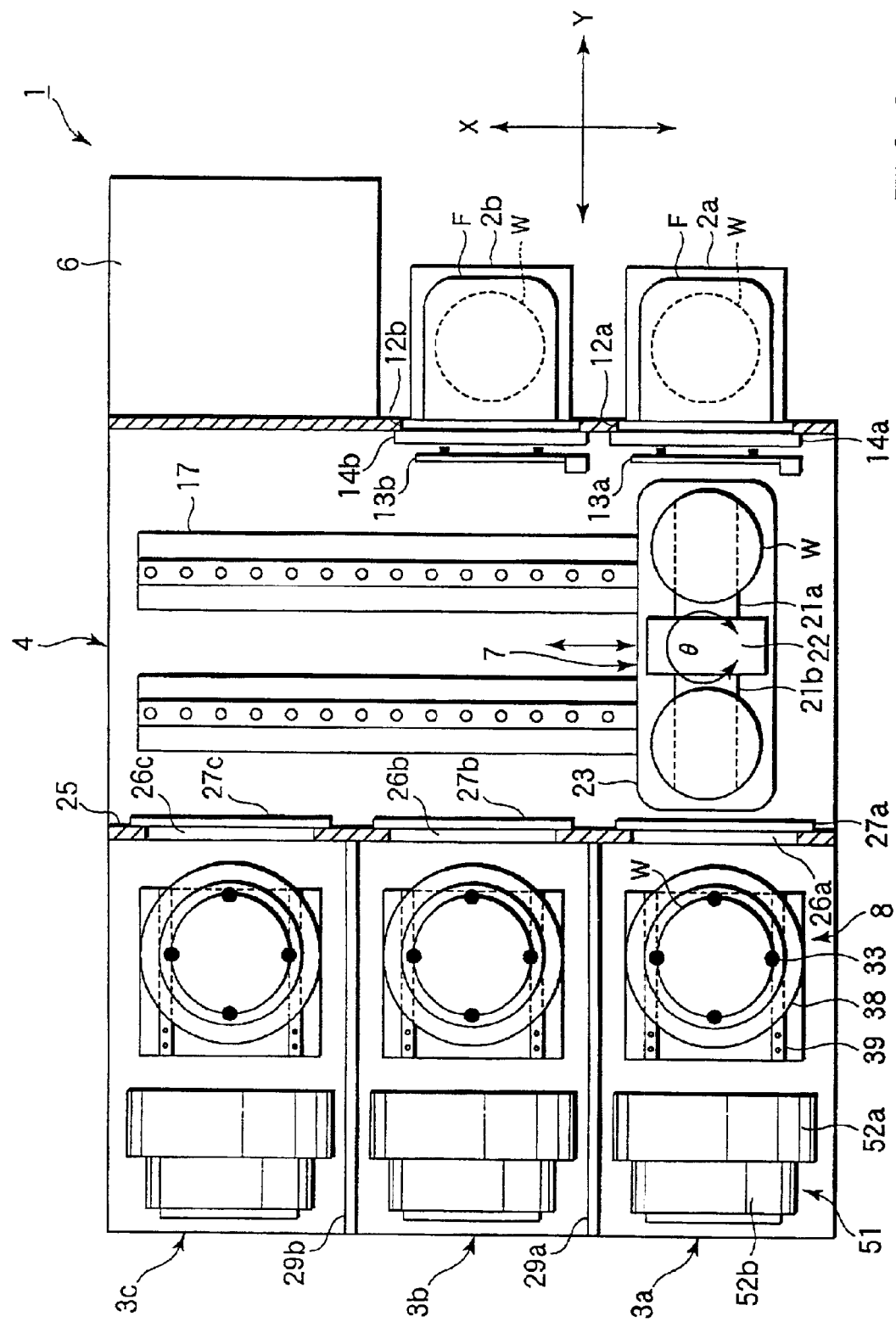
FIG. 3 is a cross-sectional plan view schematically showing the construction of the cleaning process apparatus shown in FIG. 1.

FIG. 1 is an oblique view schematically showing the construction of a single wafer cleaning process apparatus 1 according to one embodiment of the liquid processing apparatus of the present invention. FIG. 2 is a vertical sectional view of the apparatus 1 shown in FIG. 1 and FIG. 3 is a cross-sectional plan view of the apparatus 1 shown in FIG. 1. As apparent from FIGS. 1 to 3, the cleaning process apparatus 1 comprises mainly FOUP stages 2a and 2b in each of which is disposed a FOUP (Front Opening Unified Pod) F as a container capable of housing a plurality of wafers W, e.g., 25 wafers W, in a horizontal state, cleaning process units 3a to 3c in each of which a cleaning treatment is applied to the wafer W, a wafer transfer unit 4 arranged between the FOUP stages 2a, 2b and the cleaning process units 3a to 3c for transferring the wafer W, chemical liquid storing units 5a to 5c for storing a chemical liquid used for the cleaning treatment, and a power source unit 6 for various electric driving mechanisms arranged within the cleaning process apparatus 1.

The FOUPs F are disposed on the FOUP stages 2a, 2b such that the delivery ports formed in the FOUPs F for delivering the wafers W held by the FOUPs F are allowed to face window portions 12a (on the side of the FOUP stage 2a) and 12b (on the side of the FOUP stage 2b) formed in a wall portion 11 of the wafer transfer unit 4.

Opening/closing devices 14a (on the side of the FOUP stage 2a) and 14b (on the side of the FOUP stage 2b) for opening/closing the shutters for opening/closing the window portions 12a, 12b and the lids for opening/closing the delivery port of the FOUP F are arranged inside the wall portion 11 (on the side of the wafer transfer unit 4). Under the state that the FOUPs F are not disposed on the FOUP stages 2a, 2b, the shutters are kept closed. On the other hand, the shutters and the lids of the FOUPs F are opened by the opening/closing device 14 when the wafers W are taken out of the FOUPs F or put in the FOUPs F.

Detection sensors 13a (on the side of the FOUP stage 2a) and 13b (on the side of the FOUP stage 2b) for counting the number of wafers within the FOUPs F are arranged contiguous to the opening/closing devices 14a, 14b within the wafer transfer unit 4. Each of these detection sensors 13a, 13b counts the number of wafers W at two points at the edges of the wafer W in an X-direction while scanning, for example, an infrared ray sensor in a Z-direction.

It is more desirable for the detection sensors 13a, 13b to perform the function of detecting the housed state of the wafers W in addition to the function of counting the number of wafers. To be more specific, it is more desirable for the detection sensors 13a, 13b to perform the function of detecting whether or not the wafers W are arranged one by one in parallel within the FOUP F at a predetermined pitch, whether or not the wafers W are obliquely disposed on different stages within the FOUP F, and whether or not the wafers W are deviated from the predetermined positions within the FOUP F. It is also possible to detect first the housed state of the wafers W, followed by counting the number of wafers W by using the same detection sensors. Incidentally, if such a detection sensor is mounted to a wafer transfer device 7 to permit the detection sensor to be movable together with the wafer transfer device 7, it is possible to arrange the detection sensor at only one point.

The wafer transfer device 7 referred to above, which serves to transfer the wafer W in a horizontal state between the FOUPs F disposed on the FOUP stages 2a, 2b and wafer holding members 33 arranged on spin plates 31, is arranged within the wafer transfer unit 4. The wafer transfer device 7 has a transfer arm 21a for transferring an unprocessed wafer W and another transfer arm 21b for transferring the wafer W after the liquid cleaning treatment. Each of these transfer arms 21a and 21b is capable of holding a single wafer W.

A transfer arm holding section 22 for holding the transfer arms 21a, 21b has a Y-axis driving mechanism (not shown) housed therein and is capable of sliding in the Y-direction along a groove portion formed in a table 23 or a guide mechanism 24 such as a guide rail. Also, the transfer arm holding section 23 is capable of rotation within an X-Y plane (θ direction) together with the transfer arms 21a, 21b. It is possible to arrange a θ-rotation driving mechanism (not shown) for performing the rotation in the θ direction within, for example, the transfer arm holding section 23. Alternatively, it is also possible to construct the system such that the table 23 is also rotated together.

The transfer arms 21a, 21b, the transfer arm holding section 22 and the table 23 can be moved in a Z-direction (vertical direction) by a Z-axis driving mechanism 19. Since the wafers W are housed within the FOUP F at different height positions, the height of the transfer arm 21a is aligned with the height of a predetermined wafer W by operating the Z-axis driving mechanism 19. For example, when the wafer W housed in a predetermined position within the FOUP F is taken out, the height of the transfer arm 21a is controlled by the Z-axis driving mechanism 19 such that the transfer arm 21a can be inserted into a position exactly below the particular wafer W. Then, the transfer arm 21a is inserted into the FOUP F by operating the Y-axis driving mechanism, followed by moving upward the transfer arm 21a by a predetermined height by operating the Z-axis driving mechanism 19 so as to permit the transfer arm 21a to hold the wafer W. Under this condition, the transfer arm 21a is moved back to the original position by operating the Y-axis driving mechanism so as to take the wafer W out of the FOUP F.

The transfer arms 21a, 21b, the transfer arm holding section 22 and the table 23 can also be moved in an X-direction along a guide rail 17 by operating an X-axis driving mechanism 18. Also, the wafer transfer device 7 is capable of gaining access to any of the FOUPs F disposed on the FOUP stages 2a and 2b. The wafer transfer device 7 is also capable of gaining access to any of the spin plates 31 arranging in the cleaning process units 3a to 3c.

In the case of using the Y-axis driving mechanism, the θ-rotation driving mechanism, the X-axis driving mechanism 18 and the Z-axis driving mechanism 19 described above, it is possible to permit, for example, the transfer arm 21a to be inserted into the FOUP F disposed on the FOUP stage 2a so as to take the wafer W out of the FOUP F by driving the Y-axis driving mechanism and the Z-axis driving mechanism, followed by driving the θ-rotation driving mechanism and the X-axis driving mechanism 18 so as to change the direction of the transfer arm 21a by 180° in a manner to permit the wafer W to face the cleaning process unit 3a and subsequently driving the Y-axis driving mechanism and the Z-axis driving mechanism 19 so as to deliver the wafer W from the transfer arm 21a onto the wafer holding member 33 on the spin plate 31 arranged in the cleaning process unit 3a. It is also possible to perform the reverse operation. Incidentally, it is possible for the transfer arms 21a, 21b to be formed shrinkable like, for example, multi-joint arms. In this case, the transfer arms 21a, 21b can be used in place of the Y-axis driving mechanism, or together with the Y-axis driving mechanism, for transferring the wafer between the FOUP F and the spin plate 31.

A filter fan unit (FFU) 28a is arranged in the ceiling portion of the wafer transfer unit 4 so as to blow the air from which particles have been removed into the wafer transfer unit 4. Openable window portions 26a to 26c are formed in wall portions 25 forming the boundaries between the wafer transfer unit 4 and the cleaning process units 3a to 3c so as to permit delivery of the wafers W between the wafer transfer device 7 and the spin plates 31 formed in the cleaning process units 3a to 3c. Shutters 27a to 27c for opening/closing the window portions 26a to 26c are arranged in the window portions 26a to 26c on the side of the wafer transfer unit 4 so as to separate the atmosphere within the wafer transfer unit 4 and the atmosphere within the cleaning process units 3a to 3c. The vapors of various chemical liquids used in the cleaning process units 3a to 3c are prevented by the shutters 27a to 27c from entering the wafer transfer unit 4. It is possible to arrange the shutters 27a to 27c on the side of the cleaning process units 3a to 3c.

The cleaning process units 3a to 3c are separated from each other by partition walls 29a, 29b so as to prevent the atmospheres within the cleaning process units 3a to 3c from being diffused into each other, making it possible to use cleaning liquids differing from each other in the cleaning process units 3a to 3c for carrying out the cleaning treatment. Since all the cleaning process units 3a to 3c are equal to each other in construction, the construction of the cleaning process unit 3a will now be described as the representative.

A filter fan unit (FFU) 28b is arranged in the ceiling portion of the cleaning process unit 3a for blowing the air from which particles have been removed into the cleaning process unit 3a. A wafer rotating device 8 comprising the spin plate 31 and a motor 32 for rotating the spin plate 31, said motor 32 being connected to the spin plate 31 via a pivot 37, is arranged in the cleaning process unit 3a. The wafer holding member 33 for holding the wafer W is arranged on the surface of the spin plate 31, and the wafer W is held by the wafer holding member 33 above the spin plate 31 such that the front and back surfaces of the wafer W are substantially parallel to the front surface of the spin plate 31. In other words, the wafer W is held in a floating state by the wafer holding member 33 a predetermined distance apart from the front surface of the spin plate 31.

It suffices for the wafer holding member 33 to be constructed such that the wafer W can be held by the peripheral portion of the wafer holding member 33. For example, it is possible to use as the wafer holding member 33 a pin having a groove for holding the wafer W formed therein. FIG. 3 shows the state that a pin-like wafer holding member 33 is arranged at four positions. In this case, one wafer holding member 33 on the side of the window portion 26a is provided with, for example, a sliding or fall-down mechanism so as to permit the wafer delivery between the wafer holding member 33 and the transfer arms 21a, 21b. To be more specific, the particular wafer holding member 33 is slid or caused to fall down to the position where the movement of the transfer arms 21a, 21b is not obstructed by the particular wafer holding member 33 during delivery of the wafer W. In addition, the particular wafer holding member 33 on the side of the window portion 26a is constructed such that the sliding or fall-down mechanism is locked while the wafer W is held by the particular wafer holding member 33 so as to prevent the wafer W from coming out of the particular wafer holding member 33.

The pivot 37 joining the motor 32 to the spin plate 31 extends through the central portion of a disc 38 arranged on the lower side of the spin plate 31. When the spin plate 31 is inserted into a process chamber 51, the disc 38 closes a spin plate insertion port 54 of the process chamber 51. However, the disc 38 itself is not rotated. Therefore, a seal mechanism is employed in the portion where the pivot 37 extends through the disc 38 so as to prevent, for example, the leakage of the cleaning liquid from the process chamber 51 while allowing the pivot 37 to be rotatable.

A posture changing mechanism 9 having a leg portion 34, a rotary shaft 35, and a disc holding member 36 is mounted to the disc 38 so as to permit the disc 38 and the wafer rotating device 8 to be rotated by a predetermined angle within the Y-Z plane. The posture changing mechanism 9 permits the wafer W to be held in an optional state between a substantially horizontal state and a substantially vertical state.

The posture changing mechanism 9 can be driven by using a driving device such as a motor or an actuator. The disc holding member 36 also plays the role of a cover for the pivot 37. For example, if the disc holding member 36 is constructed to surround the pivot 37 and the entire motor 32, it is possible to suppress the contamination of the atmosphere within the cleaning process unit 3a caused by, for example, the particles generated from the motor 32.

The leg portion 34 of the posture changing mechanism 9 is arranged on the Y-axis driving mechanism 10 movable on a guide rail 39 in the Y-direction. As a result, the wafer rotating device 8 and the posture changing mechanism 9 can be moved in the Y-direction within the cleaning process unit 3a. It is possible to insert the portion of the spin plate 31 of the wafer rotating device 8, in which the posture of the wafer W has been changed into substantially a vertical state, into the process chamber 51 by using the Y-axis driving mechanism 10.

It is possible to arrange a control device of, for example, the wafer rotating device 8, the posture changing device 9, and the Y-axis driving mechanism 10 in a box 15 to which the guide rail 39 is mounted. Also, it is possible to arrange an openable shutter (not shown) between the space in which the guide rail 39 is arranged and the space in which the process chamber 51 is arranged so as to prevent the atmosphere within the process chamber 51 from being diffused into the entire region of the cleaning process unit 3a.

Figure 4:
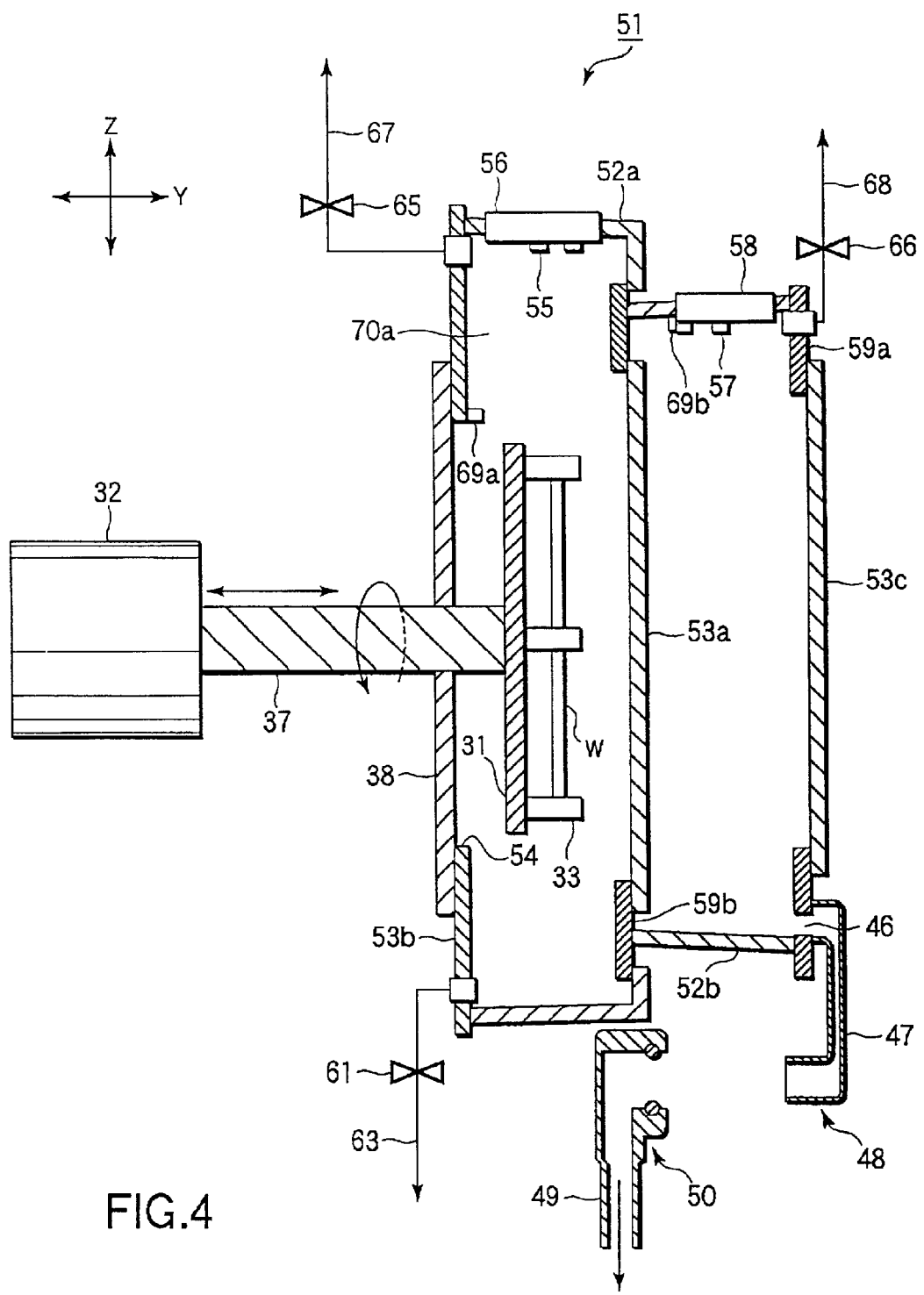
FIG. 4 is a cross sectional view showing the state that a spin plate is inserted into a process chamber in the cleaning process apparatus shown in FIG. 1.
Figure 5:
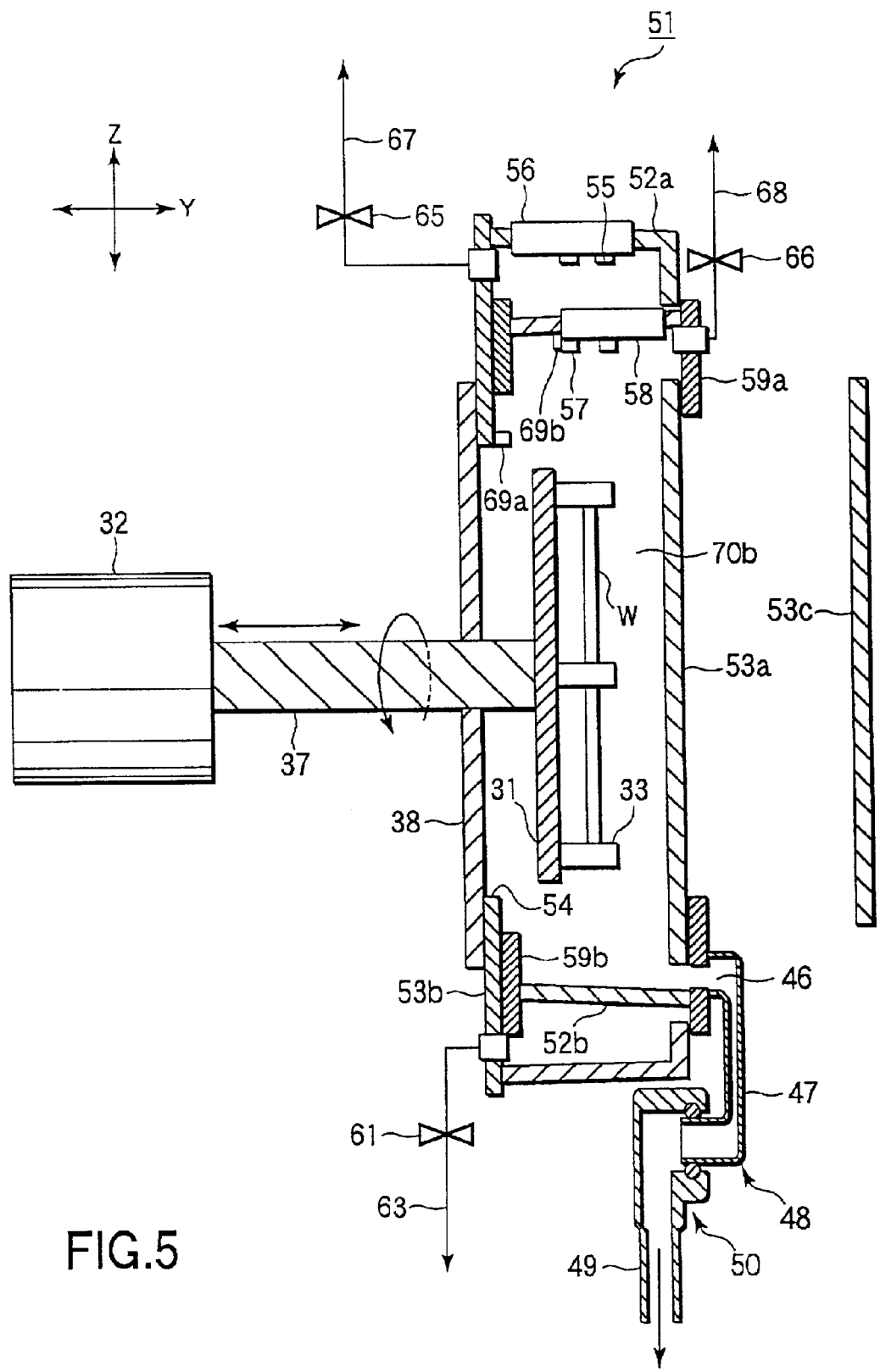
FIG. 5 is another cross sectional view showing the state that a spin plate is inserted into a process chamber in the cleaning process apparatus shown in FIG. 1.

The process chamber 51 for applying a cleaning treatment to the wafer W held on the spin plate 31 is arranged within the cleaning process unit 3a. FIGS. 4 and 5 are cross sectional views collectively showing the state that the spin plate 31 is inserted into the process chamber 51. The posture changing device 9 and the Y-axis driving mechanism 10 are not shown in any of FIGS. 4 and 5. The process chamber 51 shown in these drawings is of a double wall structure comprising a cylindrical outside chamber 52a having a trapezoid cross section and an inside chamber 52b slidable in the Y-direction.

FIG. 4 shows the state that the cleaning treatment is performed by using the outside chamber 52a with the inside chamber 52b held retreated to the right side in the drawing. On the other hand, FIG. 5 shows the state that the cleaning treatment is performed by the inside chamber 52b, with the inside chamber 52b housed in the outside chamber 52a. For performing the maintenance, it is possible to slide the outside chamber 52a to the position of the inside chamber 52b shown in FIG. 4 for the retreat.

As shown in FIG. 4, the liquid processing within the outside chamber 52a is carried out within a process chamber 70a defined by a vertical wall 53a, another vertical wall 53b formed in the spin plate insertion port 54, and the disc 38 of the wafer rotating device 8, said disc 38 closing the spin plate insertion port 54. An exhaust gas passageway including an exhaust valve 65 and an exhaust pipe 67 is arranged above an upper portion of the vertical wall 53b so as to make it possible to adjust the atmosphere within the process chamber 70a. Also, a drain (waste water passageway) including a drain valve 61 and a drain tube 63 is formed below a lower portion of the vertical wall 53b so as to make it possible to discharge the used cleaning liquid from within the process chamber 70a. It should be noted that, in the outside chamber 52a, the outer diameter of the outside chamber 52a on the side of the vertical wall 53b is larger than the outer diameter of the vertical wall 53a. In addition, the lower wall in the trunk portion of the outside chamber 52a is inclined downward toward the vertical wall 53b. It follows that the cleaning liquid used in the outside chamber 52a can be easily discharged to the outside through the drain valve 61 and the drain tube 63.

A spurting nozzle 56 provided with spurting ports 55 at two positions is mounted to the upper wall in the trunk portion of the outside chamber 52a such that the two spurting ports 55 are arranged side by side in the horizontal direction. A pure water, IPA, or a drying gas such as a nitrogen gas ($N_2$), etc., which are supplied from the supply sources within the chemical liquid storing unit 5a, can be spurted through these spurting ports 55. For example, a pure water is spurted through the spurting port 55 positioned on the right side in FIG. 4 toward the right surface of the wafer W, and the pure water is spurted through the spurting port 55 positioned on the left side toward the left surface of the wafer W. It is desirable for a pure water or the like to be spurted from the spurting ports 55 such that the spurted water or the like is expanded in, for example, a substantially conical shape so as to permit the spurted pure water or the like to strike a large region of the wafer W.

A spurting nozzle 69a for cleaning the back surface of the spin plate 31 is arranged in the vertical wall 53b. The spurting nozzle 69a is used mainly for cleaning the back surface of the spin plate 31 with a pure water after the processing with various chemical liquids. Incidentally, only one spurting nozzle 56 is shown in each of FIGS. 4 and 5. However, it is possible to use a plurality of spurting nozzles 56.

The inside chamber 52b is in the shape of a cylinder having a substantially trapezoid cross section and having an outer diameter in the edge plane smaller than that of the outside chamber 52a, and is slidable in the Y-direction between the position shown in FIG. 4 and the position shown in FIG. 5. A ring member 59b is formed on the edge surface of the inside chamber 52b on the side of the small diameter, and a ring member 59a is formed on the edge surface of the inside chamber 52b on the side of the large diameter. When the inside chamber 52b is arranged within the outside chamber 52a, the ring member 59a is brought into tight contact with the vertical wall 53a so as to perform the sealing function. Also, the ring member 59b is brought into tight contact with the vertical wall 53b so as to perform the sealing function. As a result, a process chamber 70b is formed.

When the inside chamber 52b is retreated from within the outside chamber 52a, the ring member 59b is brought into tight contact with the vertical wall 53a, and the ring member 59a is brought into tight contact with the vertical wall 53c, with the result that the atmosphere within the process chamber 70a formed by the outside chamber 52a is isolated from the atmosphere within the inside chamber 52b. It should be noted that a seal member (not shown) is arranged in each of the contact portion between the ring member 59a and the vertical wall 53a and the contact portion between the ring member 59b and the vertical wall 53b.

A spurting nozzle 58 having spurting ports 57 arranged in two positions is mounted to the upper wall in the trunk portion of the inside chamber 52b. These two spurting ports 57 are arranged side by side in the horizontal direction. Various chemical liquids, a pure water, IPA, etc. supplied from the supply sources within the chemical liquid storing unit 5a are spurted from the spurting ports 57. For example, a chemical liquid or the like is spurted from the spurting port 57 positioned on the right side in FIG. 5 toward the right surface of the wafer W, and a chemical liquid or the like is spurted from the spurting nozzle 57 positioned on the left side toward the left surface of the wafer W. It is desirable for the chemical liquid or the like to be spurted from the spurting ports 57 in a manner to be expanded in, for example, a fan shape in a single plane so as to permit the spurted chemical liquid or the like to strike against the wafer W in a concentrated fashion.

A spurting nozzle 69b for cleaning the surface of the spin plate 31 is arranged on the inner wall in the upper portion of the inside chamber 52b so as to be capable of spurting a pure water. It is desirable for a pure water or the like to be spurted from the spurting nozzles 69a, 69b in a manner to be expanded in a substantially conical shape such that the pure water or the like strikes widely against the spin plate 31. It is possible for a cleaning liquid to which is applied an ultrasonic wave to be spurted from each of these spurting nozzles 56, 58, 69a and 69b.

An exhaust valve 66 and an exhaust pipe 68 communicating with the exhaust valve 66 are arranged above an upper end portion of the ring member 59a so as to make it possible to control the atmosphere within the process chamber 70b and atmosphere within the inside chamber 52b in its retreat position. Also, a cleaning liquid discharge port 46 is formed in a lower end portion of the ring member 59a, and a drain guiding member 47 is arranged in a manner to communicate with the cleaning liquid discharge port 46. The drain guide member 47 extends downward and a tip portion 48 of the drain guide member 47 is bent to face in a horizontal direction.

A drain pipe 49 is arranged as a separate member below the vertical wall 53a, and a cap portion 50 is formed at the tip of the drain pipe 49. When the inside chamber 52b is in its retreat position, the tip portion 48 of the drain guide member 47 and the cap portion 50 are under an isolated state. However, if the inside chamber 52b is slid so as to be housed in the outside chamber 52a, the tip portion 48 is engaged with the cap portion 50 so as to achieve a hermetic sealing. As a result, the drain guide member 47 is allowed to communicate with the drain pipe 49 so as to make it possible to discharge the cleaning liquid. On the other hand, when the inside chamber 52b is retreated from within the outside chamber 52a after completion of the processing of the wafer W by using the inside chamber 52b, the tip portion 48 and the cap portion 50 are separated from each other.

The lower wall of the trunk portion of the inside chamber 52b is inclined downward away from the motor 32, i.e., toward the right edge in each of FIGS. 4 and 5. Also, the cleaning liquid discharge port 46 is formed in the right edge of the lower wall of the trunk portion of the inside chamber 52b. It follows that the cleaning liquid used in the process chamber 70b easily flows from the cleaning liquid discharge port 46 into the drain guide member 47 so as to be discharged to the outside through the drain pipe 49.

Since it is possible to set the length in the Y-direction of the outside chamber 52a and the inside chamber 52b, i.e., the length of the trunk portion, in accordance with the distance between the spin plate 31 and the wafer W, it is possible to diminish the space of the process chamber 51 and the space of the cleaning process unit 3a. In this case, it is possible to control easily the process atmosphere of the process chambers 70a and 70b so as to decrease the amount of the exhaust gas. It follows that, even in the case of using a chemical liquid of a high temperature, the temperature reduction is small, making it possible to widen the scope in respect of the kinds of the chemical liquid that can be used. Also, since the cleaning liquid is spurted from the spurting nozzles 55 and 57 directly onto the surfaces of the wafer W and, thus, a brush or the like is not used, it is also possible to control easily the various mechanisms used for the cleaning treatment.

The cleaning process of the wafer W housed in the FOUP F will now be described, covering the case of processing the wafers W within the FOUP F disposed on the FOUP stage 2a in the cleaning process units 3a to 3c. In the first step, the FOUP F in which a plurality of wafers W are arranged in parallel a predetermined distance apart from each other is disposed on the FOUP stage 2a such that the delivery port through which the wafers W are put in and taken out of the FOUP F faces the window portion 12a.

In order to take a predetermined wafer W out of the FOUP F, the shutter closing the window portion 12a is opened by using the opening/closing device 14a, and the lid closing the delivery port of the FOUP F is opened so as to permit the inner space of the FOUP F to communicate with the inner space of the wafer transfer unit 4. Then, the detection sensor 13a is scanned in the Z-direction so as to count the number of wafers and inspect the housed state of the wafers within the FOUP F. If an abnormality has been detected, the processing is interrupted and, where another FOUP F is disposed on, for example, the FOUP stage 2b, the similar processing is started for the wafers W housed in said another FOUP F.

Where an abnormality has not been detected in the wafers W within the FOUP F, the Z-axis driving mechanism 19 is operated to control the height of the transfer arm 21a in a manner to permit the transfer arm 21a to be positioned on the lower side of a predetermined wafer W that is to be taken out of the FOUP F, followed by operating the Y-axis driving mechanism so as to permit the transfer arm 21a to be inserted into the FOUP F and subsequently operating the Z-axis driving mechanism 19 so as to move upward the transfer arm 21a by a predetermined distance. As a result, a predetermined single wafer W is held by the transfer arm 21a. Under this condition, the Y-axis driving mechanism is operated again so as to bring the transfer arm 21a holding the wafer W back to the original position. Then, the opening/closing device 14a is operated to permit the window portion 12a and the lid of the FOUP F to be kept closed until another wafer W is transferred into and out of the FOUP F in the next time.

In the next step, the θ-rotation driving mechanism of the wafer transfer device 7 is rotated by 180° so as to permit the wafer W held by the transfer arm 21a to face the window portion 26a formed in the wall portion 25 forming the boundary between the wafer transfer unit 4 and the cleaning process unit 3a. Then, the shutter 27a closing the window portion 26a is opened, and the Z-axis driving mechanism 19 is operated so as to control the height of the transfer arm 21a such that the wafer W can be held by the wafer holding member 33. Further, the Y-axis driving mechanism of the wafer transfer device 7 is operated to slide the transfer arm 21a toward the wafer holding member 33 on the spin plate 31 that is retreated to the position facing the window portion 26a in the cleaning process unit 3a.

When the wafer W is transplanted from the transfer arm 21a onto the wafer holding members 33, the wafer holding member 33 on the side of the window portion 26a is retreated to a predetermined position so as not to obstruct the operation of the transfer arm 21a.

After the wafer W is held on the wafer holding members 33, the Z-axis driving mechanism 19 of the wafer transfer device 7 is operated so as to lower the position of the transfer arm 21a, followed by operating the Y-axis driving mechanism so as to bring the transfer arm 21a back to the original position and subsequently closing the shutter 27a. In the spin plate 31, the wafer holding members 33 are allowed to hold the wafer W at its peripheral portion without fail.

Then, the wafer transfer device 7 transfers another wafer W within the FOUP F into the cleaning process unit 3b by the method similar to that employed previously for transferring the wafer W from the FOUP F into the cleaning process unit 3a. Further, a predetermined wafer W within the FOUP F is transferred into the cleaning process unit 3c. Under this condition, the cleaning treatment within the cleaning process units 3b and 3c is started like the cleaning method in the cleaning process unit 3a.

The cleaning treatment within the cleaning process unit 3a is carried out as follows. In the first step, the Y-axis driving mechanism 10 is operated to slide the wafer rotating device 8 by a predetermined distance toward the process chamber 51, followed by operating the posture changing mechanism 9 to rotate, for example, the wafer rotating device 8 by 90° such that the spin plate 31 faces the process chamber 51, thereby holding the wafer rotating device 8 in a horizontal state. In this step, the wafer W is held in a substantially vertical state. Then, the Y-axis driving mechanism 10 is operated so as to slide the wafer rotating device 8 and the posture changing mechanism 9, thereby to allow the spin plate 31 to be housed in the outside chamber 52a and the spin plate insertion port 54 of the outside chamber 52a to be closed by the disc 38.

Where the wafer W is processed in the process chamber 51, e.g., where the processing of removing a polymer, etc. by using a chemical liquid is carried out in the inside chamber 52b and the processing using a pure water and the subsequent drying treatment are carried out in the outside chamber 52b, the inside chamber 52b is arranged first within the outside chamber 52a so as to form the process chamber 70b. Under this condition, a predetermined chemical liquid is spurted from the spurting nozzle 58 toward the front and back surfaces of the wafer W while rotating the spin plate 31 at a predetermined angular speed by the motor 32. After completion of the treatment with the chemical liquid, a pure water is spurted from the spurting nozzles 58 and 69b so as to wash the front surface of the spin plate 31 and the entire surfaces of the wafer W.

Then, the inside chamber 52b is retreated from within the outside chamber 52a. Under this condition, a pure water is spurted from the spurting nozzle 56 so as to clean the wafer W and a pure water is also spurted from the spurting nozzle 69a so as to wash the back surface of the spin plate 31 while rotating the spin plate 31 at a predetermined angular speed. Then, the spin plate 31 is rotated at a predetermined angular speed without spurting a pure water so as to remove the pure water attached to the spin plate 31 and the wafer W, followed by spurting as required an IPA gas, an $N_2$ gas or the like against the wafer W so as to dry the wafer W and the spin plate 31.

After completion of the drying treatment, the Y-axis driving mechanism 10 is operated so as to slide the wafer rotating device 8 away from the process chamber 51, thereby transferring the spin plate 31 out of the process chamber 51. Then, the posture changing mechanism 9 is operated so as to change the posture of the wafer rotating device 8 into a vertical state, followed by bringing the spin plate 31 back to the position facing the window portion 26a. The positions of the wafer holding members 33 holding the wafer W are aligned at positions adapted for transferring the wafer W, and the locking of the movable wafer holding member 33 among the plural holding members 33 is released so as to retreat the movable wafer holding member 33.

The transfer arm 21b is used for transferring the wafer W out of the wafer holding members 33. Specifically, the Z-axis driving mechanism 19 of the wafer transfer device 7 is operated so as to adjust the height of the transfer arm 21b in a manner to permit the transfer arm 21b to take the wafer W after the cleaning treatment out of the wafer holding members 33, followed by opening the shutter 27a. Then, the Y-axis driving mechanism is operated so as to insert the transfer arm 21b into the clearance between the spin plate 31 and the wafer W, followed by operating the Z-axis driving mechanism 19 so as to permit the transfer arm 21b to slightly move upward the wafer W. Further, the Y-axis driving mechanism is operated so as to bring the transfer arm 21b back to the original position, thereby transferring the wafer W out of the wafer holding members 33 on the spin plate 31.

After the shutter 27a is closed, the θ-rotation driving mechanism of the wafer transfer device 7 is operated so as to permit the transfer arm 21b to face the FOUP stage 2a, followed by opening the window portion 12a and the lid of the FOUP F by using the opening/closing device 14a so as to permit the inner space of the FOUP F to communicate with the wafer transfer unit 4. Under this condition, the Z-axis driving mechanism 19 is operated to adjust the height of the transfer arm 21b at a predetermined height to which the wafer W should be returned, followed by operating the Y-axis driving mechanism so as to insert the transfer arm 21b into the FOUP F for transferring the wafer W into the FOUP F and subsequently bringing the transfer arm 21b back to the original position. What should be noted is that the wafer W before the cleaning treatment is transferred by using the transfer arm 21a, and the wafer W after the cleaning treatment is transferred by using the transfer arm 21b. Since the transfer arm 21b does not hold the wafer W before the cleaning treatment, the wafer W after the cleaning treatment is not contaminated.

In the next step, where unprocessed wafers W are housed in the FOUP F and the unprocessed wafers W are subjected to the cleaning treatment, the θ-rotation driving mechanism of the wafer transfer device 7 is operated to permit the transfer arm 21a to face the window portion 12a, followed by repeating a series of operations including the transfer of a predetermined unprocessed wafer W out of the FOUP F, the transfer of the wafer W onto the spin plate 31, the cleaning treatment of the wafer W, and the transfer of the cleaned wafer W back into the FOUP F by the method described previously. These operations can be similarly performed for the processing in the cleaning process units 3b and 3c. Also, if the FOUP F is disposed on the FOUP stage 2b, it is possible to start the processing of the wafers W within the FOUP F disposed on the FOUP stage 2b after the processing of the wafers W within the FOUP F disposed on the FOUP stage 2a.

The cleaning treating method described above covers the case where the same cleaning treatment is carried out in all the cleaning process units 3a to 3c arranged in three positions. However, the cleaning treating method using the cleaning process apparatus 1 is not limited to the particular method described above. For example, it is possible to use the cleaning process unit 3a alone using a predetermined chemical liquid in respect of the wafers in the FOUP F disposed on the FOUP stage 2a, while using the cleaning process units 3b and 3c using different chemical liquids in respect of the wafers in the FOUP F disposed on the FOUP stage 2b. In this fashion, it is possible to use differently the cleaning process units 3a to 3c depending on the kinds of the chemical liquids used and on the types of the processing carried out in these cleaning process units.

In the cleaning process apparatus 1 described above, the wafer holding members 33 arranged on the spin plate 31 for holding the wafer W is capable of holding only one wafer W. However, it is possible to modify the wafer holding members 33 to be capable of holding a plurality of wafers W, e.g., 2 to 5 wafers W. In this case, the weight of the wafers W held by the wafer holding members 33 is not seriously increased, making it unnecessary to modify the constructions of the devices such as the motor 32 and the posture changing mechanism 9. It follows that it is possible to shorten the processing time.

Figure 6:
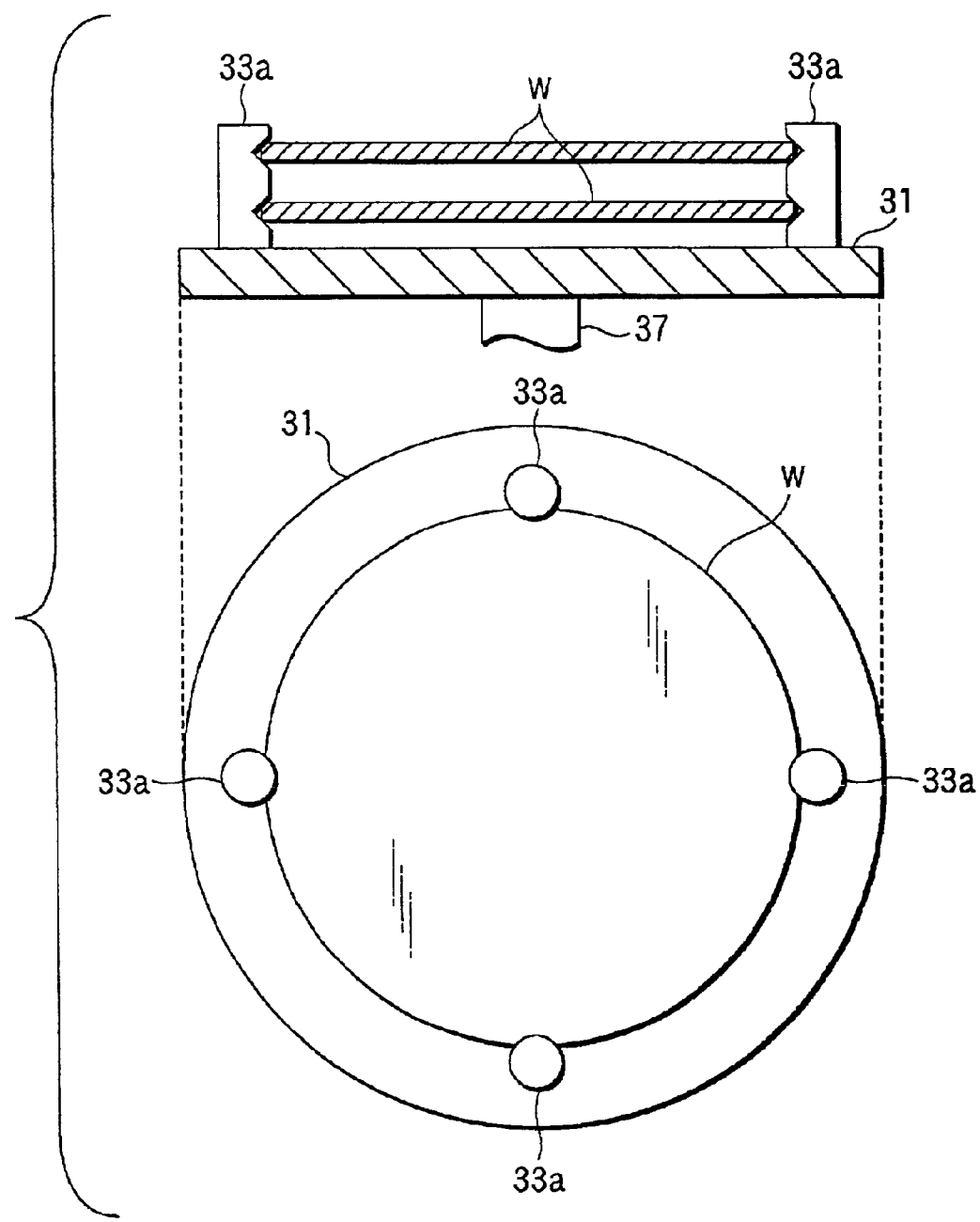
FIG. 6 shows the state that a wafer holding member holding two wafers is arranged on a spin plate.

FIG. 6 shows the construction of the system that the wafer holding members 33a holding two wafers W are arranged on the spin plate 31. Since the transfer arm 21a of the wafer transfer device 7 is capable of transferring a single wafer W, it is possible to permit the two wafers W to be held by the wafer holding members 33a by reciprocating twice the transfer arm 21a between the spin plate 31 and the FOUP F. By contraries, it is also possible to bring the two wafers W from the wafer holding members 33a back to the FOUP F by reciprocating twice the transfer arm 21b between the spin plate 31 and the FOUP F.

Since a single cleaning process time within the process chamber 51 is longer in general than the time required transferring a plurality of wafers W by using the wafer transfer device 7, the cleaning process time can be shortened by subjecting a plurality of wafers to the cleaning treatment in a single cleaning treatment. Also, if a plurality of arm members are arranged in each of transfer arms 21a and 21b of the wafer transfer device 7 in conformity with the number of wafers held on the spin plate 31, the wafer transfer can be finished by a single reciprocating operation of the wafer transfer device 7, making it possible to further shorten the processing time.

Figure 7:
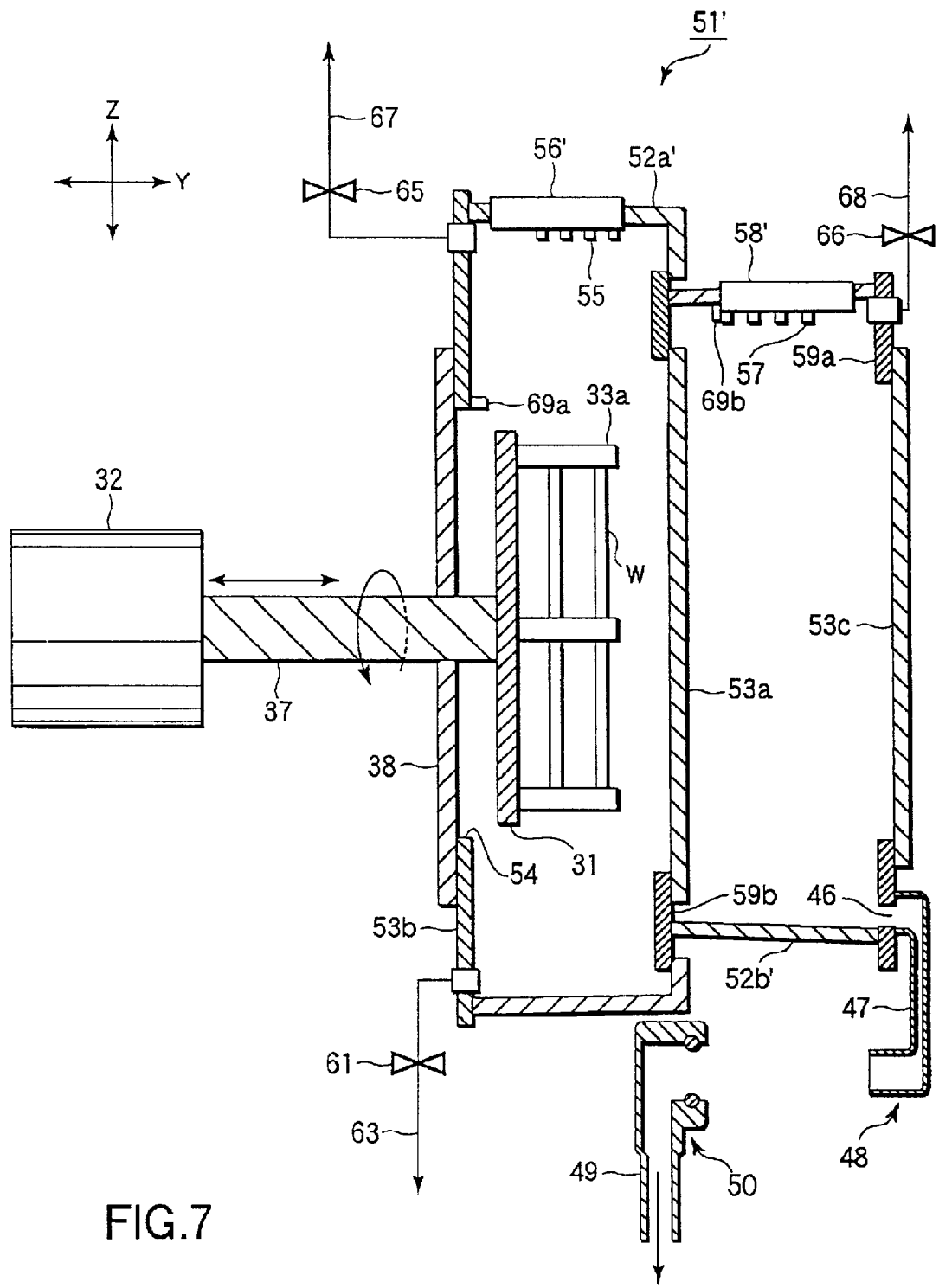
FIG. 7 is a cross sectional view showing the state of an outside chamber and an inside chamber in the case of using a wafer holding member holding two wafers.

FIG. 7 is a cross sectional view showing like FIG. 4 the construction of a process chamber 51' comprising an outside chamber 52a' and an inside chamber 52b' in the case of using the wafer holding members 33a capable of holding two wafers W. Discharge nozzles 56' and 58' are longer than the discharge nozzles 56 and 58, respectively. The spurting ports 55 are formed in four points of the spurting nozzle 56'. Likewise, the spurting ports 57 are arranged at four points of the spurting nozzle 58'. Also, the outside chamber 52a' has the trunk portion longer than that of outside chamber 52a so as to permit the spurting nozzle 56' to be arranged in the trunk portion of the outside chamber 52a'. Likewise, the inside chamber 52b' has the trunk portion longer than that of the inside chamber 52b so as to permit the spurting nozzle 58' to be arranged in the trunk portion of the inside chamber 52b. It is possible to determine the length of each of the spurting nozzles 56' and 58', and the length of trunk portion of each of the outside chamber 52a' and the inside chamber 52b' in accordance with the number of wafers W held by the wafer holding members 33a. It is also possible to determine appropriately the positions of the vertical walls 53a and 53c in conformity with the shapes of the outside chamber 52a' and the inside chamber 52b'.

Even where the number of wafers W that can be held by the wafer holding members 33a is increased, it is unnecessary to modify the entire construction of the cleaning process apparatus 1 as far as the number of wafers W held by the wafer holding members 33a is not increased extremely. Where the number of wafers W held by the wafer holding members 33a is increased, a heavier load is applied to the motor 32, with the result that it is necessary to increase the torque of the motor 32. Even in this case, it is unnecessary to modify the entire construction of the cleaning process apparatus 1. Incidentally, where a plurality of wafers W are held a small distance apart from each other by the wafer holding members 33a, it is desirable to increase the number of spurting ports 55 and 57. However, it is not absolutely necessary to increase the length of the spurting nozzles 56' and 58'. In this case, it is also unnecessary to increase the length in the trunk portion of each of the outside chamber 52a' and the inside chamber 52b'.

Figure 8:
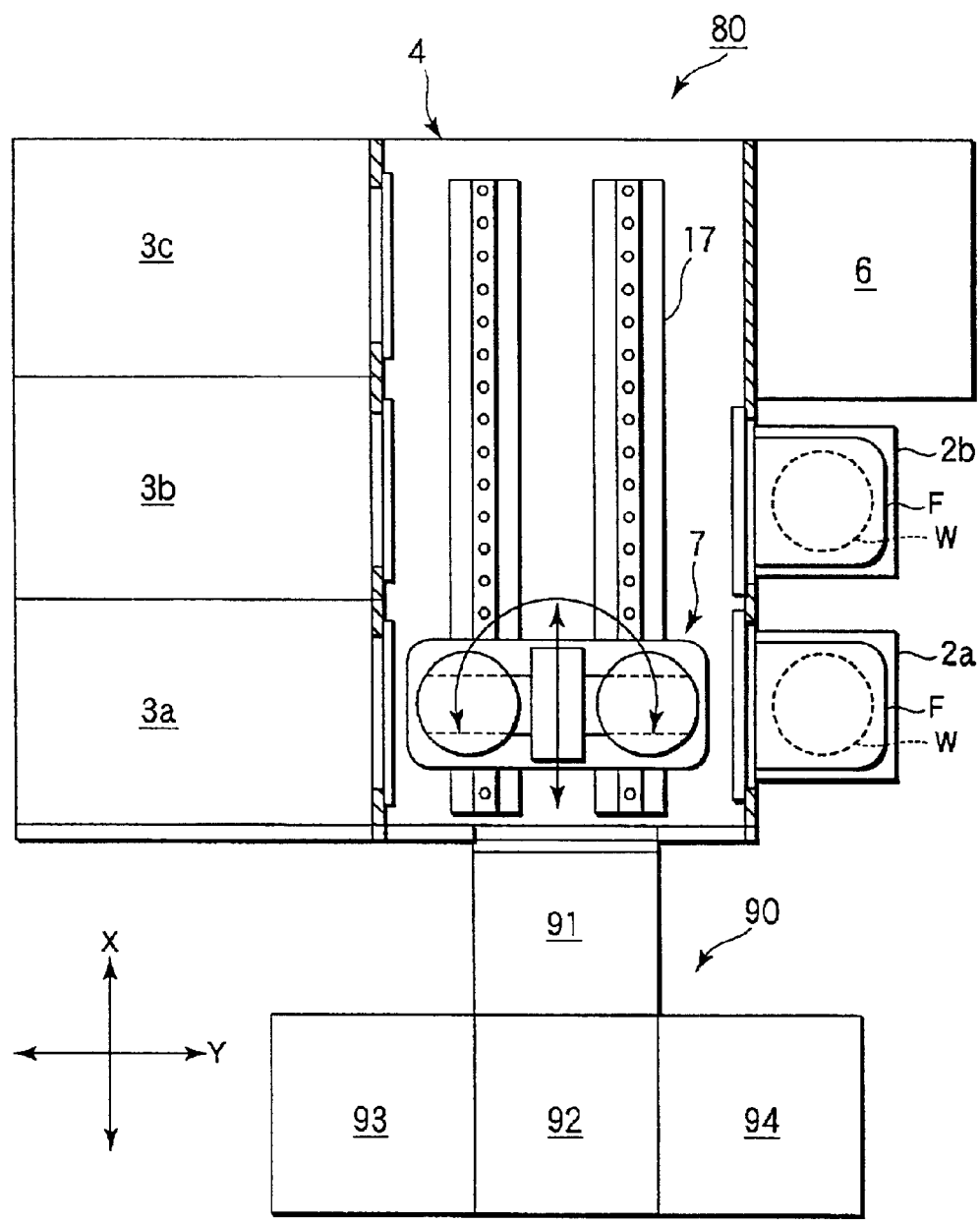
FIG. 8 is a cross-sectional plan view showing a wafer processing apparatus according to one embodiment of the present invention, in which the cleaning process apparatus shown in FIG. 1 is combined with a vacuum process section.

The cleaning process apparatus 1 of the present invention described above can be used as a single cleaning process apparatus. In addition, it is also possible to combine the cleaning process apparatus 1 of the present invention with a vacuum processing section 90 so as to form a single wafer processing apparatus 80 as shown in FIG. 8, which is a cross-sectional plan view. The vacuum processing section 90 comprises, for example, a first load lock chamber 91, a second load lock chamber 92, an etching process chamber 93 and an ashing process chamber 94. The wafer transfer device 7 is capable of gaining access to the first load lock chamber 91.

Gate valves (not shown) are arranged between the first load lock chamber 91 and the second load lock chamber 92, between the second load lock chamber 92 and the etching process chamber 93, and between the second load lock chamber 92 and the ashing process chamber 94. These gate valves can be opened and are capable of hermetically sealing the boundaries among these chambers such that a predetermined etching treatment and a predetermined ashing treatment can be performed within the etching process chamber 93 and the ashing process chamber 94, respectively.

In this case, it is possible to carry out the processing such that, for example, the wafer W in the FOUP F is transferred into the vacuum process section 90 by using the wafer transfer device 7 so as to apply a predetermined etching treatment to the wafer W within the etching process chamber 93, followed by transferring the wafer W into any of the cleaning process units 3a to 3c so as to apply a predetermined cleaning treatment to the wafer W and subsequently returning the wafer W back to the FOUP F. By contraries, it is possible to apply a cleaning and drying treatment to the wafer W within any of the cleaning process units 3a to 3c, followed by returning the wafer W back to the vacuum process section 90 so as to apply a predetermined etching treatment and a predetermined ashing treatment to the wafer W.

A liquid processing apparatus according to another embodiment of the present invention will now be described.

Figure 9:
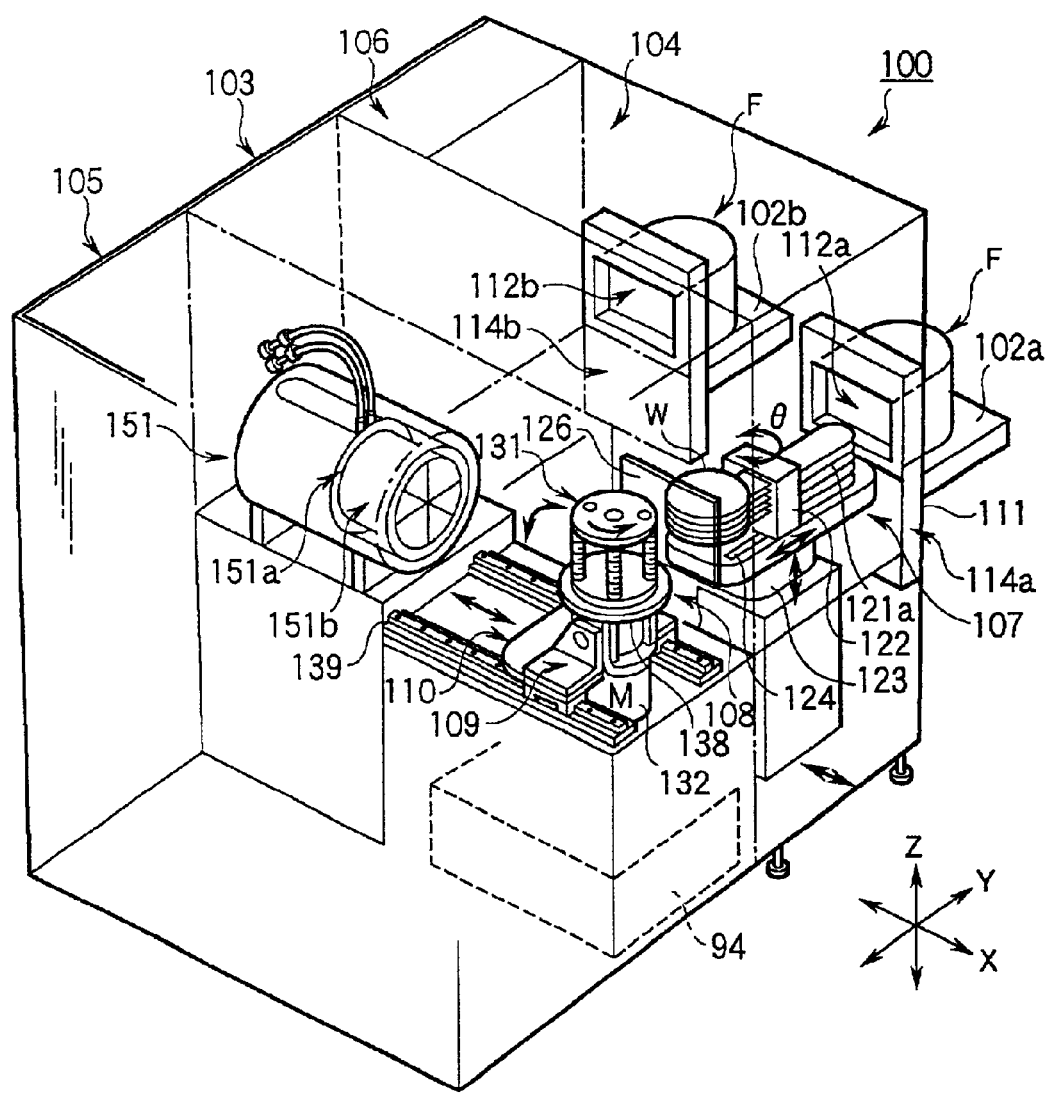
FIG. 9 is an oblique view schematically showing the construction of a batch type cleaning process apparatus according to another embodiment of the liquid processing apparatus of the present invention.
Figure 10:
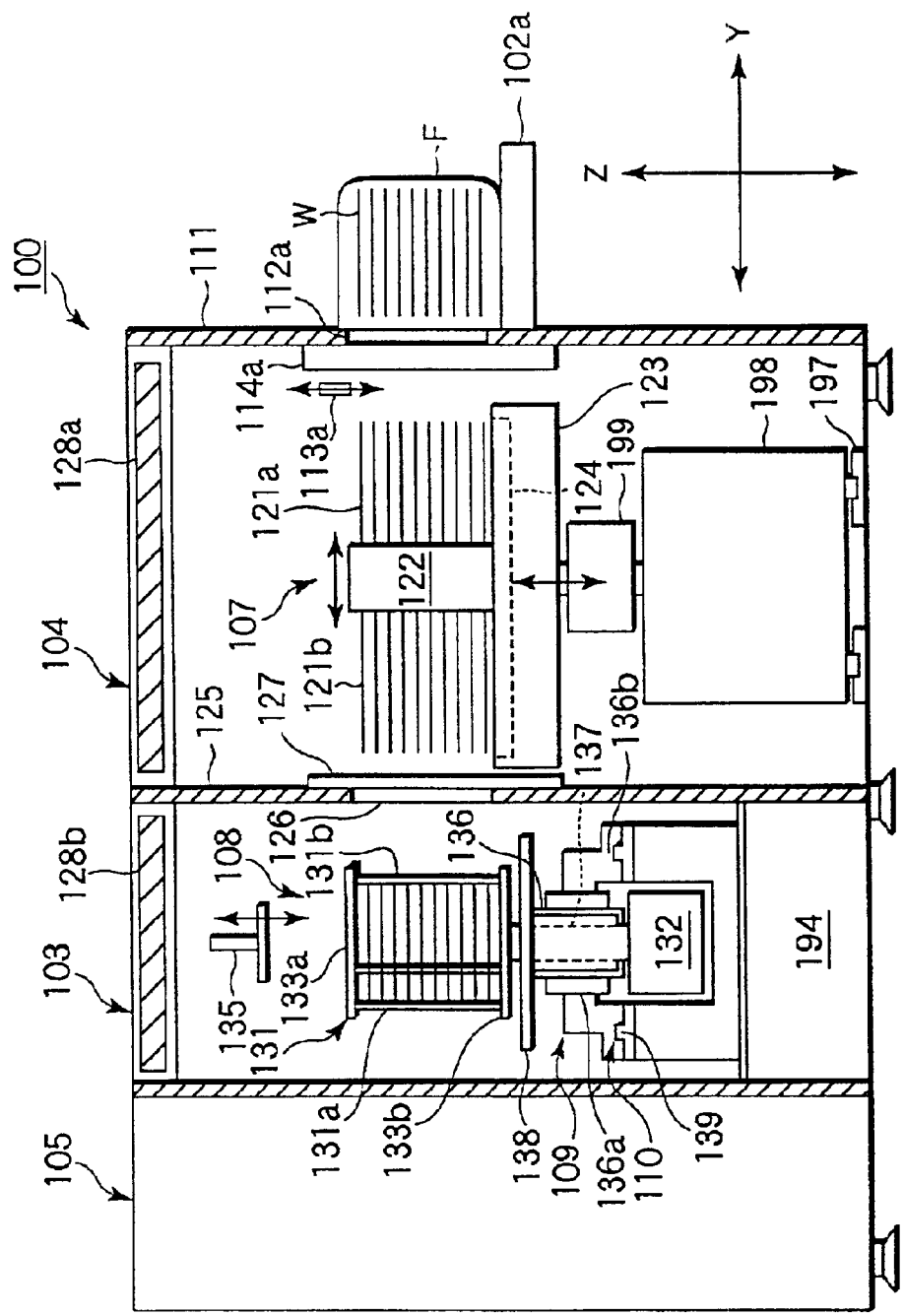
FIG. 10 is a vertical sectional view schematically showing the construction of the cleaning process apparatus shown in FIG. 9.
Figure 11:
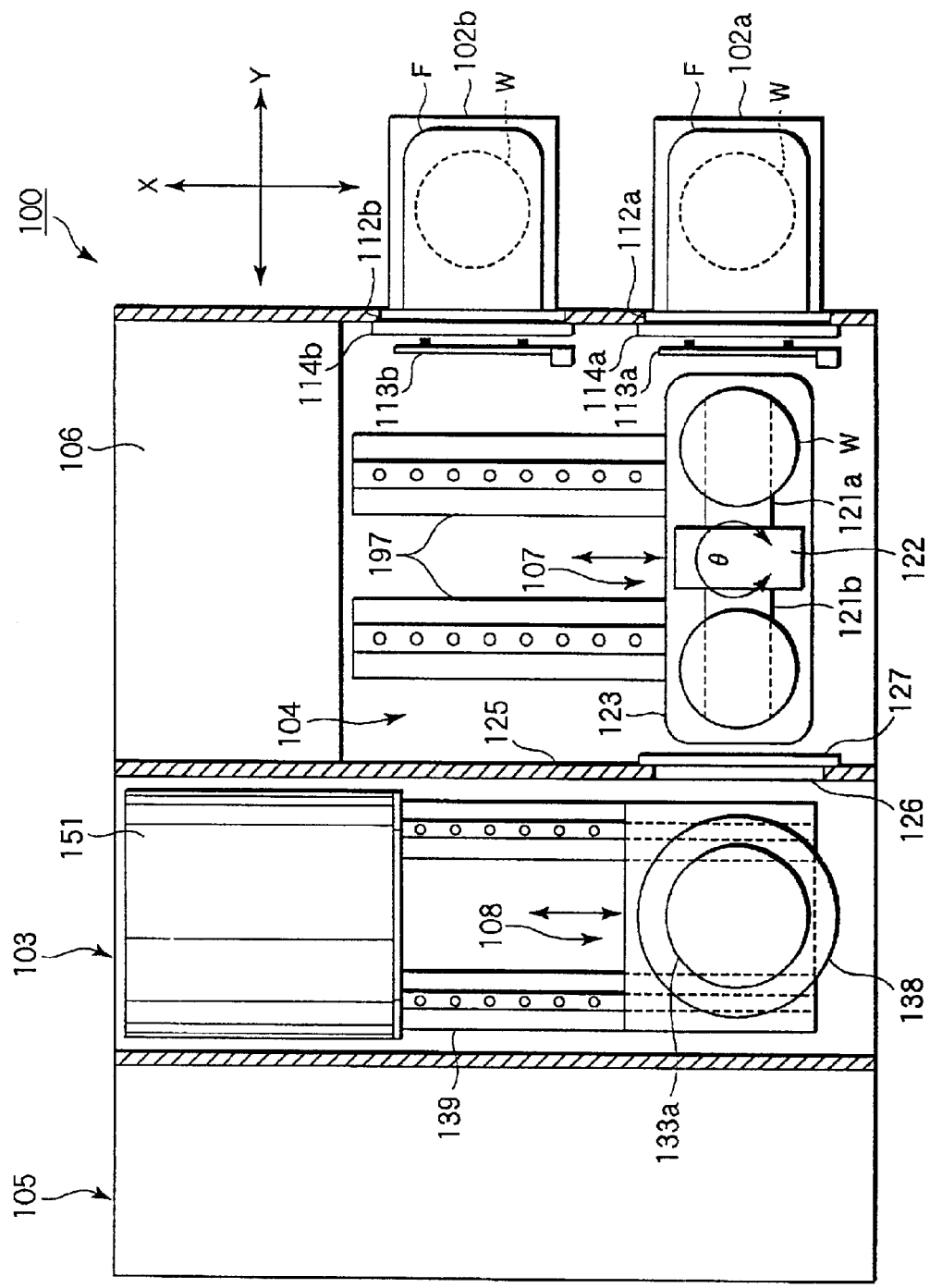
FIG. 11 is a cross-sectional plan view schematically showing the construction of the cleaning process apparatus shown in FIG. 9.

FIG. 9 is an oblique view schematically showing the construction of a cleaning process apparatus 100 according to one embodiment of the liquid processing apparatus of the present invention, in which a plurality of wafers W are processed in a batch system. FIGS. 10 and 11 are a vertical sectional view and a cross-sectional plan view, respectively, of the cleaning process apparatus 100 shown in FIG. 9. As shown in FIGS. 9 to 11, the cleaning process apparatus 100 comprises mainly FOUP stages 102a, 102b on which are disposed FOUPs F (housing containers) capable of housing a plurality of wafers W, e.g., about 25 wafers, in a horizontal state, a cleaning process unit 103 in which a cleaning treatment is applied to the wafer W, a wafer transfer unit 104 arranged between the FOUP stages 102a, 102b and the cleaning process unit 103 for transferring the wafer W, a chemical liquid storing unit 105 for storing a chemical liquid used for the liquid processing, and a power source unit 106 for the various electric driving mechanisms arranged within the cleaning process apparatus 100.

The FOUP F are disposed on the FOUP stages 102a, 102b such that the delivery ports of the FOUP F for delivering the wafers W are allowed to face window portions 112a (on the side of the FOUP stage 102a) and 112b (on the side of the FOUP stage 102b) formed in a wall portion 111 of a wafer transfer unit 104.

Opening/closing devices 114a (on the side of the FOUP stage 102a) and 114b (on the side of the FOUP stage 102b) having shutters for opening closing the window portions 112a, 112b and lid opening/closing mechanisms for opening/closing the lids of the delivery ports of the FOUPs F are arranged inside the wall portion 111 (on the side of the wafer transfer unit 104). Under the state that the FOUPs F are not disposed on the FOUP stages 102a, 102b, the shutters are kept closed. On the other hand, when the wafers W are transferred into or out of the FOUPs F, the shutters and the lids of the FOUPs F are opened by the opening/closing devices 114a, 114b.

Detection sensors 113a (on the side of the FOUP stage 102a) and 113b (on the side of the FOUP stage 102b) for counting the number of wafers within the FOUP F are arranged contiguous to the opening/closing devices 114a, 114b within the wafer transfer unit 104. The detection sensors 113a, 113b are equal in construction and function to the detection sensors 13a, 13b used in the cleaning process apparatus 1 described previously.

A wafer transfer device 107 for transferring the wafer W in a substantially horizontal state between the FOUPs F disposed on the FOUP stages 102a, 102b and a rotor 131 is arranged in the wafer transfer unit 104. The wafer transfer device 107 comprises a transfer arm 121a for transferring an unprocessed wafer W, another transfer arm 121b for transferring the wafer W after the liquid processing, a transfer arm holding section 122 for holding the transfer arms 121a, 121b, a table 123 mounted to the transfer arm holding section 122, an X-axis driving mechanism 198 and a guide rail 197 for the movement in the X-direction, and a Z-axis driving mechanism 199 for adjusting the height of the transfer arms 121a, 121b.

Each of these transfer arms 121a and 121b comprises 25 arm members extending substantially in parallel. Each of these 25 arm members transfers a single wafer W. It follows that the wafer transfer device 107 is capable of transferring 25 wafers housed in the FOUP F in a single operation. A Y-axis driving mechanism (not shown) is arranged within the transfer arm holding section 122 holding 50 arm members in total of the transfer arms 121a and 121b. The transfer arm holding section 122 can slid in the Y-direction along a guide mechanism 124 such as a groove or a guide rail arranged on the table 123.

The transfer arm holding section 122 is capable of rotation in a θ direction within the X-Y plane. It is possible to arrange within the transfer arm holding section 122 a θ-rotation driving mechanism (not shown) for performing the rotation in the θ-direction. It is also possible to construct the transfer arm holding section 122 such that the Z-axis driving mechanism 199 and table 123 can also be rotated together.

The distance between the adjacent arm members of each of the transfer arms 121a and 121b is equal to the distance between the adjacent wafers W housed in the FOUP F. Alternatively, it is possible to arrange in the transfer arm holding section 122 a mechanism for adjusting the clearance between the adjacent arm members of each of the transfer arms 121a and 121b. In this case, the wafers W are transferred out of the FOUP F with the clearance between the adjacent arm members of the transfer arm 121a adjusted to conform with the clearance between the adjacent wafers housed in the FOUP F. Then, it is possible to change the distance between the adjacent arm members of the transfer arm 121a into a half distance and to adjust the height of the transfer arm 121a by operating the Z-axis driving mechanism 199, thereby allowing the wafers W held by the arm members of the transfer arm 121a to be housed in a lower half or an upper half of the rotor 131.

Each of the transfer arms 121a, 121b, the transfer arm holding section 122 and the table 123 can be moved in a Z-direction (vertical direction) by the Z-axis driving mechanism 199. The Z-axis driving mechanism 199 is used when, for example, the transfer arms 121a, 121b transfer the wafers W out of the FOUP F or the rotor 131, and when the wafers W held by the transfer arms 121a, 121b are transferred into the FOUP F or the rotor 131.

For example, when the wafers W are transferred out of the FOUP F, the height of the transfer arm 121a is adjusted first by operating the Z-axis driving mechanism 199 to permit the arm members of the transfer arm 121a to be positioned below the wafers housed in the FOUP F and, then, the Y-axis driving mechanism is operated so as to insert the transfer arm 121a into the FOUP F, followed by operating the Z-axis driving mechanism 199 to move upward the transfer arm 121a to a predetermined height so as to permit the wafers W to be supported by the arm members of the transfer arm 121a. Further, under this condition, the Y-axis driving mechanism is operated so as to bring the transfer arm 121a back to the original position, thereby transferring the wafers W out of the FOUP F.

Each of the transfer arms 121a, 121b, the transfer arm holding section 122 and the table 123 can also be moved by the X-axis driving mechanism 198 in the X-direction along the guide rail 197, with the result that the wafer transfer device 107 is capable of access to the FOUPs F disposed on the FOUP stages 102a, 102b.

It is possible to transfer the unprocessed wafers W from the FOUPs F disposed on the FOUP stages 102a, 102b into the rotor 131 arranged in a cleaning process unit 103 by using the Y-axis driving mechanism, the θ-rotation driving mechanism, the X-axis driving mechanism 198 and the Z-axis driving mechanism 199. It is also possible to transfer in the opposite direction the wafer W after the cleaning treatment by the transfer arm 121b from the rotor 131 to the FOUPs F. Incidentally, it is possible for the transfer arms 121a, 121b to be formed shrinkable like, for example, multi-joint arms. In this case, the transfer arms 121a, 121b can be used in place of the Y-axis driving mechanism, or together with the Y-axis driving mechanism, for transferring the wafer between the FOUP F and the spin plate 31.

A filter fan unit 128a is arranged in the ceiling portion of the wafer transfer unit 104 so as to blow the air from which the particles have been removed into the wafer transfer unit 104. Also, a window portion 126, which can be opened or closed by a shutter 127, is arranged in a wall portion 125 forming the boundary between the wafer transfer unit 104 and the cleaning process unit 103 in order to make it possible to transfer the wafer W between the wafer transfer device 107 and the rotor 131. The shutter 127 is arranged on the side of the wafer transfer unit 104 so as to separate the atmosphere within the wafer transfer unit 104 from the atmosphere within the cleaning process unit 103. It is also possible to arrange the shutter 127 on the side of the cleaning process unit 103.

A filter fan unit 128b is arranged in the ceiling portion of the cleaning process unit 103 so as to blow the air from which the particles have been removed into the cleaning process unit 103. Also, a rotor rotating mechanism 108 comprising the rotor 131 and a motor 132 (driving mechanism) joined to the rotor 131 via a pivot 137 is arranged in the cleaning process unit 103. The rotor 131 is capable of holding the wafers W a predetermined distance apart from each other, and the motor 132 rotates the rotor 131 in a manner to permit the wafers W housed in the rotor 131 to make a planar rotation.

Figure 12:
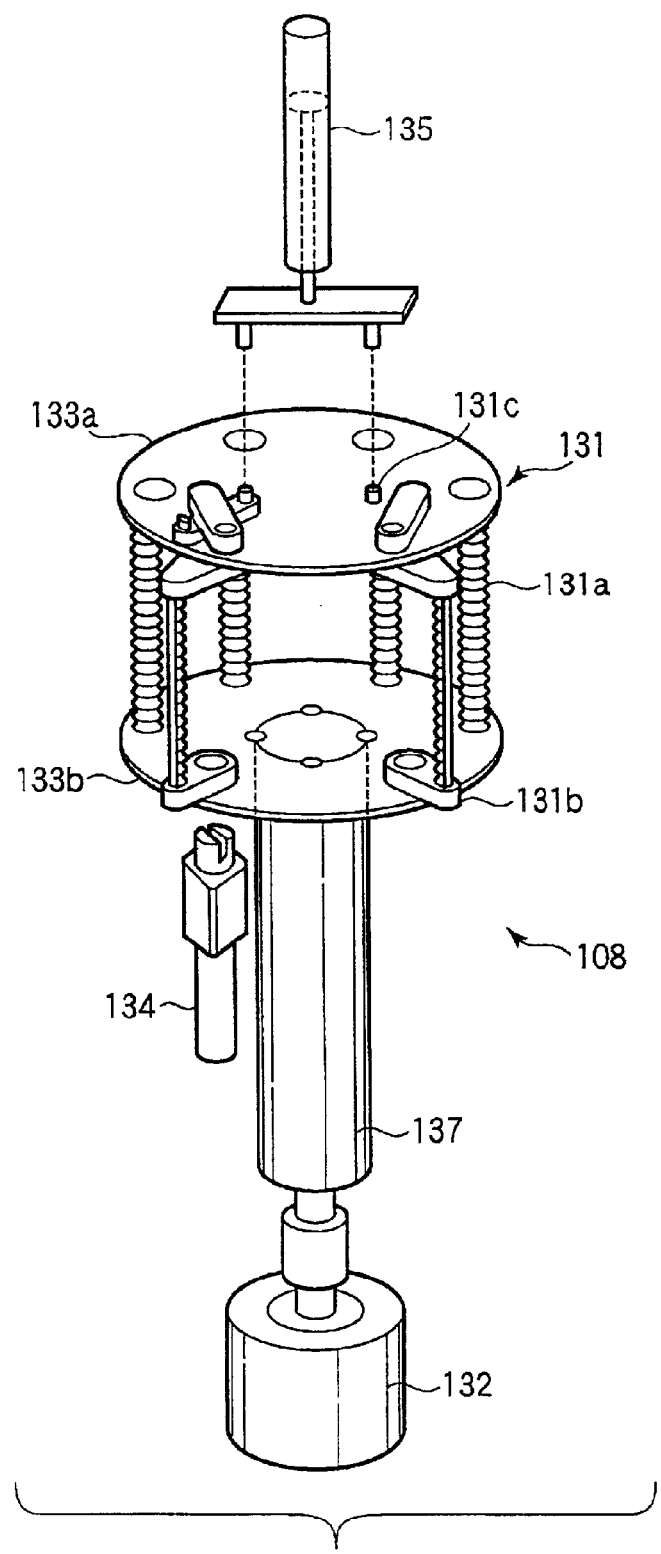
FIG. 12 shows the construction of the rotor included in the cleaning process apparatus shown in FIG. 9.

FIG. 12 shows the construction of the rotor 131. As shown in the drawing, the rotor 131 comprises a pair of discs 133a and 133b arranged a predetermined distance apart from each other, an engaging member 131a and a holder 131b arranged between the discs 133a and 133b, and a holder lock pin 131c mounted to the disc 133a.

Grooves, etc. for holding the wafers W are formed in the engaging member 131a, and the engaging member 131a is fixed to the discs 133a and 133b. The holder 131b can be opened and closed, and grooves or the like for holding the wafers W are also formed in the holder 131b as in the engaging member 131a. It is desirable for the distance between the two holders 131b, when the holders 131b are closed, to be large enough to permit the transfer arms 121a and 121b to be inserted through the clearance between the two holders 131b.

The opening/closing operation of the holder 131b is limited depending on the state of the holder lock pin 131c. For example, when the holder 131b is locked by the holder lock pin 131c, the holder 131b is in a closed state such that the wafers W can be held. Under the state that the holder 131b is not locked, the holder 131b can be closed by a holder rotating cylinder 134 so as to hold the wafers W or can be opened so as to permit the delivery of the wafers W.

For example, when the holder 131b is to be opened, in order to release the locked state of the holder 131b, a holder release cylinder 135 is moved downward from above the rotor 131 so as to keep depressed the holder lock pin 131c formed in the disc 133a. As a result, the locked state of the holder 131b is released and is made freely movable. Under this condition, the holder rotating cylinder 134 is meshed with the coupling portion between the disc 133b and the holder 131b from the side of the disc 133b, and the holder rotating cylinder 134 is rotated in a predetermined direction so as to open the holder 131b.

When the holder 131b is to be closed, the holder release cylinder 135 is moved upward under the state that the holder rotating cylinder 134 is rotated in the opposite direction. As a result, the closed state of the holder 131b is naturally locked by the holder lock pin 131c.

The pivot 137 joining the rotor 131 and the motor 132 extends through the central portion of another disc 138 arranged on the side of the disc 133b. When the rotor 131 is inserted into a process chamber 151 (outside chamber 151a), the disc 138 closes a rotor insertion port 153 of the process chamber 151 and is not rotated. A sealing structure is employed in the portion where the pivot 137 extends through the disc 138 in order to prevent the leakage of the cleaning liquid from the process chamber 151.

The rotor rotating mechanism 108 is mounted to a posture changing mechanism 109 that permits changing the posture of the wafer W held by the rotor 131 between a substantially horizontal state and a substantially vertical state. The posture changing mechanism 109 comprises a support member 136 for supporting the rotor rotating mechanism 108 mounted to the disc 138, a rotary shaft 136a, a leg portion 136b and a rotary driving device (not shown) such as a motor or an actuator.

In the posture changing mechanism 109, the rotary driving device permits rotating the rotor rotating mechanism 108 by a predetermined angle within the Z-X plane about the rotary shaft 136a. The support member 136 also performs the function of a cover of the pivot 137. The shape of the support member 136 is not limited to the shape shown in the drawings. For example, it is possible for the support member 136 to be shaped to surround the pivot 137 and the entire region of the motor 132. In this case, it is possible to suppress the contamination of the atmosphere within the cleaning process unit 103, which is caused by the particles generated in the motor 132.

The leg portion 136b of the posture changing mechanism 109 is arranged on an X-axis driving mechanism 110 movable on a guide rail 139 in the X-direction, with the result that the rotor rotating mechanism 108 is also movable in the X-direction within the washing process unit 103. The posture of a portion of the rotor 131 in the rotor rotating mechanism 108 can be changed to be capable of holding the wafers W in a substantially vertical state. The X-axis driving mechanism 110 can be used for inserting the particular portion of the rotor 131 into the process chamber 151.

It is possible to arrange the control devices such as the rotor rotating mechanism 108, the posture changing mechanism 109 and the X-axis driving mechanism 110 in a lower space 194 of the guide rail 139. Also, it is possible to arrange an openable shutter between the space in which the guide rail 139 is arranged and the space in which the process chamber 151 is arranged so as to prevent the atmosphere within the process chamber 151 from being diffused into the entire region of the cleaning process unit 103, though the particular openable shutter is not shown in FIGS. 9 to 11.

Figure 13:
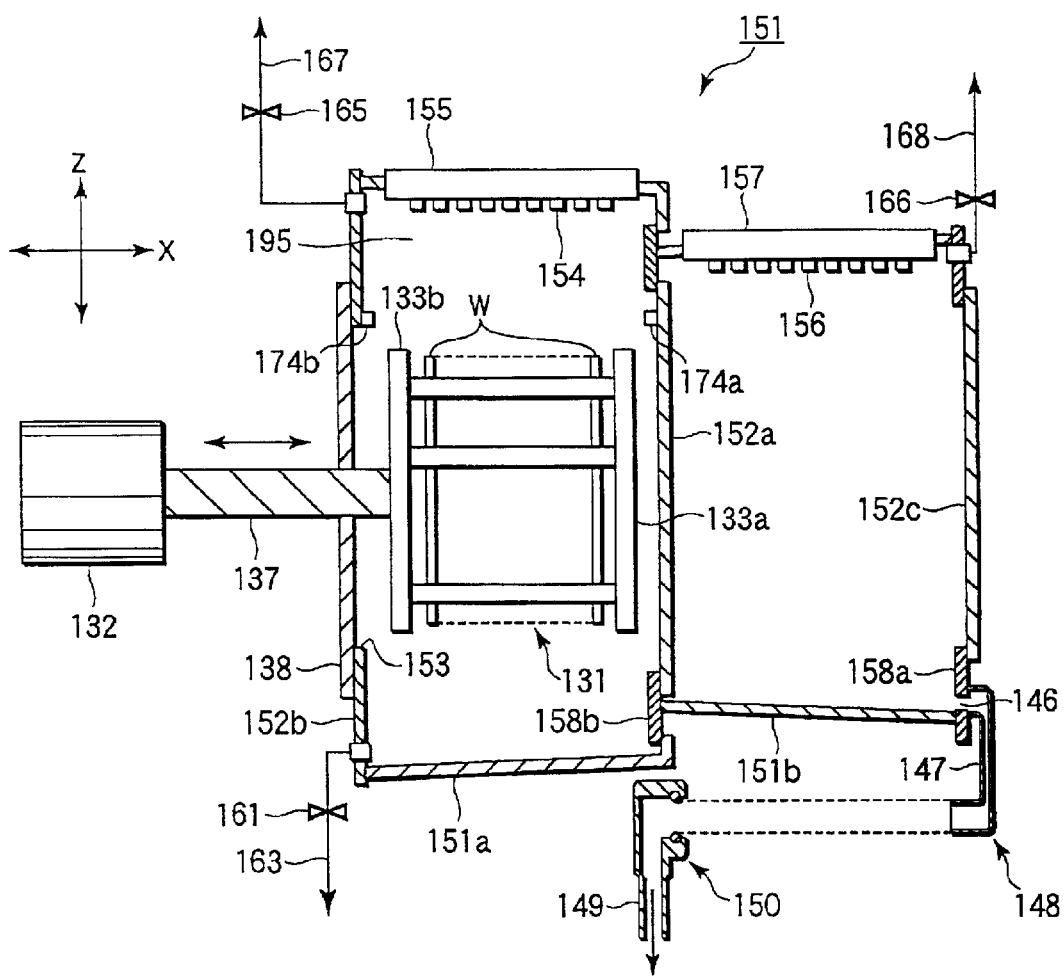
FIG. 13 is a cross sectional view showing the construction of the process chamber according to one embodiment of the present invention, which is arranged in a liquid processing unit constituting the cleaning process apparatus shown in FIG. 9.
Figure 14:
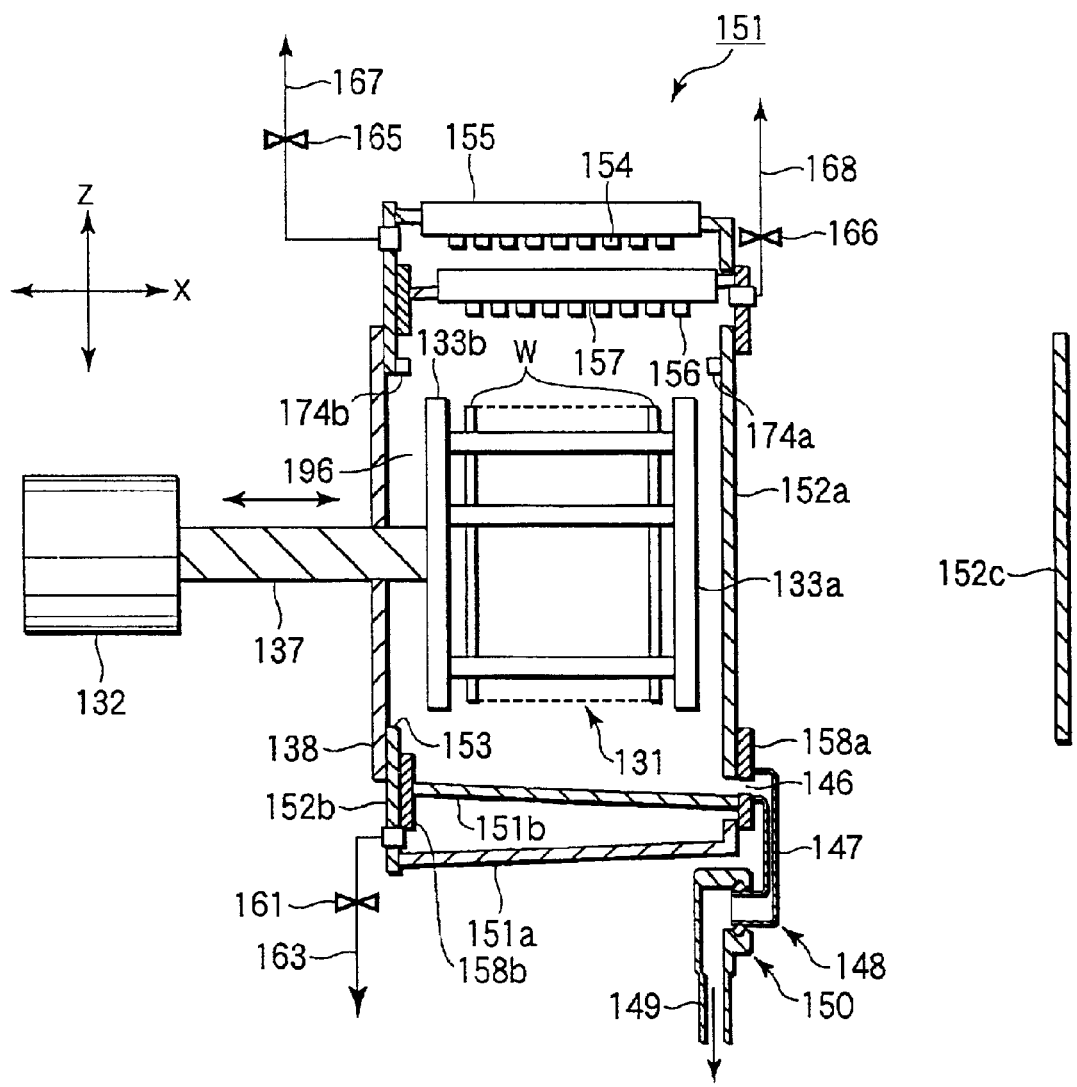
FIG. 14 is another cross sectional view showing the construction of the process chamber according to one embodiment of the present invention, which is arranged in a liquid processing unit constituting the cleaning process apparatus shown in FIG. 9.

FIGS. 13 and 14 are cross sectional views collectively showing the state that the rotor 131 is inserted into the process chamber 151. The posture changing mechanism 109 and the Y-axis driving mechanism 110 are omitted in FIGS. 13 and 14, and the process chamber 151 shown in these drawings is of a double wall structure comprising a cylindrical outside chamber 151a having a trapezoid cross section and an inside cylinder 151b capable of sliding in the X-direction. Incidentally, for the maintenance or the like, the outside chamber 151a can be slid and retreated to the position of the inside chamber 151b shown in FIG. 13.

FIG. 13 shows the state that the inside chamber 151b is retreated to the right side in the drawing, and the liquid processing is carried out by using the outside chamber 151a. On the other hand, FIG. 14 shows the state that the inside chamber 151b is housed in the outside chamber 151a so as to carry out the liquid processing by using the inside chamber 151b. As shown in FIG. 13, the cleaning treatment in the outside chamber 151a is carried out in a process chamber 195 formed by a vertical wall 152a, a vertical wall 152b having a rotor insertion port 153 formed therein and the disc 138 of the rotor rotating mechanism 108, said disc 138 closing the rotor insertion port 153.

An exhaust gas passageway comprising an exhaust valve 165 and an exhaust pipe 167 is arranged above the vertical wall 152b so as to make it possible to control the atmosphere within the process chamber 195. Also, a drain (waste liquid passageway) comprising a drain valve 161 and a drain pipe 163 is formed below the vertical wall 152b so as to permit the cleaning liquid used in the process chamber 195 to be discharged to the outside.

The outer diameter of the edge of the outside chamber 151a on the side of the vertical wall 152b is made larger than the outer diameter of the edge of the outer chamber 151a on the side of the vertical wall 152a. Also, the lower wall of the trunk portion of the outside chamber 151a is inclined downward toward the vertical wall 152b, with the result the used cleaning liquid is discharged easily to the outside through the drain valve 161 and the drain pipe 163.

A spurting nozzle 155 comprising a large number of spurting ports 154 is mounted to the upper wall of the trunk portion of the outside chamber 151a such that the spurting ports 154 are arranged in the horizontal direction. A pure water, IPA or a nitrogen gas ($N_2$), etc., supplied from the supply source arranged within a chemical liquid storing unit 105 can be spurted from the discharge ports 154. It is desirable for a pure water or the like to be spurted from the spurting ports 154 in a manner to be expanded in, for example, a substantially conical shape so as to permit the spurted pure water or the like to strike against a large area of the wafer W.

Sputtering nozzles 174a, 174b of the cleaning liquid for cleaning those surfaces of the discs 133a, 133b which face the vertical walls 152a, 152b, respectively, are mounted to the vertical walls 152a, 152b, respectively. The spurting nozzles 174a, 174b are used mainly when the discs 133a, 133b are cleaned with a pure water after the processing with various chemical liquids. It is desirable for a pure water or the like to be spurted from the spurting nozzles 174a, 174b in a manner to be expanded in, for example, a substantially conical shape so as to permit the spurted pure water or the like to strike against large areas of the discs 133a, 133b. FIGS. 13 and 14 show that only one spurting nozzle 155 is arranged. However, it is possible to arrange a plurality of spurting nozzles.

The inside chamber 151b, which is in the form of a cylinder having a diameter smaller than that of the outside chamber 151a and having a substantially trapezoid cross section, is slidable in the X-direction between the position shown in FIG. 13 and the position shown in FIG. 14. Also, the inside chamber 151b includes a ring member 158b arranged in the edge on the side of the short diameter and another ring member 158a arranged in the edge on the side of the long diameter.

When the inside chamber 151b is positioned within the outside chamber 151a, the ring member 158a is brought into tight contact with the vertical wall 152a and the ring member 158b is brought into tight contact with the vertical wall 152b so as to form the process chamber 196. Also, when the inside chamber 151b is retreated from within the outside chamber 151a, the ring member 158b is brought into tight contact with the vertical wall 152a, and the ring member 158a is brought into tight contact with the vertical wall 152c, with the result that the atmosphere within the process chamber 195 formed by the outside chamber 151a is isolated from the atmosphere within the inside chamber 151b.

A spurting nozzle 157 having a large number of spurting ports 156 is arranged in an upper portion within the inside chamber 151b such that the spurting ports 156 are arranged in the horizontal direction. Various chemical liquids, a pure water, IPA, etc. supplied from the supply source arranged inside the chemical liquid storing unit 105 are spurted from the spurting ports 156. It is desirable for a chemical liquid or the like to be spurted from the spurting ports 156 in a manner to be expanded in, for example, a substantially fan shape in a substantially horizontal plane so as to permit the spurted chemical liquid or the like to strike against the wafer W in a concentrated fashion. In this case, it is desirable for the number of spurting ports 156 to be equal to the number of wafers held in the rotor 131 so as to permit the chemical liquid to strike against the front surface of the wafer W on which a semiconductor device is formed.

A cleaning liquid spurting nozzle (not shown) is arranged in the upper wall of the trunk portion of the inside chamber 151b in order to clean those surfaces of the discs 133a, 133b which face the wafers W. A pure water can be spurted from the cleaning liquid spurting nozzle noted above. It is desirable for a pure water to be spurted from the cleaning liquid spurting nozzle in a manner to be expanded in, for example, a fan shape in substantially the horizontal plane so as to permit a pure water to strike the discs 133a, 133b in a concentrated fashion. Incidentally, FIGS. 13 and 14 show only one spurting nozzle 157. However, it is possible to arrange a plurality of such spurting nozzles.

An exhaust gas passageway comprising an exhaust valve 166 and an exhaust pipe 168 is arrange above the ring member 158a so as to make it possible to control the atmosphere within the process chamber 196 or the atmosphere within the inside chamber 151b in the retreated position. Also, a cleaning liquid discharge port 146 is formed in the lower edge of the ring member 158a, and a drain guide member 147 is arranged in a manner to communicate with the cleaning liquid discharge port 146.

The inside chamber 151b is arranged such that the lower wall of the inside chamber 151b is inclined downward away from the side of the motor 132, i.e., inclined downward toward the right side in the drawings. Since the cleaning liquid discharge port 146 is formed at the edge of the lower wall of the inside chamber 151b on the right side, the cleaning liquid used in the inside chamber 151b easily flows through the cleaning liquid discharge port 146 into the drain guide pipe 147.

The drain guide member 147 extends downward and the tip portion 148 of the drain guide member 147 is bent to face in the horizontal direction. On the other hand, a drain pipe 149 is arranged as a separate member below the vertical wall 152a, and a cap member 150 is formed at the tip portion of the drain pipe 149.

When the inside chamber 151b is in the retreated position, the tip portion 148 of the drain guide member 147 is isolated from the cap portion 150. However, if the inside chamber 151b is slid so as to be housed in the outside chamber 151a, the tip portion 148 is engaged with the cap portion 150 so as to achieve a hermetic seal. It follows that the drain guide member 147 is allowed to communicate with the drain pipe 149 so as to permit discharging the cleaning liquid. On the other hand, when the inside chamber 151b is retreated from within the outside chamber 151a after completion of the processing of the wafer W by using the inside chamber 151b, the tip portion 148 is separated from the cap portion 150.

The cleaning treatment process will now be described, covering the case where the wafers W housed in the FOUP F1, i.e., the FOUP F disposed on the FOUP stage 102a, and in the FOUP F2, i.e., the FOUP F disposed on the FOUP stage 102b, are collectively subjected to the cleaning treatment by using the cleaning process apparatus 100. Incidentally, the FOUPs F1 and F2 are not indicated in FIGS. 9 to 11.

In the first step, the FOUPs F1 and F2 each housing 25 wafers in parallel a predetermined distance apart from each other are disposed on the FOUP stages 102a and 102, respectively, such that the delivery ports of the FOUPs F1 and F2 for performing the delivery of the wafers W are allowed to face the window portions 112a and 112b, respectively.

In order to take the wafers W out of the FOUP F1, the shutter closing the window portion 112a and the lid closing the delivery port of the FOUP F1 are opened by using the opening/closing device 114a so as to permit the inner space of the FOUP F1 to communicate with the inner space of the wafer transfer unit 104. Then, the detection sensor 113a is scanned in the Z-direction so as to count the number of wafers W and inspect the housed state of the waters W within the FOUP F1. If an abnormality has been found, the process is interrupted, and the operation to take the wafers W out of the FOUP F2 is started. Alternatively, where it is required in terms of the management of production to collectively process the wafers W housed in the FOUPs F1 and F2 as a single lot, the FOUPs F1 and F2 are removed from the FOUP stages 102a, 102b, and the cleaning process of another lot is started.

Where an abnormality has not been found in the wafers W housed in the FOUP F1, the height of the transfer arm 121a is adjusted by operating the Z-axis driving mechanism 199 such that the arm members of the transfer arm 121a are positioned below the wafers W. Then, the Y-axis driving mechanism of the wafer transfer device 107 is operated so as to insert the transfer arm 121a into the FOUP F1, followed by operating the Z-axis driving mechanism 199 to permit the transfer arm 121a to be slightly moved upward such that each arm member of the transfer arm 121a holds a single wafer W. Under this condition, the Y-axis driving mechanism is operated again so as to bring the transfer arm 121a back to the original position. Then, the opening/closing device 114a is operated so as to close the window portion 112a and the lid of the FOUP F1, thereby finishing the operation of taking all the 25 wafers W out of the FOUP F1. In this case, the wafers W are held by the arm members of the transfer arm 121a apart from each other by the distance equal to that in the housed state in the FOUP F1.

Then, the θ-rotation driving mechanism of the wafer transfer device 107 is operated by 180° to permit the wafers W held by the transfer arm 121a to face the window portion 126 formed in the wall portion 125 forming the boundary between the wafer transfer unit 104 and the cleaning process unit 103. Further, the shutter 127 closing the window portion 126 is opened, followed by operating the Y-axis driving mechanism of the wafer transfer device 107 so as to insert the transfer arm 121a holding the wafers W into the rotor 131 retained in the waiting position facing the window portion 126 within the cleaning process unit 103.

In this stage, the rotor 131 is under the state that the holder lock pin 131c is depressed by the holder release cylinder 135 so as to make the holder 131b movable, and the holder 131b is opened outward by the holder rotation cylinder 134 so as to make it possible to perform the delivery of the wafer W. Also, the height position of the wafer W is adjusted such that the wafer W is held by, for example, the groove portion formed in the engaging member 131a for holding the wafer W.

Under the state that the transfer arm 121a is inserted into the rotor 131, the holder 131b is closed and locked, and the Z-axis driving mechanism 199 of the wafer transfer device 107 is operated so as to lower the position of the transfer arm 121a, followed by operating the Y-axis driving mechanism so as to bring the transfer arm 121a back to the original position, thereby closing the shutter 127. By the steps described above, the operation of transferring the wafers W housed in the FOUP F1 into the rotor 131 is finished.

In the next step, in order to transfer the wafers W housed in the FOUP F2 into the rotor 131, the θ-rotation driving mechanism of the wafer transfer device 107 is operated to permit again the transfer arm 121a to face the FOUP stages 102a, 102b. Also, the X-axis driving mechanism 198 is operated to move the wafer transfer device 107 to the position where the transfer arm 121a faces the window portion 112b. Then, the wafers W are taken out of the FOUP F2 as in the case of taking the wafers W out of the FOUP F1, followed by operating the θ-rotation driving mechanism and the X-axis driving mechanism 198 so as to move the transfer arm 121a holding the wafers W to the position facing the window portion 126.

The wafers W taken out of the FOUP F2 are inserted into the clearances between the adjacent wafers W taken out of the FOUP F1. In other words, the wafers W are housed in the rotor 131 at an interval half the interval at which the wafers W were housed in the FOUPs F1 and F2. To be more specific, the height position of the transfer arm 121a, i.e., the height positions of the wafers W, is deviated upward or downward by a distance equal to half the holding interval of the wafers W by operating the Z-axis driving mechanism 199, followed by allowing the rotor 131 to hold the wafers W by the procedure equal to the transfer procedure described above of the wafers W taken out of the FOUP F1, thereby finishing the transfer of the wafers W housed in the FOUPs F1 and F2 into the rotor 131. After completion of the transfer of the wafers W into the rotor 131, the holder 131b is made immovable by the holder lock pin 131c.

Further, the rotor rotating mechanism 108 is inclined by 90° by using the posture changing mechanism 109 such that the rotor 131 is allowed to face the process chamber 151, and the rotor rotating mechanism 108 is held in a horizontal state. In this stage, the wafers W are held in a vertical state. Then, the rotor 131 is housed in the outside chamber 151a by operating the X-axis driving mechanism 110, and the rotor rotating mechanism 108 is slid such that the rotor insertion port 153 of the outside chamber 151a is closed by the disc 138.

Suppose that the treatment to remove a polymer, etc. is to be performed in the inside chamber 151b of the process chamber 151 by using a chemical liquid, and the treatment using a pure water and the subsequent drying treatment are to be carried out in the outside chamber 151a of the process chamber 151. In this case, the inside chamber 151b is housed first within the outside chamber 151a. Under this state, a predetermined chemical liquid is spurted from the spurting ports 156 of the spurting nozzle 157 toward the wafers W while rotating the rotor 131 by the motor 132 at a predetermined angular speed so as to process the wafers W with the chemical liquid. Then, in order to clean away the chemical liquid from the wafers W and those surfaces of the discs 133a, 133b which are positioned to face the wafers W, a pure water or IPA is supplied to the wafers W and the discs 133a, 133b by using the spurting nozzle 157 and the cleaning liquid spurting nozzle arranged in the upper wall in the trunk portion of the inside chamber 151b.

In the next step, the inside chamber 151b is retreated from within the outside chamber 151a. Under this state, a pure water is spurted from the spurting ports 154 of the spurting nozzle 155 toward the wafers W while rotating the rotor 131 at a predetermined angular speed. In this stage, a pure water is also spurted from the spurting nozzles 174a, 174b so as to clean those surfaces of the discs 133a, 133b which are positioned to face the vertical walls 152a, 152b, respectively. Then, the rotor 131 is rotated at a predetermined angular speed without supplying a pure water to the wafers W so as to remove the pure water attached to the rotor 131 and the wafers W and, as required, a drying gas such as a nitrogen gas ($N_2$) is blown against the wafers W so as to dry the wafers W.

After completion of the liquid processing and the drying processing, in order to transfer the rotor 131 out of the process chamber 151, the X-axis driving mechanism 110 is operated so as to slide the rotor rotating mechanism 108 away from the process chamber 151, followed by operating the posture changing mechanism 109 so as to change the posture of the rotor rotating mechanism 108 such that the wafers W can be held in a horizontal state and subsequently bringing the rotor 131 back to the position facing the window portion 126. Then, the position of the rotor 131 is adjusted such that the delivery port faces the window portion 126 when the holder 131b is opened.

During the liquid processing treatment applied to the wafers W, the θ-rotation driving mechanism of the wafer transfer device 107 is operated to permit the transfer arm 121b to face the window portion 126. Then, if, for example, the wafers W housed previously in the FOUP F2 are to be brought back into the FOUP F2, the Z-axis driving mechanism 199 is operated to adjust the height of the transfer arm 121b so as to permit the transfer arm 121b to be capable of transferring the corresponding wafers W, followed by opening the shutter 127 and subsequently driving the Y-axis driving mechanism so as to insert the transfer arm 121b into the rotor 131.

Then, the holder release cylinder 135 is moved downward so as to depress the holder lock pin 131c, thereby releasing the locked state of the holder 131b. Under this state, the holder 131b is rotated by using the holder rotating cylinder 134 so as to open the holder 131b, thereby making it possible to transfer the wafers W. Further, the Z-axis driving mechanism 199 is operated to move upward the wafers W, followed by operating the Y-axis driving mechanism so as to bring the transfer arm 121b back to the original position, thereby transferring the corresponding wafers W out of the rotor 131.

The θ-rotation driving mechanism is driven so as to permit the transfer arm 121b to face the FOUP stages 102a, 102b. Also, the X-axis driving mechanism 198 is operated to move the wafer transfer device 107 such that the transfer arm 121b faces the window portion 112b. Then, the window portion 112b is opened and the lid of the FOUP F2 is also opened by using the opening/closing device 114b so as to permit the inner space of the FOUP F2 to communicate with the inner space of the wafer transfer unit 104. Further, the height of the entire transfer arm 121b is adjusted by operating the Z-axis driving mechanism 199, followed by operating the Y-axis driving mechanism so as to insert the transfer arm 121b into the FOUP F2, thereby transferring the wafers W. Then, the transfer arm 121b is brought back to the original position. Still further, the lid of the FOUP F2 and the window portion 112b are closed, thereby finishing the operation of permitting the wafers W to be housed in the FOUP F2.

After the transfer arm 121b is brought back to the position facing the window portion 126, the wafers W remaining within the rotor 131 are taken out and housed in the FOUP F1 by the similar method. If the FOUPs F1 and F2 are removed from the FOUP stages 102a, 102b, it is possible to start the processing of the wafers W housed in the next FOUP.

Figure 15:
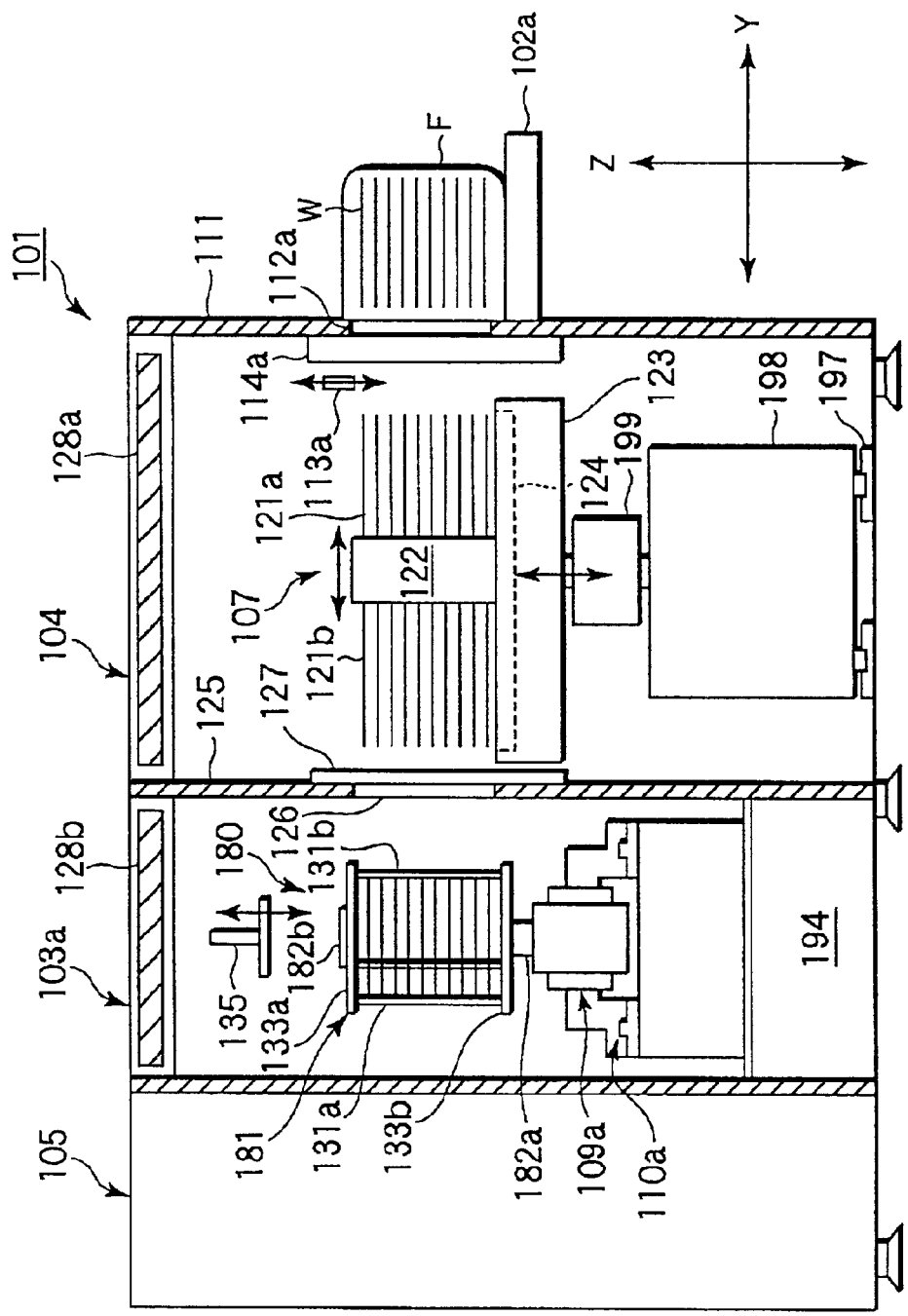
FIG. 15 is a vertical sectional view schematically showing the construction of a batch type cleaning process apparatus according to still another embodiment of the liquid processing apparatus of the present invention.
Figure 16:
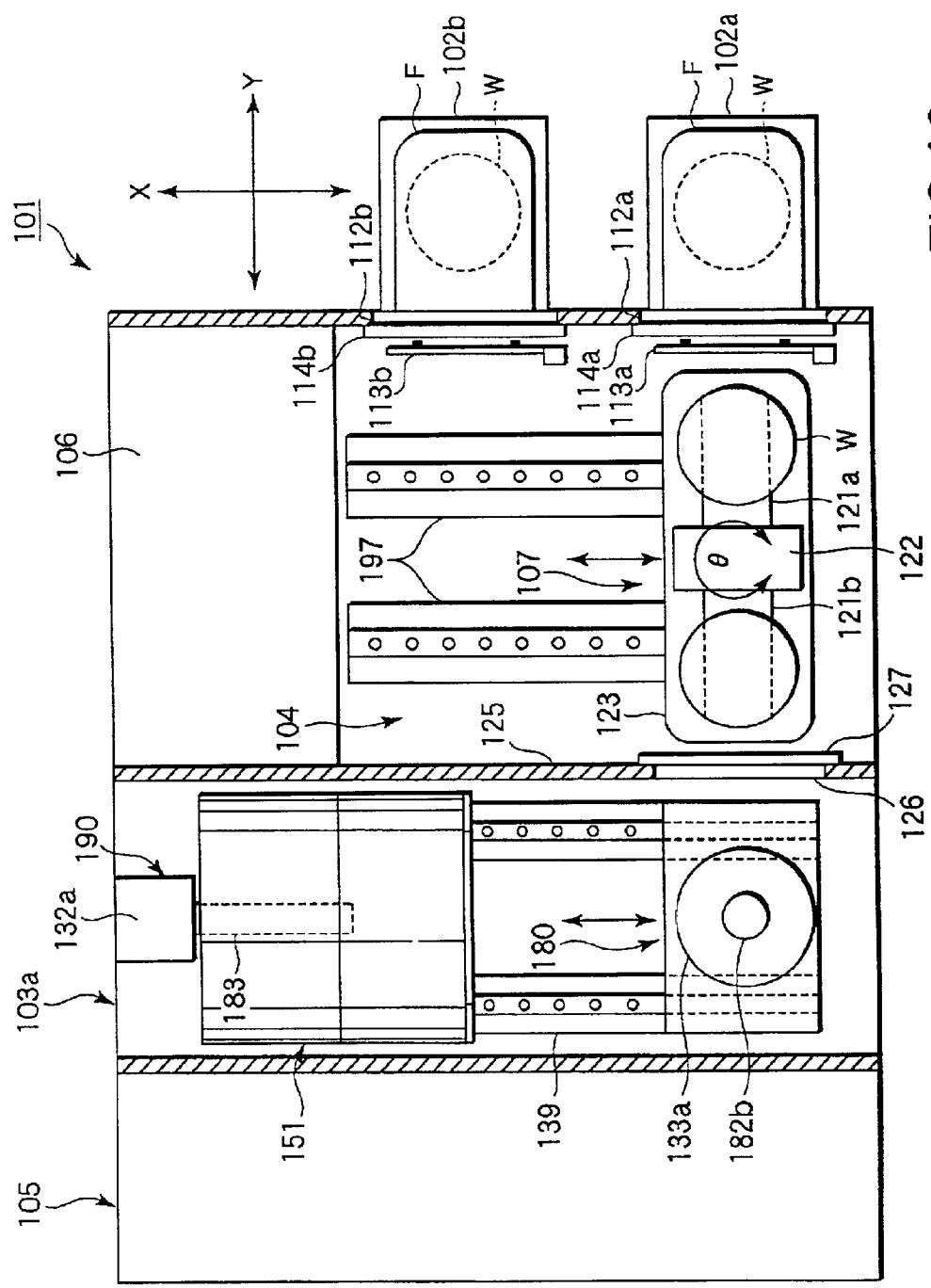
FIG. 16 is a cross-sectional plan view schematically showing the construction of the cleaning process apparatus shown in FIG. 15.

A cleaning process apparatus according to another embodiment of the present invention will now be described. FIGS. 15 and 16 are a vertical sectional view and a cross-sectional plan view, respectively, of a cleaning process apparatus 101 according to another embodiment of the present invention. The cleaning process apparatus 101 is substantially equal in construction to the cleaning process apparatus 100 described previously, except that the cleaning process apparatus 101 comprises a cleaning process unit 103a differing in construction from the cleaning process unit 103 included in the cleaning process unit 100 described previously. Such being the situation described in the following are the construction of the cleaning process unit 103a and the operation for processing the wafers W.

The cleaning process unit 103a comprises a rotor transfer mechanism 180, which is formed of a rotor 181, a posture changing mechanism 109a, and an X-axis driving mechanism 110a. The rotor 181 is constructed detachable between the disc 133b and a connecting member 182a joined to the posture changing mechanism 109a. Also, another connecting member 182b for joining the rotor 181 to a rotor delivery/rotation driving mechanism 190 and for releasing the joining of the rotor 181 to the mechanism 190 is mounted to the disc 133a. Incidentally, rotor 181 includes the engaging member 131a and the holder 131b, which are arranged between the discs 133a and 133b, like the rotor 131 described previously. Also, the holder lock pin 131c (not shown) is arranged in the disc 133a.

It is desirable for the posture changing mechanism 109a to include a position adjusting mechanism for performing the position adjustment such that the delivery port of the holder 131b for performing the delivery of the wafers W is allowed to face the window portion 126. The operations of the posture changing mechanism 109a and the X-axis driving mechanism 110a are equal to those of the posture changing mechanism 109 and the X-axis driving mechanism 110 included in the cleaning process apparatus 100 described previously.

Figure 17:
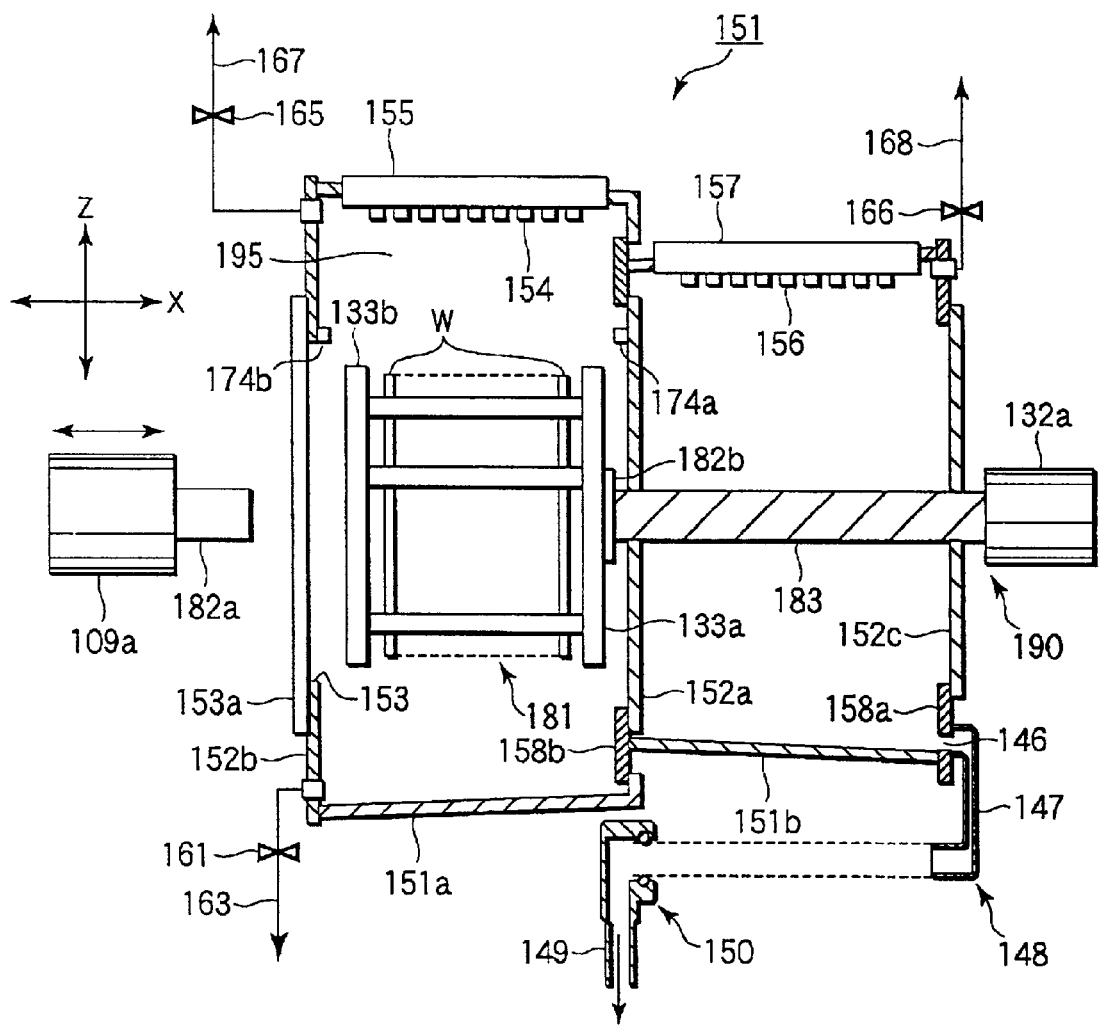
FIG. 17 is a cross sectional view showing the peripheral structure of the process chamber according to one embodiment of the present invention, said process chamber being arranged in the liquid process unit constituting the liquid processing apparatus shown in FIG. 15.

The rotor delivery/rotation driving mechanism 190 and the process chamber 151 are arranged in the cleaning process unit 103a. FIG. 17 is a cross sectional view showing the state that the rotor delivery/rotation driving mechanism 190 holds the rotor 181. The rotor delivery/rotation driving mechanism 190 is formed of a pivot 183 and a motor 132a. The edge portion of the pivot 183 is detachably mounted to the rotor 181, and the rotor 181 can be rotated by the rotation of the motor 132a.

The process chamber 151 arranged in the cleaning process unit 103a is equal in construction to the process chamber 151 arranged in the cleaning process unit 103 included in the cleaning process apparatus 100 described previously and, thus, is of a double wall structure consisting of the outside chamber 151a and the inside chamber 151b. It follows that, as in the cleaning process apparatus 100, the process chamber 151 can be used for the cleaning treatment performed in the outside chamber 151a and for the cleaning treatment performed in the inside chamber 151b depending on the position of the inside chamber 151b. A shutter 153a is mounted to the rotor insertion port 153 of the outside chamber 151a. The shutter 153a is opened when the rotor 181 is moved into and out of the outside chamber 151a, and is closed during the cleaning treatment.

How to clean the wafers W in the cleaning process unit 103a will now be described. The wafers W are held horizontal when transferred between the wafer transfer device 107 and the rotor 181, as in the cleaning process apparatus 100. When the wafers W are housed in the rotor 181, the posture changing mechanism 109a is operated so as to change the posture of the rotor 181 such that the wafers W are held in, for example, a vertical state, followed by operating the X-axis driving mechanism 110a so as to insert the rotor 181 into the outside chamber 151a through the rotor delivery port 153.

The X-axis driving mechanism 110a is moved until the connecting member 182b is joined to the pivot 183. After the connecting member 182b is joined to the pivot 183, the connection between the disc 133b and the connecting member 182a is released. As a result, the rotor 181 is rendered capable of rotation by the rotor delivery/rotation driving mechanism 190. Then, the X-axis driving mechanism 110a is operated to permit the connecting member 182a to be positioned outside the outside chamber 151a, and the shutter 153a is closed.

The process chambers 195 and 196 are formed by the outside chamber 151a and the inside chamber 151b as in the cleaning process chamber 100 described previously. Also, since the rotor 181 is rotated if the motor 132a is rotated, the cleaning treatment in the outside chamber 151a can be performed under the state shown in, for example, FIG. 17.

After completion of a series of the cleaning treatments, the shutter 153a is opened and the X-axis driving mechanism 110a is operated so as to join the connecting member 182a to the disc 133b of the rotor 181, followed by releasing the connection between the pivot 183 and the connecting member 182b. Then, the X-axis driving mechanism 110a and the posture changing mechanism 109a are operated so as to bring the rotor 181 back to the position where the wafers W are allowed to face the window portion 126, followed by opening the holder 131b so as to take the wafers W out of the rotor 181 by using the wafer transfer device 107.

It is possible to modify in various fashions each of the batch type cleaning process apparatuses 100 and 101 described above.

For example, it is possible for an apparatus for transferring the FOUP F between, for example, the cleaning process apparatus 100 and another apparatus to be mounted in an upper portion of the cleaning process apparatus 100. In this case, it is possible for the down flow of the clean air supplied from the ceiling region of the clean room, in which the cleaning process apparatus 100 is mounted, not to strike against the FOUPs F disposed on the FOUP stages 102a, 102b. In such a case, a problem is generated that particles or the like tend to be attached to the wafers W.

Figure 18A:
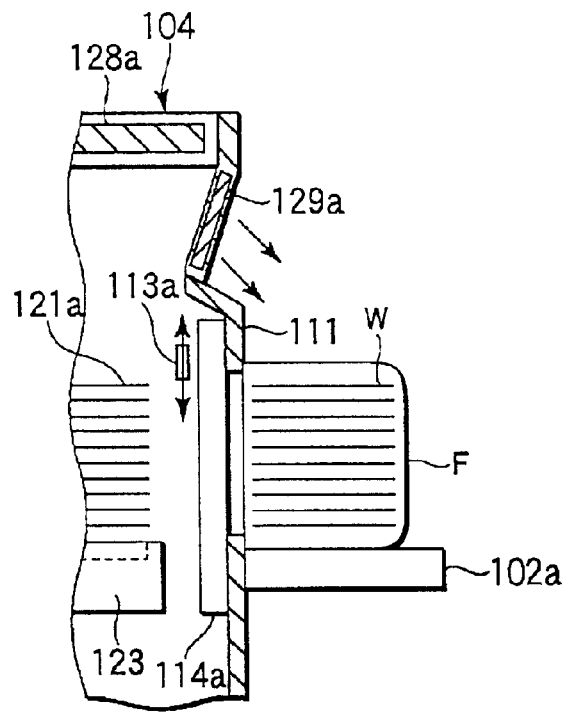
FIG. 18A shows a mechanism for supplying a clean air to a FOUP on a FOUP stage in the cleaning process apparatus shown in FIG. 15.

In order to overcome the difficulty, it is possible to arrange a predetermined inclined region above the wall portion 111 of the wafer transfer unit 104 and to arrange a filter 129a within the wall portion 111, as shown in FIG. 18A. In this case, the clean air from the filter fan unit (FFU) 128a arranged within the wafer transfer unit 104 is blown against the FOUP F.

Figure 18B:
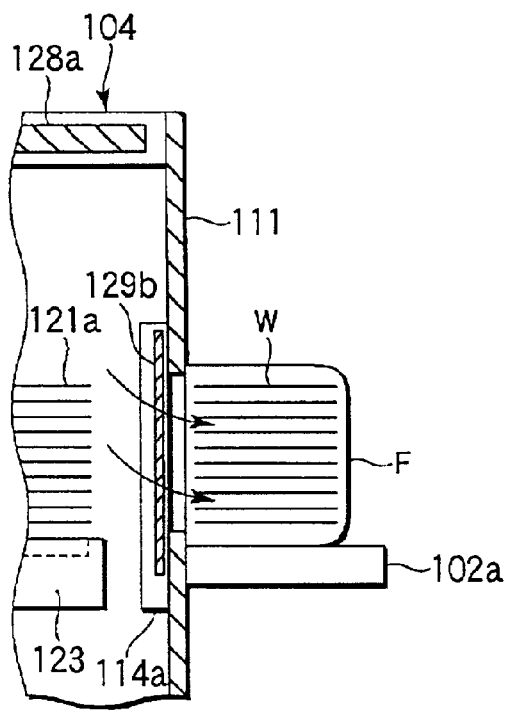
FIG. 18B shows another mechanism for supplying a clean air to a FOUP on FOUP stage in the cleaning process apparatus shown in FIG. 15.

It is also possible to use a filter 129b as a shutter included in each of the opening/closing devices 114a and 114b, as shown in FIG. 18B. In this case, the clean air from the filter fan unit (FFU) 128a is allowed to flow toward the FOUP F even under the state that the shutter is closed. In this fashion, it is possible to prevent the particles or the like from being attached to the wafers W.

Concerning the mode of rotation of the rotor, the embodiments described above cover the cases where the rotors 131, 181 are pivoted in a so-called "cantilever" structure so as to be rotated. Alternatively, if the posture changing mechanism 109a shown in, for example, FIG. 17 is pivoted by the connecting member 182a so as to be made rotatable, it is possible to allow the connecting member 182a to be joined to the disc 133b during the treatment so as to permit the rotor 181 to be pivoted on both sides. It is also possible for the rotor 131 included in the cleaning process apparatus 100 to be pivoted on both sides if, for example, a rotatable connecting member joined to the disc 133a from the side of the inside chamber 151b is arranged.

A liquid processing apparatus according to another embodiment of the present invention will now be described.

Figure 19:
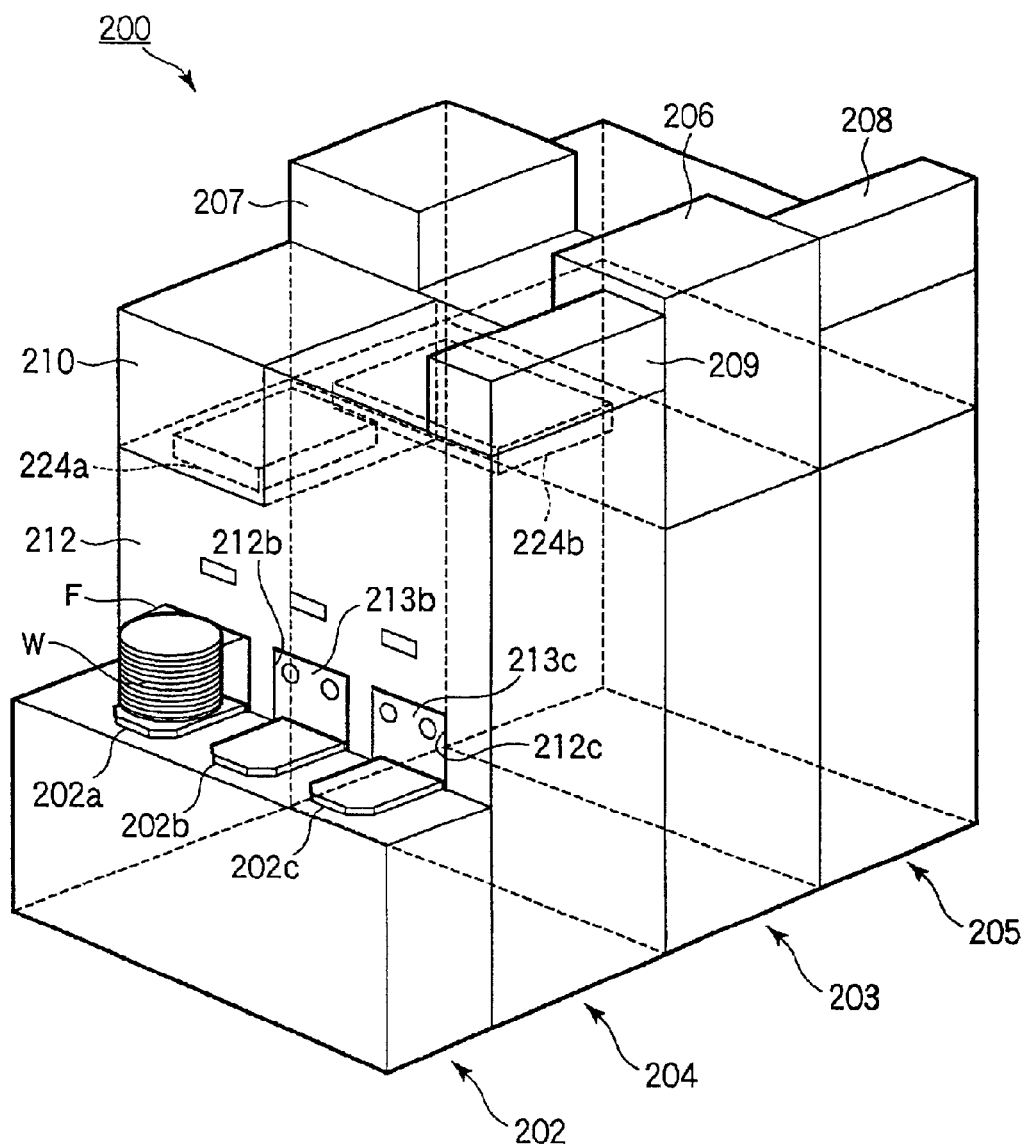
FIG. 19 is an oblique view schematically showing the construction of a batch type cleaning process apparatus according to still another embodiment of the liquid processing apparatus of the present invention.

FIG. 19 is an oblique view schematically showing the construction of a cleaning process apparatus 200 according to still another embodiment of the liquid processing apparatus of the present invention for processing a plurality of wafers W in a batch system. As shown in FIG. 19, the cleaning process apparatus 200 comprises mainly a FOUP delivery section 202 in which are arranged FOUP stages 202a to 202c on which FOUPs F each capable of housing a plurality of wafers W are disposed, a cleaning process unit 203 for applying a cleaning treatment to the wafers W, a wafer transfer unit 204 arranged between the FOUP delivery section 202 and the cleaning process unit 203, and a chemical liquid storing unit 205 for storing a chemical liquid used for the cleaning treatment.

A power source box 206 for various electric driving mechanisms and electronic control equipment mounted in the cleaning process apparatus 200 and a temperature control box 207 for controlling the temperatures of the various units constituting the cleaning process apparatus 200 are arranged in upper portions of the cleaning process unit 203. Also, a display box 209 for controlling the various display panels mounted to the cleaning process apparatus 200 and a transfer mechanism control box 210 housing a control device of a wafer transfer device 216 (see FIGS. 20 to 22 referred to herein later) arranged in the wafer transfer unit 204 are arranged in upper portions of the wafer transfer unit 204. Further, a hot exhaust gas box 208 collecting the hot exhaust gas from each box for the discharge to the outside is arranged in an upper portion of the chemical liquid storing unit 205.

Figure 20:
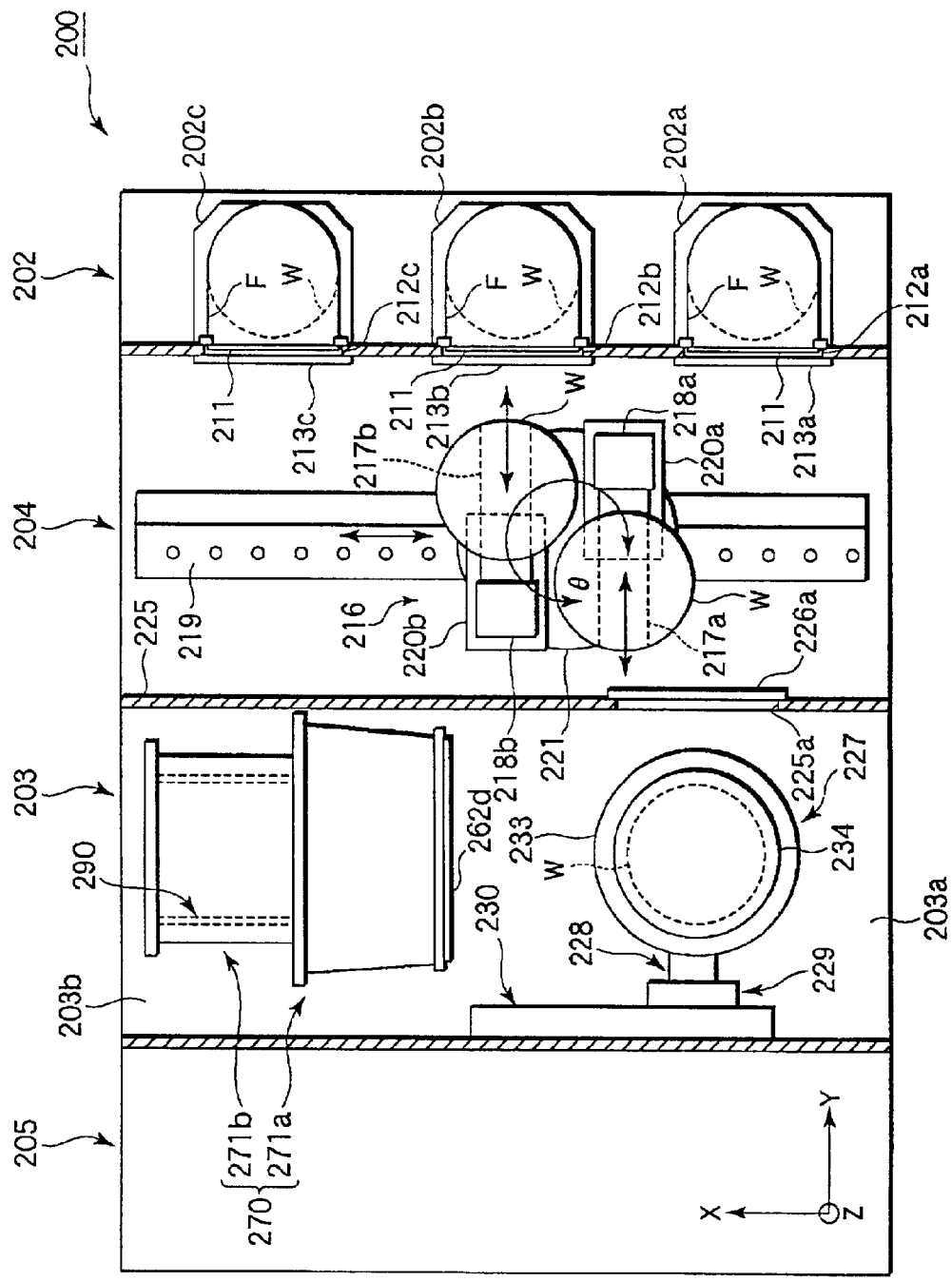
FIG. 20 is a cross-sectional plan view schematically showing the construction of the cleaning process apparatus shown in FIG. 19.
Figure 21:
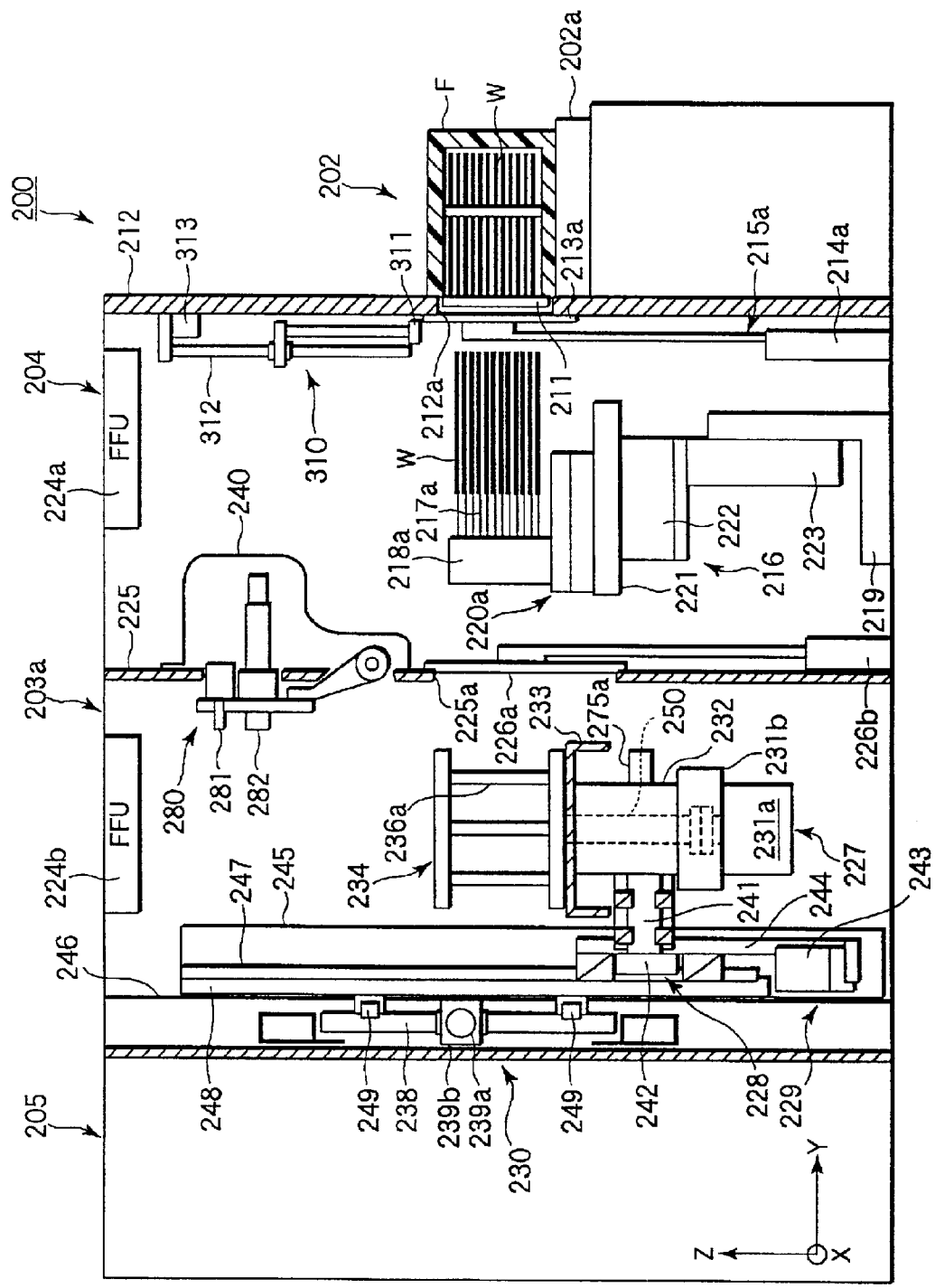
FIG. 21 is a vertical sectional view schematically showing the construction of the cleaning process apparatus shown in FIG. 19.
Figure 22:
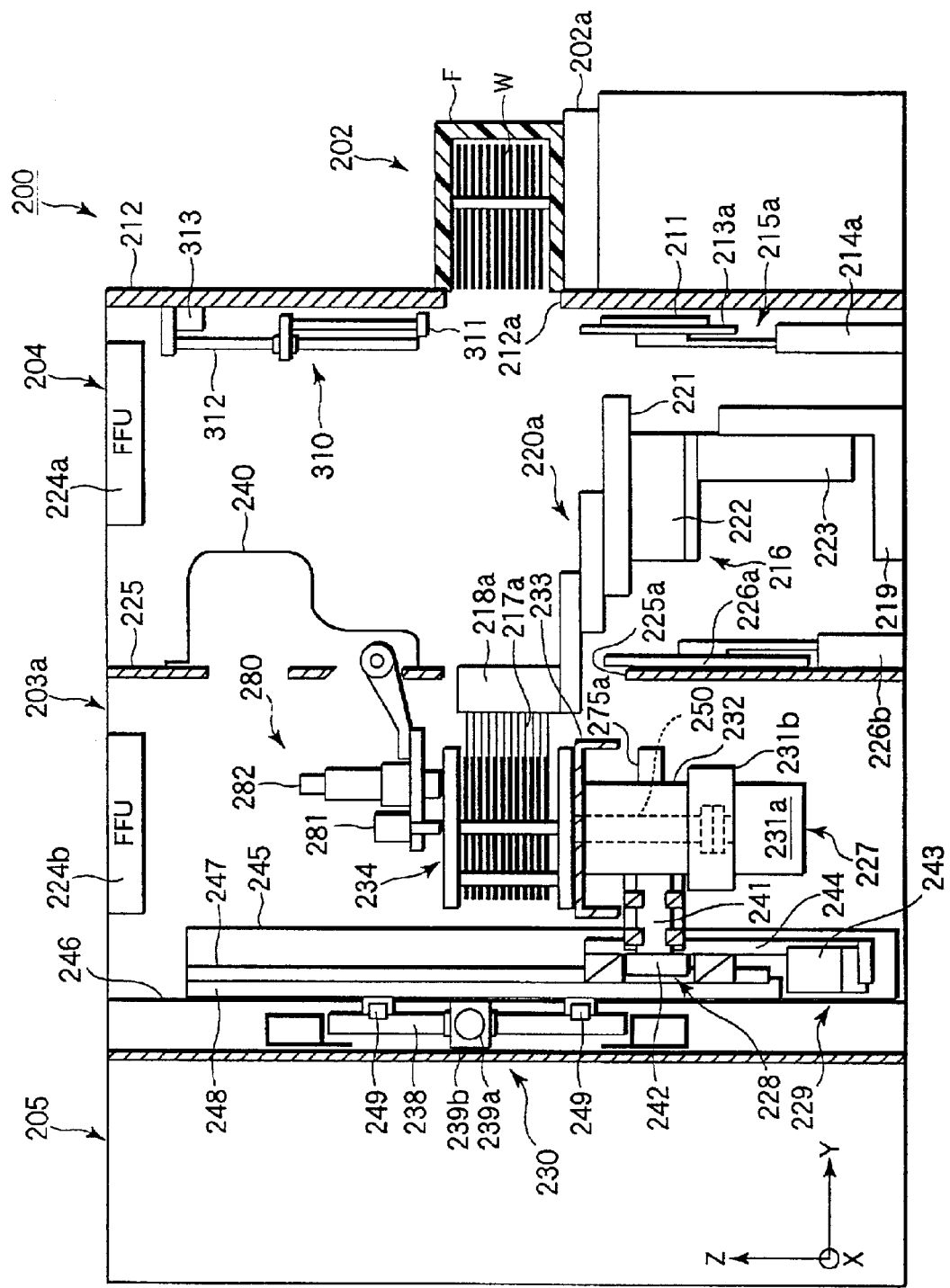
FIG. 22 is a vertical sectional view showing the state that some mechanism of the cleaning process apparatus shown in FIG. 19 is operated.

FIG. 20 is a cross-sectional plan view schematically showing the construction of the cleaning process apparatus 200. FIG. 21 is a vertical sectional view schematically showing the construction of the cleaning process apparatus 200. Further, FIG. 22 is a vertical sectional view corresponding to the side view shown in FIG. 21 and schematically showing the state that some of the driving mechanisms are driven. FIGS. 20 to 22 show only the FOUP delivery section 202, the cleaning process unit 203, the wafer transfer unit 204 and the chemical liquid storing section 205. In other words, the power source box 206 and various other boxes arranged in upper portions of the cleaning process unit 203, the wafer transfer unit 204 and the chemical liquid storing unit 205 are not shown in the drawings of FIGS. 20 to 22. Also, as described herein later, the cleaning process unit 203 can be divided into a transfer section 203a and a cleaning section 203b. The construction of the transfer section 203a is schematically shown in FIGS. 21 and 22.

Each of the FOUPs F disposed on the FOUP stages 202a to 202c is capable of storing a plurality of wafers W, e.g., 25 wafers, in a horizontal state a predetermined distance apart from each other. A wafer delivery port for delivering the wafers W is formed in one side wall of the FOUP F. The FOUP F includes a lid 211 for opening/closing the wafer delivery port. The lid 211 can be detached from the FOUP F by lid opening/closing mechanisms 115a to 115c described herein later.

Window portions 212a to 212c are formed in a boundary wall 212 between a wafer transfer unit 204 and a FOUP delivery section 202. As shown in FIG. 22, the FOUPs F are disposed on the FOUP stages 202a to 202c such that the outer circumferential portions of the wafer delivery ports formed in the FOUPs F serve to close the window portions 212a to 212c and the lid 211 is rendered detachable by the lid opening/closing mechanisms 215a to 215c.

The lid opening/closing mechanisms 215a to 215c formed in predetermined positions of the window portions 212a to 212c inside the boundary wall 212 (on the side of the wafer transfer unit 204) include shutters 213a to 213c for opening/closing the window portions 212a to 212c and lift mechanism 214a to 214c for vertically moving the shutters 213a to 213c, respectively. The lid opening/closing mechanisms 215a to 215c include lid holders such as adsorption pads (not shown), with the result that the lid 211 of the FOUP F can be moved in the vertical direction together with the shutters 213a to 213c.

When the FOUPs F are not disposed on the FOUP stages 202a to 202c, the shutters 213a to 213c are under the state of closing the window portions 212a to 212c so as to prevent the particles or the like from entering the wafer transfer unit 204 from the outside. On the other hand, when the wafers W are transferred into or taken out of the FOUP F, the shutters 213a to 213c and the lid 211 of the FOUP F are moved downward by the lid opening/closing mechanisms 215a to 215c so as to permit transfer arms 217a and 217b of a wafer transfer device 216 described herein later to gain access to the FOUP F, with the result that the window portions 212a to 212c are rendered open.

A wafer inspecting mechanism 310 for counting the number of wafers W housed in the FOUP F is arranged contiguous to each of the lid opening/closing mechanisms 215a to 215c within the wafer transfer unit 204. The wafer inspecting mechanism 310 comprises a reflection type optical sensor 311 having a signal transmitting section using an infrared ray laser and a signal receiving section, and receives the light reflected from the edge surface of the wafer W while scanning the reflection type optical sensor 311 in the Z-direction (vertical direction) along a guide 312 by using a motor 313 so as to count the number of wafers W and inspect the housed state of the wafers housed in the FOUP F. To be more specific, the wafer inspecting mechanism 310 inspects whether or not the wafers W are housed one by one in parallel at a predetermined pitch, whether or not two wafers W are housed in a superposed state, whether or not the wafers W are obliquely housed in different stages, and whether or not the wafers are deviated from predetermined positions.

Incidentally, if the wafer inspecting mechanism 310 is mounted to the wafer transfer device 216 so as to permit the wafer inspecting mechanism 310 to be movable together with the wafer transfer device 216, it suffices to arrange the wafer inspecting mechanism 310 in only one position. Also, it is possible to arrange, for example, a sensor for counting the number of wafers W and another sensor for inspecting the housed state of the wafers W separately from each other. Further, it is possible to mount the wafer inspecting mechanism 310 to the lid opening/closing mechanisms 215a to 215c.

A filter fan unit (FFU) 224a for blowing a clean air into the wafer transfer unit 204 is formed in the ceiling portion of the wafer transfer unit 204. The down flow of the clean air blown from the filter fan unit (FFU) 224a is discharged to the outside through an exhaust port (not shown) formed in a lower portion of the wafer transfer unit 204. Under the state that the window portions 212a to 212c are opened, the down flow of the clean air blown from the filter fan unit (FFU) 224a partly flows into the FOUP F so as to prevent the particles or the like from being attached to the inner region of the FOUP F. Incidentally, it is possible to arrange an ionizer (not shown) in a lower portion of the filter fan unit (FFU) 224a so as to neutralize the wafer W.

A wafer transfer device 216 is arranged within the wafer transfer unit 204. The wafer transfer device 216 comprises a linear driving mechanism 219 including a guide extending in the X-direction, transfer arms 217a, 217b for holding the wafers W, holding sections 218a, 218b for holding the transfer arms 217a, 217b, slide mechanisms 220a, 220b having the transfer arms 217a, 217b and the holding sections 218a, 218b arranged therein, a rotatable table 221 having the slide mechanisms 220a, 220b arranged therein, a rotating mechanism 222 for rotating the table 221, and a lift mechanism 223 for vertically moving the portion above the rotating mechanism 222.

Two systems of the transfer arms 217a and 217b are arranged in the wafer transfer device 216, making it possible to use, for example, the transfer arm 217a for transferring the unprocessed wafers W, with the transfer arm 217b used for transferring the wafers W after the cleaning treatment. In this case, it is possible to prevent effectively the difficulty that the particles or the like attached to the unprocessed wafers W are attached to the transfer arm and, then, to the processed wafers, compared with the case where, for example, a single system of the transfer arm alone is arranged. Also, where two systems of the transfer arms are arranged, it is possible to deliver the next unprocessed wafer W into the cleaning process unit 203 immediately after receipt of the processed wafer W from the cleaning process unit 203.

The transfer arm 217a includes 25 arm members each holding and transferring a single wafer W. These 25 arm members are arranged substantially in parallel a predetermined distance apart from each other and are held by the holding section 218a in order to permit the transfer arm 217a to transfer 25 wafers W housed in the FOUP F in a single transfer operation. Likewise, 25 arm members of the transfer arm 217b are held substantially in parallel a predetermined distance apart from each other by the holding section 218b. When the delivery of the wafer W is carried out between the FOUP F or a rotor 234 described herein later and the transfer arms 217a, 217b, it is necessary to move the transfer arms 217a, 217b in the vertical direction by a predetermined distance. The vertical movement of the transfer arms 217a, 217b can be performed by operating the lift mechanism 223. Incidentally, it is possible to mount a lift mechanism for vertically moving the transfer arms 217a, 217b separately to the holding members 218a, 218b.

The transfer arms 217a, 217b can be slid together with the holding sections 218a, 218b in the longitudinal direction of the transfer arms 217a, 217b by the slide mechanisms 220a, 220b. On the other hand, the table 221 can be rotated by the rotating mechanism 222 within a horizontal plane in the θ-direction shown in FIG. 20. Also, the height of the transfer arms 217a, 217b can be adjusted by the lift mechanism 223, and the transfer arms 217a, 217b can be moved in the X-direction by the linear driving mechanism 219 together with the lift mechanism 223, etc. It follows that the transfer arms 217a, 217b are capable of access to any of the FOUPs F disposed on the FOUP stages 202a to 202c and to the rotor 234 arranged in the cleaning process unit 203. It follows that the wafer transfer device 216 is capable of transferring the wafers W in a horizontal state between the FOUPs F disposed on the FOUP stages 202a to 202c and the rotor 234.

Suppose the transfer arm 217a is used for transferring the unprocessed wafers W. Where the unprocessed wafers W are transferred from the FOUP F disposed on the FOUP stage 202b into the rotor 234 arranged within the cleaning process unit 203, the linear driving mechanism 219 is operated first to move the transfer arm 217a in the X-direction so as to permit the transfer arm 217a to gain access to the FOUP F disposed on the FOUP stage 202b. Then, after the lift mechanism 223 is operated to adjust the height of the transfer arm 217a, the slide mechanism 220a is operated so as to slide the transfer arm 217a and the holding section 218 toward the FOUP stage 202b. If the transfer arm 217a holding the wafers W and the holding section 218a are brought back to the original positions, the wafers W are taken out of the FOUP F.

In the next step, the linear driving mechanism 219 is driven while operating the rotating mechanism 222 so as to rotate the table 221 by 180°, thereby permitting the transfer arm 217a to gain access to the rotor 234. If the transfer arm 217a and the holding section 218a are slid toward the rotor 234 so as to deliver the wafer W to the rotor 234 as shown in FIG. 22 and, then, the transfer arm 217a and the holding section 218a are brought back to the original positions, the transfer of the wafer W into the rotor 234 is finished.

FIG. 22 shows the state that the slide mechanism 220a is operated so as to slide the transfer arm 217a and the holding section 218a toward the rotor 234, thereby delivering the wafer W to the rotor 234. It should be noted that it is possible to omit the step of aligning the height of the transfer arms 217a, 217b by the lift mechanism 223, if the height position of the wafer W within the FOUP F is aligned with the height position at which the wafer W is held within the rotor 234.

In the wafer transfer device 216 described above, the transfer arms 217a and 217b are arranged in symmetry with respect to the center of rotation of the table 221. Therefore, if the table 221 is rotated under the state that the slide mechanisms 220a, 220b are not extended, it is possible to narrow the scope of the trace of the movement of the transfer arms 217a and 217b during the rotation even where the transfer arms 217a and 217b hold the wafer W. It follows that it is possible to diminish the space required by the wafer transfer unit 204 in the cleaning process unit 200.

A window portion 225a for transferring the wafer W is formed in a boundary wall 225 partitioning the wafer transfer unit 204 and the cleaning process unit 203. The window portion 225a is opened and closed by a shutter 226a that can be moved in the vertical direction by a lift mechanism 226b. In the cleaning process apparatus 200, the shutter 226a is arranged on the side of the wafer transfer unit 204. However, it is also possible to arrange the shutter 226a on the side of the cleaning process unit 203. The transfer of the wafer W between the wafer transfer unit 204 and the cleaning process unit 203 is carried out through the window portion 225a.

Since the atmosphere within the wafer transfer unit 204 is separated from the atmosphere within the cleaning process unit 203 by the shutter 226a, it is possible to prevent the contamination of the wafer transfer unit 204 even if, for example, the cleaning liquid is scattered or the vapor of the cleaning liquid is diffused within the cleaning process unit 203.

The cleaning process unit 203 comprises a transfer section 203a and a cleaning section 203b. A filter fan unit (FFU) 224b is arranged in the ceiling portion of the transfer section 203a so as to blow a clean air from which the particles have been removed into the transfer section 203a. Incidentally, it is possible to arrange an ionizer (not shown) in a lower portion of the filter fan unit (FFU) 224b so as to neutralize the wafer W.

As shown in FIGS. 20 to 22, arranged in the transfer section 203a are a rotor rotating mechanism 227, a posture changing mechanism 228 for controlling the posture of the rotor rotating mechanism 227, a Z-axis driving mechanism 229 for moving the rotor rotating mechanism 227 and the posture changing mechanism 228 in the vertical direction, an X-axis driving mechanism 230 for moving the Z-axis driving mechanism 229 in the horizontal direction, a cover 245 for preventing the particles generated from the posture changing mechanism 228 and the Z-axis driving mechanism 229 from being scattered toward the rotor rotating mechanism 227 so as to be attached to the wafer W, and another cover 246 for preventing the particles generated from the X-axis driving mechanism 230 from being scattered toward the rotor rotating mechanism 227 so as to be attached to the wafer W. In addition, a holder opening/closing mechanism 280 for opening/closing a holder 236b of the rotor 234 included in the rotor rotating mechanism 227 is arranged in the transfer section 203a.

A process chamber 270 comprising an outside chamber 271a and an inside chamber 271b and a cleaning mechanism 290 for cleaning the inside chamber 271b are arranged in the cleaning section 203b. Also arranged in the cleaning section 203b are a slide mechanism (not shown) of the inside chamber 271b and another slide mechanism (not shown) of the cleaning mechanism 290.

Figure 24:
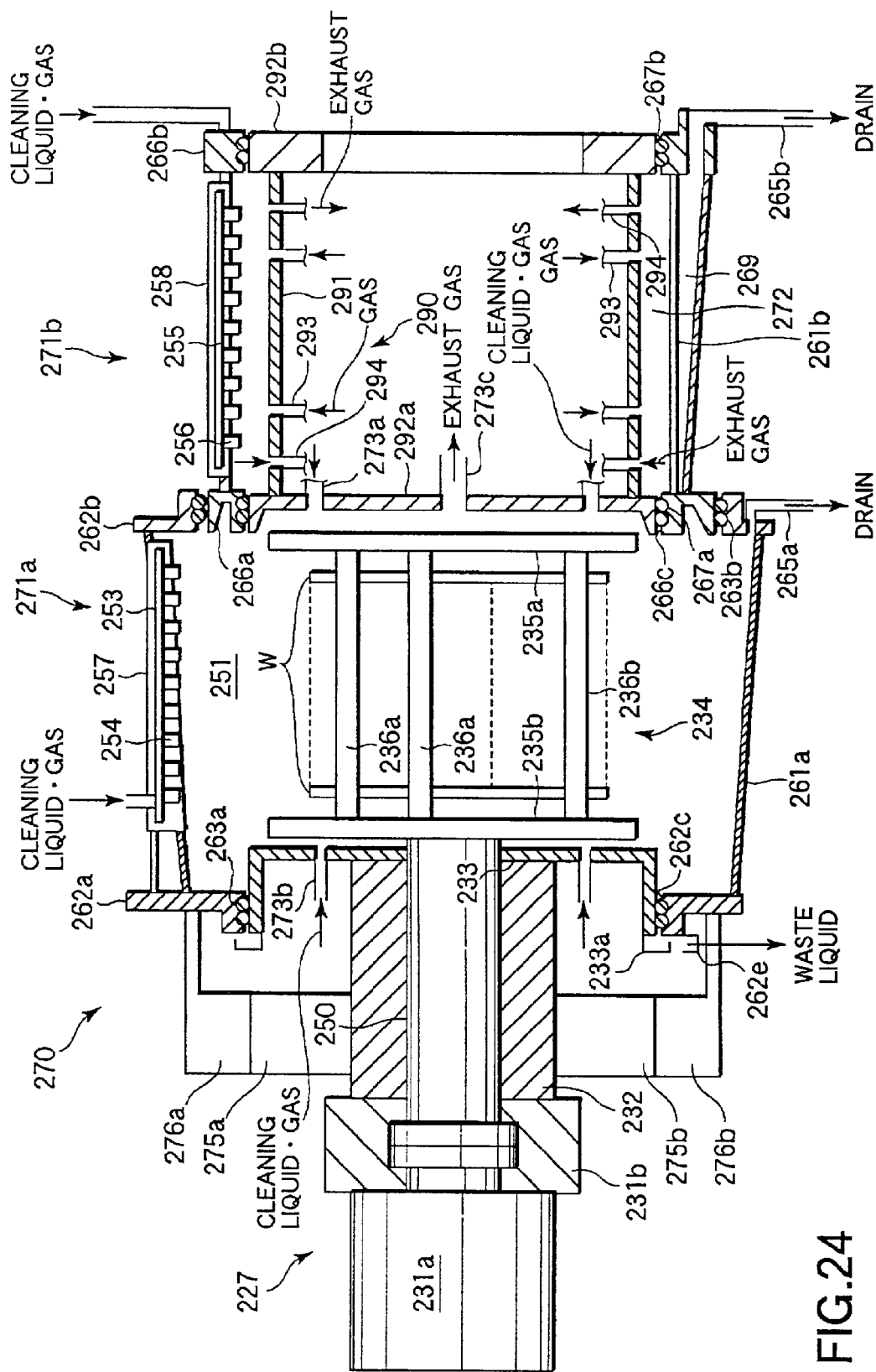
FIG. 24 is a cross sectional view showing the state that the rotor is inserted into the process chamber included in the cleaning process unit of the cleaning process apparatus shown in FIG. 19.
Figure 25:
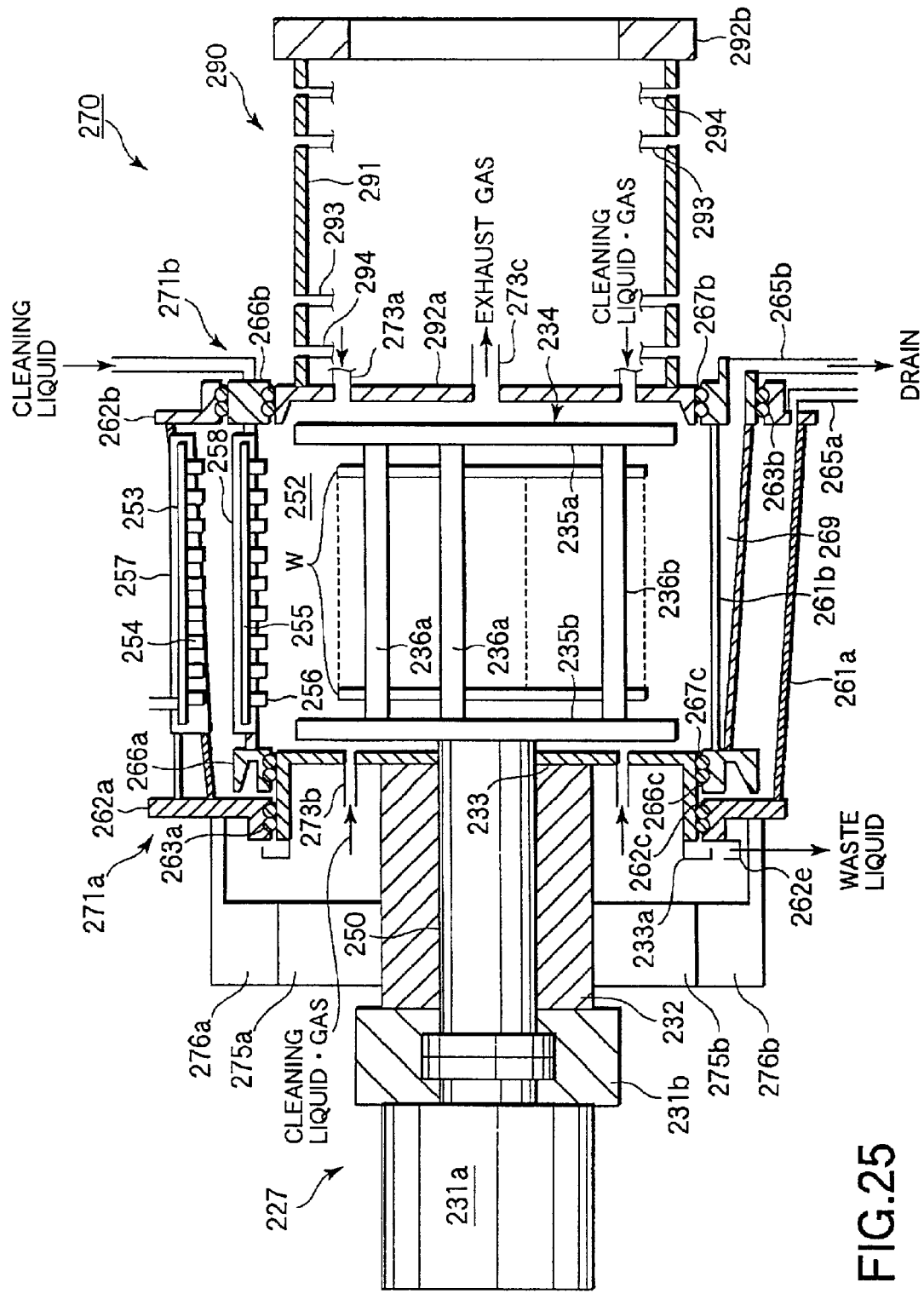
FIG. 25 is another cross sectional view showing the state that the rotor is inserted into the process chamber included in the cleaning process unit of the cleaning process apparatus shown in FIG. 19.
Figure 26A:
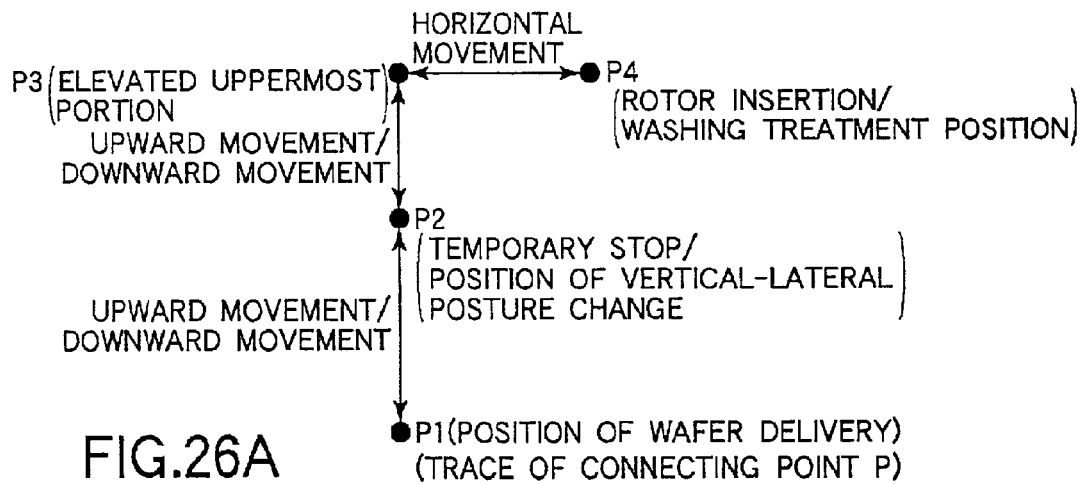
FIG. 26A shows the trace of movement of the rotor rotating mechanism included in the cleaning process unit of the cleaning process apparatus shown in FIG. 19.
Figure 26B:
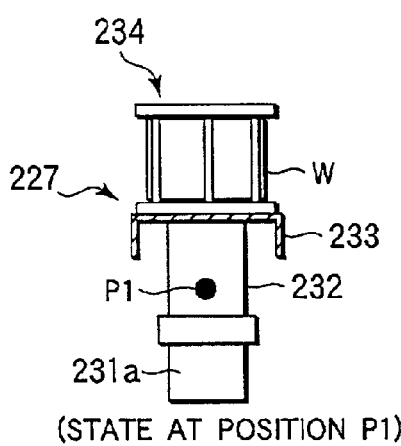
FIG. 26B shows the posture of the rotor rotating mechanism at point P1 shown in FIG. 26A.
Figure 26C:
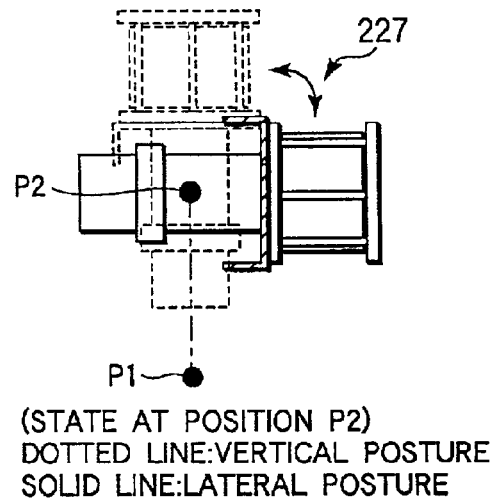
FIG. 26C shows the posture of the rotor rotating mechanism at point P2 shown in FIG. 26A.
Figure 26D:
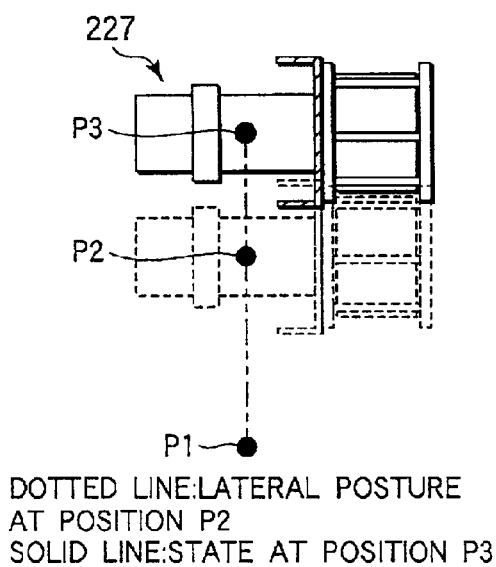
FIG. 26D shows the posture of the rotor rotating mechanism at point P3 shown in FIG. 26A.
Figure 26E:
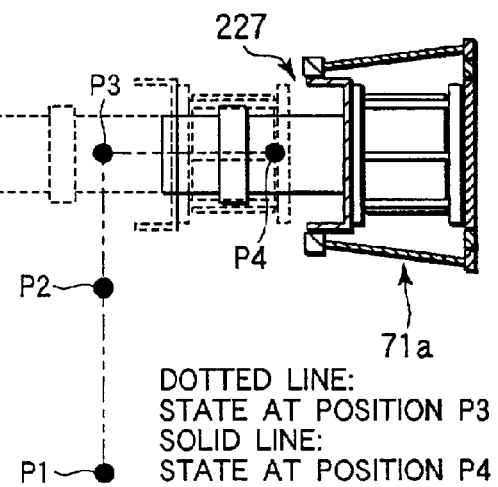
FIG. 26E shows the posture of the rotor rotating mechanism at point P4 shown in FIG. 26A.

FIG. 23A is a cross sectional view schematically showing the construction of the rotor rotating mechanism 227, and FIG. 23B is a front view showing the state that the rotor rotating mechanism 227 is inserted into the outside chamber 271a. Further, FIGS. 24 and 25 are cross sectional views collectively showing the state that the rotor 234 is inserted into the process chamber 270 arranged in the cleaning section 203b, wherein FIG. 24 shows the state that the inside chamber 271b is retreated to the outside of the outside chamber 271a, and FIG. 25 shows the state that the inside chamber 271b is housed in the outside chamber 271a for performing the required processing.

The rotor rotating mechanism 227 comprises the rotor 234 capable of holding the wafers W a predetermined distance apart from each other, a motor 231a for rotating the rotor 234 such that the wafer W held by the rotor 234 makes a planar rotation, a pivot 250 for connecting the motor 231a and the rotor 234, a motor connecting section 231b between the motor 231a and the pivot 250, a pivot cover 232 surrounding the pivot 250, and a lid 233 closing a rotor delivery port 262c formed in the outside chamber 271a when the rotor 234 is inserted into the outside chamber 271a. Clamp pads 275a, 275b, which are engaged with clamp levers 276a, 276b arranged in the outside chamber 271a when the rotor 234 is inserted into the outside chamber 271a, are mounted to the pivot cover 232.

The outside chamber 271a comprises a cylindrical body 261a, ring members 262a, 262b arranged in the edge surfaces of the cylindrical body 261a, seal mechanisms 263a, 263b mounted to the inner circumferential surfaces of the ring members 262a, 262b, clamp levers 276a, 276b mounted to the ring member 262a, 262b, a spurting nozzle 254 mounted to the cylindrical body 261a and having a large number of cleaning liquid spurting ports 254 arranged in the horizontal direction, a nozzle case 257 housing the spurting nozzle 253, an exhaust gas/waste liquid discharge pipe 265a mounted to a lower portion of the outside chamber 271a for discharging the cleaning liquid to the outside and capable of releasing the exhaust gas to the outside, and a distance measuring sensor 262f for measuring the distance to the rotor 234, the distance measuring sensor 262f being shown in FIG. 27 referred to herein later. In the ring member 262a, the inner circumferential surface having the seal mechanism 263a arranged thereon constitutes a rotor delivery port 262c for moving the rotor 234 into and out of the outside chamber 271a.

The inside chamber 271b comprises a cylindrical body 261b, ring members 266a, 266b mounted to the edge surfaces of the cylindrical body 261b, seal mechanisms 267a, 267b each being arranged in two positions on the inner circumferential surfaces of the ring members 266a, 266b, a spurting nozzle 255 mounted to the cylindrical body 261b and having a large number of cleaning liquid spurting ports 256 arranged in the horizontal direction, a nozzle case 258 for housing the spurting nozzle 255, and an exhaust gas/waste liquid discharge pipe 265b arranged in a lower portion of the inside chamber 271b for discharging the cleaning liquid to the outside and capable of releasing the exhaust gas to the outside. In the ring member 266a, the inner circumferential surface having the seal mechanism 267a arranged thereon constitutes a rotor delivery port 266c for moving the rotor 234 into and out of the inside chamber 271b when the inside chamber 271b is in the process position.

The cleaning mechanism 290 comprises a cylindrical body 291, a disc 292a mounted to one edge surface of the cylindrical body 291, a ring member 292b mounted to the other edge surface of the cylindrical body 291, and a gas supply nozzle 293 and an exhaust pipe 294 mounted to the cylindrical body 291. Further, a spurting nozzle 273a and an exhaust pipe 273c are mounted to the disc 292a.

The constituents of the transfer section 203a will now be described first. When the wafer W is transplanted between the rotor 234 and the wafer transfer device 216, the rotor rotating mechanism 227 is maintained in a posture in which the wafers W are held in a horizontal state, as shown in FIG. 22. When the cleaning treatment is performed, the posture of the rotor rotating mechanism 227 is changed into a lateral posture in which the wafers W are held in a vertical state, as shown in FIGS. 23B, 24 and 25. Such a change in the posture of the rotor rotating mechanism 227 is carried out by using the posture changing mechanism 228, the Z-axis driving mechanism 229 and the X-axis driving mechanism 230.

The posture changing mechanism 228 for controlling the posture of the rotor rotating mechanism 227 comprises a rotating mechanism 242 and a pivot 241 mounted to the rotating mechanism 242. The pivot 241 is fixed to a pivot cover 232 of the rotor rotating mechanism 227. The Z-axis driving mechanism 229 comprises a motor 243, a mechanical power transmitting section 244 for transmitting the rotary driving force and the displacement of the motor 243 to the posture changing mechanism 228, a guide 247, and a support member 248 for supporting the guide 247. The posture changing mechanism 228 is engaged with the guide 247 so as to be moved along the guide 247. If the motor 243 is rotated, the rotary driving force and the displacement of the motor 243 are transmitted to the posture changing mechanism 228 via the mechanical power transmitting section 244 so as to permit the posture changing mechanism 228 to be moved by a predetermined distance along the guide 247 in the Z-direction (vertical direction) together with the rotor rotating mechanism 227.

The Z-axis driving mechanism 229 is not limited to the mechanism of changing the rotary displacement of the motor 243 into a linear displacement. For example, it is also possible to use a driving mechanism directly generating a linear displacement such as an air cylinder in place of the motor 243.

The X-axis driving mechanism 230 comprises a guide 249, a motor (not shown), a ball screw 239a joined to the motor, a meshing member 239b meshed with the ball screw 239a, and a connecting member 238 engaged with the guide 249 for connecting between the meshing member 239a and the support member 248. If the motor is rotated, the ball screw 239a is operated and the meshing member 239a is moved in the X-direction in accordance with operation of the ball screw 239a. In this case, since the connecting member 238 allows the meshing member 239b and the support member 248 to be connected to each other, the connecting member 239 and the support member 248 are also moved in the X-direction together with the meshing member 239b. In other words, the rotor rotating mechanism 227, the posture changing mechanism 228 and the Z-axis driving mechanism 229 are moved simultaneously in the X-direction when the meshing member 239a is moved in the X-direction. A stopper (not shown) is mounted to the guide 249 of the X-axis driving mechanism 230 so as to prevent the rotor rotating mechanism 227 from being moved toward the cleaning section 203b beyond a predetermined position.

FIGS. 26A to 26E collectively show how the rotor rotating mechanism 227 is moved by using the posture changing mechanism 228, the Z-axis driving mechanism 229 and the X-axis driving mechanism 230. To be more specific, FIG.

Figure 27A:
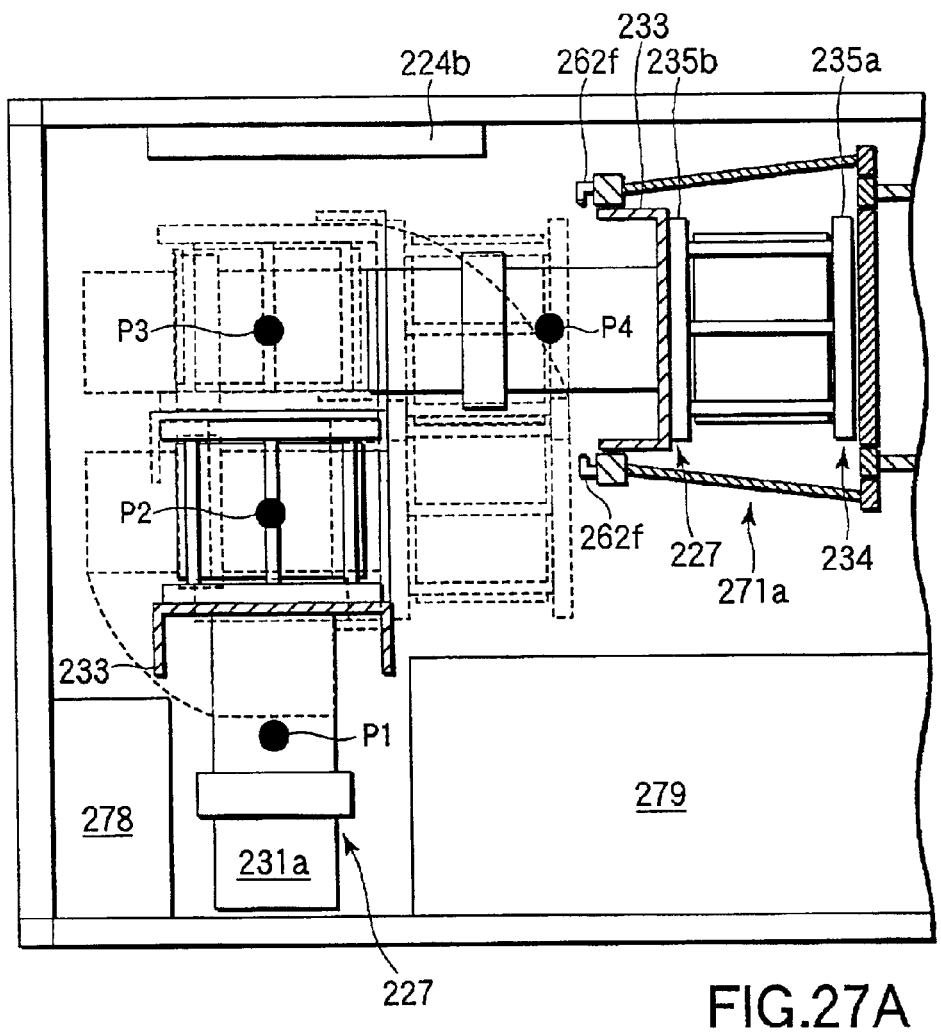
FIG. 27A shows the space required for the movement of the rotor rotating mechanism in the mode of movement of the rotor rotating mechanism shown in FIGS. 26B to 26E.
Figure 27B:
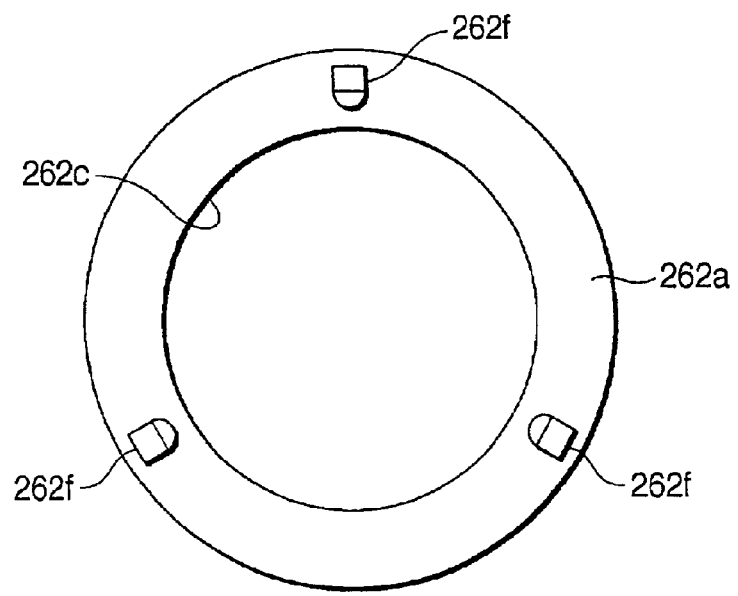
FIG. 27B is a front view showing the position of a length-measuring sensor arranged in the process chamber included in the cleaning process unit of the cleaning process apparatus shown in FIG. 19.

26A shows the trace of movement of a connecting point P between the pivot cover 232 included in the rotor driving mechanism 227 and the pivot 241 of the posture changing mechanism 228, and FIGS. 26B to 26E show the postures of the rotor rotating mechanism 227 when the connecting point P is in positions P1 to P4. Further, FIG. 27A shows the rotor rotating mechanism 227 in positions P1 to P4 shown in FIGS. 26B to 26E and is intended to explain the space required for the movement of the rotor rotating mechanism 227.

Explained as an example is the case where the rotor rotating mechanism 227 is moved such that the pivot cover 232 is moved from position P1 to position P4 in order to insert the rotor 234 holding the wafers W into the outside chamber 271a. When the connecting point P is in position P1, the rotor rotating mechanism 227 is in the position where delivery of the wafers W can be performed between the rotor 234 and the wafer transfer device 216. In this stage, the rotor rotating mechanism 227 assumes a vertical posture. After the wafers W are housed in the rotor 234, the Z-axis driving mechanism 229 is operated first so as to move upward the rotor rotating mechanism 227 and the posture changing mechanism 228 such that the connecting point P is moved to position P2. In position P2, the posture changing mechanism 228 is operated so as to rotate the entire rotor rotating mechanism 227 by 90° so as to allow the entire rotor rotating mechanism 227 to assume a lateral posture such that the horizontal holding state of the wafers W is changed into the vertical holding state.

In the next step, the Z-axis driving mechanism 229 is operated again with the entire rotor rotating mechanism 227 left to assume the lateral posture such that the connecting point P is moved to position P3, thereby moving upward the rotor rotating mechanism 227. It should be noted that the spaces 278, 279 can be ensured by changing the posture of the rotor rotating mechanism 227 at position P2, which is intermediate between the position P1 at which the upward movement of the rotor rotating mechanism 227 is started and the position P3 at which the upward movement of the rotor rotating mechanism 227 is finished. It is possible to diminish the entire cleaning process apparatus 200 by effectively utilizing these spaces 278, 279 such that various control devices are arranged in the space 279.

To be more specific, where the posture of the rotor rotating mechanism 227 is changed at the position P1, it is impossible to ensure the space 278. Also, the volume of the space 279 is limited to the narrow portion on the side of the process chamber 270. On the other hand, where the posture of the rotor rotating mechanism 227 is changed in the position P3, it is necessary to increase the height of the ceiling to which the filter fan unit (FFU) 224b is mounted, leading to enlargement of the cleaning process apparatus 200. However, these problems can be solved if the posture of the rotor rotating mechanism 227 is changed in the position P2 so as to decrease the volume occupied by the transfer section 203a, thereby making the entire construction of the cleaning process apparatus 200 compact.

If the connecting point P has been moved to reach the position P3, the X-axis driving mechanism 230 is operated so as to move horizontally the connecting point P to the position P4. When the connecting point P is in the position P4, it is possible to insert the rotor 234 into the outside chamber 271a so as to carry out the cleaning treatment. In this fashion, it is possible to move the rotor 234 from the delivery position with the wafer transfer device 216 to the cleaning process position.

When the rotor 234 is inserted into the outside chamber 271a by horizontally moving the connecting point P from the position P3 to the position P4, the distance between the rotor delivery port 262c and the discs 235a, 235b included in the rotor 234 is measured by using the distance measuring sensor 262f arranged in the ring member 262a so as to prevent the rotor 234 from colliding against the ring member 262a. As shown in, for example, FIG. 27B, which is a front view, it is possible to arrange the distance measuring sensor 262f at three points equidistantly apart from each other along the outer circumferential surface of the ring member 262a.

The distance measuring sensor 262f is used as follows. In the first step, the movement of the X-axis driving mechanism 230 is once stopped when the disc 235a is moved to the position facing the distance measuring sensor 262f so as to measure the position of the disc 235a by the distance measuring sensor 262f. It is judged on the basis of the measured value whether the disc 235a is capable of moving through the rotor delivery port 262c. Where it has been judged that the disc 235a is incapable of moving through the rotor delivery port 262c, the rotor rotating mechanism 227 is brought back to the original position, and the operation of the cleaning process apparatus 200 is stopped so as to carry out the maintenance.

On the other hand, where it has been judged that the disc 235a is capable of moving through the rotor delivery port 262c, the X-axis driving mechanism 230 is operated again and the operation of the X-axis linear driving mechanism is temporality stopped again when the disc 235b has been moved horizontally to the position facing the distance measuring sensor 262f so as measure the position of the disc 235b by the distance measuring sensor 262f. It is judged on the basis of the measured value whether or not the disc 235b is capable of passing through the rotor delivery port 262c. Where it is judged that the disc 235b is incapable of passing through the rotor delivery port 262c, the transfer of the rotor 234 into the outside chamber 271a is stopped and the rotor rotating mechanism 227 is brought back to the original position so as to stop the operation of the cleaning process apparatus 200 and to perform the maintenance. Also, where it has been judged that the disc 235b is capable of passing through the rotor delivery port 262c, the driving of the X-axis driving mechanism 230 is started again so as to transfer the rotor 234 into the outside chamber 271a.

Incidentally, FIGS. 24 and 25 show in detail the state that the connecting point P is in the position P4 and the rotor 234 is inserted into the outside chamber 271a. After the cleaning treatment of the wafer W is finished, it is possible to move the rotor rotating mechanism 227 to the position where the wafers W within the rotor 234 can be delivered to the wafer transfer device 216 by tracing in the opposite direction the moving route of the rotor rotating mechanism 277 described previously such that the connecting point P is moved from the position P4 back to the position P1.

Figure 28:
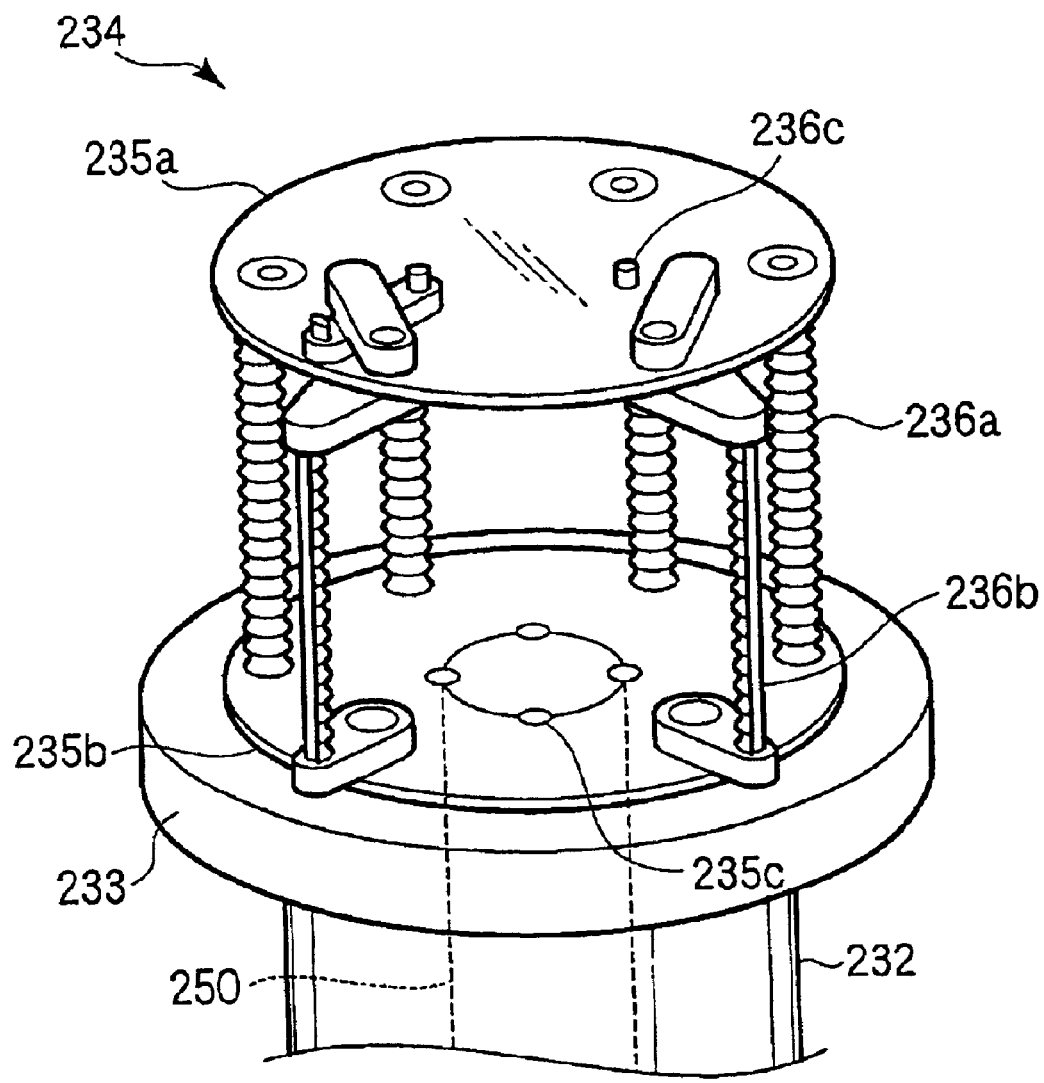
FIG. 28 is an oblique view showing the construction of the rotor included in the cleaning process unit of the cleaning process apparatus shown in FIG. 19.

The constituents of the rotor rotating mechanism 227 will now be described. FIG. 28 is an oblique view showing the construction of the rotor 234. As shown in the drawing, the rotor 234 comprises a pair of discs 235a, 235b arranged a predetermined distance apart from each other, an engaging member 236a having, for example, grooves for holding the wafers W formed therein at a predetermined interval, an openable holder 236b having, for example, grooves formed therein like the engaging member 236a, and a lock pin 236c controlling whether or not the holder 236b should be opened or closed. It is possible to fix the engaging member 236a between the discs 235a and 235b by applying a screw clamp to the engaging member 236a from outside the discs 235a and 235b. The wafers W are housed in the grooves of the engaging member 236a and the holder 236b. It is possible to fix the disc 235b to a pivot 250 by using, for example, screws 235c.

The holder opening/closing mechanism 280 for opening/closing the holder 236b is arranged on the side of the transfer section 203a of the boundary wall 225 as shown in FIGS. 21 and 22, and comprises a lock pin depressing cylinder 281 and a holder opening/closing cylinder 282. The holder opening/closing mechanism 280 is rotatable between the retreat position shown in FIG. 21 and the operating position shown in FIG. 22 such that the lock pin depressing cylinder 281 and the holder opening/closing cylinder 282 are allowed to gain access to the lock pin 236c and the holder 236b, respectively, in the position where delivery of the wafers W is performed between the rotor 234 and the transfer arms 217a, 217b. The cover 240 is arranged in that portion of the boundary wall 225 in which the holder opening/closing mechanism 280 is arranged so as to separate the wafer transfer unit 204 and the cleaning process unit 203 from each other.

The lock pin 236c projects in, for example, the ordinary state to the outside of the disc 235a. Under this state, the lock pin 236c is incapable of performing the opening/closing operation of the holder 236b. On the other hand, the lock pin depressing cylinder 281 is provided with a depressing mechanism that permits depressing in its operating position the lock pin 236c into the rotor 234. Also, the holder opening/closing cylinder 282 gains access to the holder 236b in the outside of the disc 235a so as to open or close the holder 236b. Under the state that the holder opening/closing mechanism 280 gains access to the rotor 234 so as to permit the lock pin 236c to be pushed into the rotor 234 by the pushing force generated from the lock pin depressing cylinder 281, the holder 236b is made openable by the holder opening/closing cylinder 282.

Under the state that the holder 236b is opened, it is possible to carry out the delivery of the wafer W between the rotor 234 and the transfer arms 217a, 217b. On the other hand, when the holder 236b is closed, the wafer W within the rotor 234 is prevented from coming out of the rotor 234.

Where the holder 236b is opened in accordance with the modes of the holder 236b, the lock pin 236c and the holder opening/closing mechanism 280 described above, the holder opening/closing mechanism 280 in its retreat position is moved to its operating position so as to gain access to the rotor 234, thereby allowing the lock pin depressing cylinder 281 to push the lock pin 236c into the rotor 234. Under this condition, the holder opening/closing cylinder 280 is operated so as to open the holder 236b, thereby making it possible to carry out the delivery of the wafers W. After delivery of the wafers W is finished, the holder 236b is closed and, then, the pushing force of the lock pin depressing cylinder 281 is released so as to permit the lock pin 236c to project to the outside of the disc 235a, thereby locking the holder 236b. Then, the holder opening/closing mechanism 280 is brought back to the retreat position in preparation for the processing of the next wafer W.

Where the inside chamber 271b is in its retreat position, the lid 233 formed integral with the rotor rotating mechanism 277 closes the rotor delivery port 262c of the outer chamber 271a when the rotor 234 is inserted into the outside chamber 271a, and the clearance between the side surface of the lid 233 and the rotor delivery port 262c is sealed by the seal mechanism 263a, as shown in FIG. 24. Also, where the inside chamber 271b is in its operating position, the side surface of the lid 233 further closes the delivery port 266c of the inside chamber 271b, and the clearance between the side surface of the lid 233 and the delivery port 266c is sealed by the seal mechanism 267a, as shown in FIG. 25. In this fashion, the cleaning liquid is prevented from being scattered from the process chamber 270 into the transfer section 203a. The rotor delivery port 262c formed in the ring member 262a of the outside chamber 271a can be opened or closed freely by the lid 262d, as shown in FIG. 20.

It is possible to prevent the collision between the lid 233 and the ring member 266a even where, for example, the rotor rotating mechanism 227 is erroneously caused to overrun when the rotor rotating mechanism 227 is inserted into the inside chamber 271b by allowing the side surface of the lid 233 to be in the shape of a cylinder free from stepped portions and gradient and by making the rotor delivery ports 262c and 266c equal to each other in diameter. Also, in the liquid processing using the inside chamber 271b, the lid 233 is sealed by the seal mechanisms 263a, 267a, with the result that it is possible to effectively prevent the atmosphere within the inside chamber 271b from leaking into the transfer section 203a.

Figure 29A:
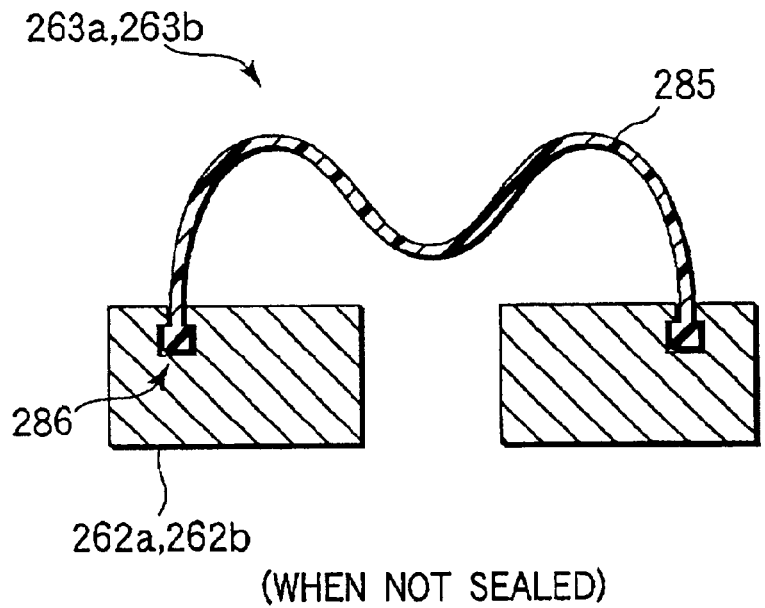
FIG. 29A is a cross sectional view schematically showing the construction of the seal mechanism used in the process chamber included in the cleaning process unit of the cleaning process apparatus shown in FIG. 19.
Figure 29B:
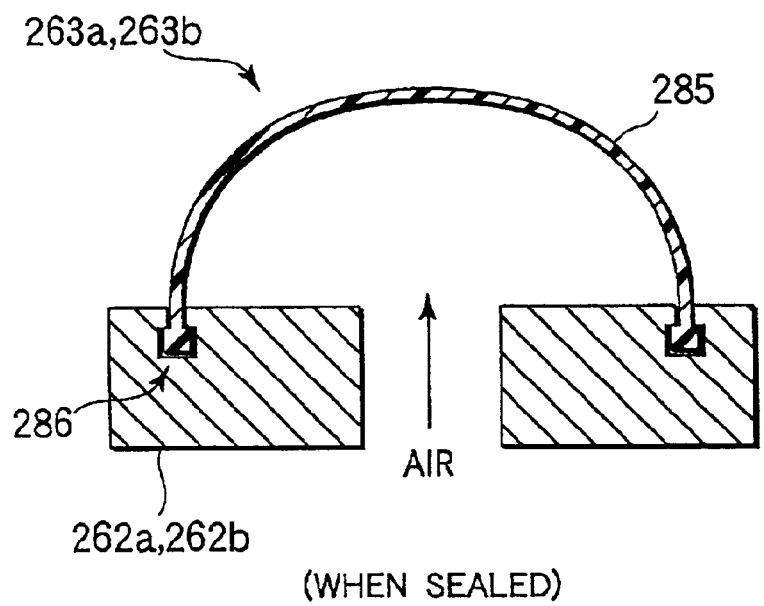
FIG. 29B is a cross sectional view showing the state that the seal mechanism shown in FIG. 29A is operated.

A rubber tube 285 is suitably used as each of the seal mechanism 263a and 267a. During the non-sealing time, the rubber tube 285 has a substantially M-shaped cross section as shown in FIG. 29A. Also, during the sealing time, the air or the like having a predetermined pressure is supplied into the rubber tube 285 so as to swell the central concave portion of the rubber tube 285 to permit the central portion to project upward, as shown in FIG. 29B, thereby producing the sealing function. Each of the seal mechanisms 263a and 267a is formed at two positions in respect of the rotor delivery ports 262c, 266c of the ring members 262a, 266a, thereby enhancing the sealing function.

The rubber tube 285 is engaged with a groove portion 286 formed in the ring members 262a, 266a. Where the rubber tube 285 is rendered unusable by the deterioration caused by a chemical liquid or by the deterioration with time, the rubber tube 285 alone can be renewed. It is also possible to attach another ring member engaged with the rubber tube 285 to the ring members 262a, 266a and to renew collectively the rubber tube 285 and said "another" ring member.

In the case of using a seal mechanism utilizing the air pressure like the seal mechanisms 263a, 267a, it is possible to ensure a satisfactory sealing function by increasing the pressure of the air supplied into the rubber tube 285 even where the process pressures within the outside chamber 271a and the inside chamber 271b are high. The seal mechanism shown in FIGS. 29A and 29B can be similarly used for the seal mechanisms 263b, 267b. Incidentally, it is certainly possible to use a rubber seal ring that does not utilize the air pressure. In this case, however, it is difficult to control the intensity of the sealing function.

An annular liquid receptacle 233a is arranged on the side of the motor 231a of the lid 233. The cleaning liquid flowing into the liquid receptacle 233a is forcedly discharged to the outside. Where the cleaning liquid is attached to the side surface of the lid 233 and to that portion of the lid 233 which faces the disc 235b after completion of the cleaning treatment of the wafer W, it is possible for the attached cleaning liquid to flow along the side surface of the lid 233 so as to form a liquid droplet and, then, to drop onto the floor of the cleaning process unit 203 when the rotor rotating mechanism 277 is slid in the horizontal direction to permit the rotor 234 to retreat from within the outside chamber 271a and when the posture of the rotor rotating mechanism 227 is changed from the lateral posture into the vertical posture. In such a case, the liquid receptacle 233a makes it possible to prevent the liquid droplets of the cleaning liquid from falling down.

Also, a spurting nozzle 273b is mounted to the lid 233. A pure water or gas is spurted from the spurting nozzle 273b toward that surface of the disc 235b which faces the lid 233. The cleaning liquid such as a pure water and a drying gas such as a $N_2$ gas, which are spurted from the spurting nozzle 253 mounted to the outside chamber 271a, is unlikely to strike directly that surface of the disc 235b which is positioned to face the lid 233, giving rise to the problem in the conventional apparatus that it is difficult to clean away the chemical liquid used in the preceding stage. However, the spurting nozzle 273b used in the present invention makes it possible to wash and dry the disc 235b in accordance with the cleaning process step of the wafer W.

In the cleaning process apparatus 200 of the present invention, used is the rotor rotating mechanism 227 in which the rotor 234, the lid 233 and the motor 231a are formed integral, making it possible to change the posture of the rotor rotating mechanism 227 during the transfer of the rotor rotating mechanism 227. It follows that it is unnecessary to arrange a mechanism for changing the posture of the wafer W between the wafer transfer device 216 and the rotor rotating mechanism 227. As a result, the transfer system of the wafer W can be simplified, and the footprint of the cleaning process apparatus 200 can be diminished. It should also be noted that it is possible to control easily the movement of the rotor 234 into and out of the outside chamber 271a. It is also possible to decrease the number of times of transplanting operation of the wafer W, with the result that it is possible to suppress the damage done to the wafer W and the contamination such the attachment of the particles. Further, since the rotor 234 and the lid 233 are formed integral, it is possible to set small the distance d between the rotor 234 and the upper surface of the lid 233, thereby diminishing the volume of each of the outside chamber 271a and the inside chamber 271b. It follows that the process chamber 270 can be miniaturized so as to enhance the uniformity of the liquid processing.

A bearing 232a is arranged between the pivot 250 and the pivot cover 232 surrounding the pivot 250 so as to permit the pivot 250 to be rotatable. Also, a seal structure is employed in the portion where the pivot 250 extends through the lid 233, thereby preventing the chemical liquid or the like from permeating from the process chamber 270 into the region around the pivot 250. It should also be noted that, since the friction portion between the pivot 250 and the pivot cover 232 and the motor 231a provide the sources of the particle generation, a local exhaust mechanism is arranged so as to prevent the particles or the like from being diffused into the transfer section 203a.

The clamp pads 275a, 275b are arranged in the pivot cover 232 in positions that are substantially in symmetry with respect to the axis in the longitudinal direction. On the other hand, the clamp levers 276a, 276b are arranged in the ring member 262a of the outside chamber 271a. These clamp levers 276a and 276b are swingable by a predetermined angle between the operating position denoted by solid lines in FIG. 23B and the retreat position denoted by dotted lines. These clamp levers 276a, 276b are engaged in the operating positions with the clamp pads 275a, 275b so as to hold the pivot cover 232 therebetween.

Since the pivot cover 232 is held between the clamp levers 276a and 276b in their operating positions, it is possible to suppress the movement and vibration occurring in the pivot 250 when, for example, the rotor 234 is rotated by driving the motor 231a so as to make it possible to rotate stably the rotor 234. To be more specific, the movement or vibration noted above occurs in the pivot 250 when a large acceleration is applied to the rotor 234, i.e., when the rotation of the rotor 234 is started or stopped, when the rotating speed is switched, and when the rotating direction of the rotor 234 is reversed. Also, the rotation of the pivot 250 can be also stabilized in the case where the rotor 234 is rotated at a predetermined speed. Further, since it is possible to suppress the movement during rotation of the rotor 234, the stress applied to the constituting members of the rotor rotating mechanism 227 can be lowered so as to prolong the life of the constituting members of the rotor rotating mechanism 227.

As described previously, the pivot cover 232 is joined to the posture changing mechanism 228, the posture changing mechanism 228 is engaged with the Z-axis driving mechanism 229, and the Z-axis driving mechanism 229 is engaged with the X-axis driving mechanism 230. It follows that it is possible to fix more firmly the rotor rotating mechanism 227 during the liquid processing to the outside chamber 271a by using the clamp levers 276a, 276b, though the rotor rotating mechanism 227 results in the state of being held by the X-axis driving mechanism 230.

The constituents of the cleaning section 203b will now be described. A pure water, IPA or a $N_2$ gas, etc., is supplied from a cleaning liquid supply source such as a chemical liquid storing unit 205 into the spurting port 253 forming a cylindrical body 261a constituting the outside chamber 271a, and a pure water or the like is spurted from the spurting ports 254 toward the wafers W held in the rotor 234. It is desirable for the pure water or the like to be spurted from the cleaning liquid spurting ports 254 in a manner to be expanded in a substantially conical shape so as to permit the pure water or the like to strike the large area of the wafer W.

FIGS. 24 and 25 show only one spurting nozzle 253. However, it is possible to arrange a plurality of spurting nozzles. Also, it is not absolutely necessary to arrange the spurting nozzle 253 right above the cylindrical body 261a. This is also the case with the spurting nozzle 255 mounted in the inside chamber 271b.

The outer diameter of the cylindrical body 261a on the side of the ring member 262b is larger that that on the side of the ring member 262a. Also, the cylindrical body 261a is inclined such that the portion of the cylindrical body 261a on the side of the ring member 262b is positioned lower than the portion on the side of the ring member 262a. It follows that the various chemical liquids spurted from the cleaning liquid spurting ports 254 toward the wafer W are caused to flow naturally along the bottom surface of the cylindrical body 261a from the side of the ring member 262a toward the ring member 262b so as to flow into an exhaust gas/waste liquid discharge pipe 265a and, thus, to be discharged into a drain arranged outside the system.

A liquid receptacle 262e is arranged in a lower portion outside the ring member 262a in order to prevent the cleaning liquid or the like attached to the lid 233, the seal mechanism 263a, etc. from leaking to the outside through the rotor delivery port 262c when the rotor rotating mechanism 227 is taken out. As a result, it is possible to keep clean the cleaning section 203b.

Unlike the cylindrical body 261a constituting the outside chamber 271a, the cylindrical body 261b constituting the inside chamber 271b is in the shape of a cylinder and is arranged horizontal. In other words, the outer diameter of the cylindrical body 261b on the side of the ring member 266a is equal to that on the side of the ring member 266b. In order to facilitate the discharge of the cleaning liquid to the outside, a groove portion 269 projecting downward from the cylindrical body 261b and having a predetermined inclination is formed in a lower portion of the cylindrical body 261b. As a result, when the inside chamber 271b is in its operating position, the cleaning liquid spurted from the spurting nozzle 255 toward the wafers W is caused to flow along the groove portion 269 so as to be discharged to a drain through the exhaust gas/waste liquid discharge pipe 265b.

Various chemical liquids are supplied from a cleaning liquid supply source such as the chemical liquid storing unit 205 into the spurting nozzle 255, and the cleaning liquid or the like are spurted from the cleaning liquid spurting ports 256 of the nozzle 255 toward the wafers W held in the rotor 234.

It is desirable for the chemical liquid or the like to be spurted from the cleaning liquid spurting ports 256 in a manner to be expanded in, for example, a fan shape in a substantially flat plane so as to permit the chemical liquid or the like to strike against the wafers W in a concentrated fashion. In this case, it is particularly desirable for the number of cleaning liquid spurting ports 256 to be equal to the number of wafers W held in the rotor 234 in order to permit the chemical liquid to strike against the surfaces of the wafers W. It is possible to permit the chemical liquid or the like spurted from the cleaning liquid spurting ports 256 to strike against the wafers W without fail by controlling the sliding amount of the rotor rotating mechanism 227 so as to finely control the position of the rotor 234 within the inside chamber 271b when the X-axis driving mechanism 230 is driven to slide the rotor rotating mechanism 227 in the X-direction.

It should be noted that, when the inside chamber 271b is cleaned by using the cleaning mechanism 290, it is possible to spurt a pure water or a $N_2$ gas from the cleaning liquid spurting ports 256.

When the inside chamber 271b is in its operating position, the clearance between the ring member 266a and the lid 233 is sealed by the seal mechanism 267a, the clearance between the ring member 266b and the ring member 262b is sealed by the seal mechanism 263b, and the clearance between the ring member 266b and the disc 292a is sealed by the seal mechanism 267b, as shown in FIG. 25. It follows that, when the inside chamber 271b is in its operating position, the process chamber 252 is formed by the cylindrical body 261b, the ring members 266a, 266b, the disc 292a and the lid 233.

When the inside chamber 271b is in its retreat position, the clearance between the ring member 266a and the ring member 262b is sealed by the seal mechanism 263b, and the clearance between the ring member 266a and the disc 292a is sealed by the seal mechanism 267a. Also, where the rotor 234 is inserted into the outside chamber 271a, the clearance between the lid 233 and the ring member 262a is sealed by the seal mechanism 263a. Therefore, when the inside chamber 271b is in its retreat position, a process chamber 251 is formed by the cylindrical body 261a, the ring members 262a, 262b, the disc 292a, the ring member 266a of the inside chamber 271b, and the lid 233 of the rotor rotating mechanism 227, as shown FIG. 24.

When the inside chamber 271b is in its retreat position, the process chamber 251 is formed on the side of the outside chamber 271a as described above. Also, the clearance between the ring member 266a and the disc 292a is sealed by the seal mechanism 267a, and the clearance between the ring member 266b and the ring member 292b is sealed by the seal mechanism 267b, with the result that a narrow substantially cylindrical cleaning process chamber 272 is formed between the outer circumferential surface of the cylindrical body 291 and the inner circumferential surface of the cylindrical body 261b. It is possible to spurt a drying gas such as a $N_2$ gas or the air from gas supply nozzles 293 mounted in a plurality of positions on the cylindrical body 291 toward the cleaning process chamber 272. In this fashion, the spurted drying gas can be discharged from an exhaust pipe 294.

If the inside chamber 271b is moved to its retreat position after the treatment with a predetermined chemical liquid is applied to the wafers W in the process chamber 252 by moving the inside chamber 271b to its operating position, it is possible to carry out in succession the washing treatment with, for example, a pure water and a drying treatment with a drying gas in the process chamber 251. On the other hand, it is possible to spurt a pure water from the spurting nozzle 255 into the cleaning process chamber 272, followed by spurting a drying gas from the gas supply nozzle 293 into the cleaning process chamber 272 so as to cleanse the inner region of the inside chamber 271b in preparation for the next treatment of the wafer W with a chemical liquid. It is possible to dry the spurting nozzle 255 by spurting a drying gas from the spurting nozzle 255 in the step of spurting a drying gas from the gas supply nozzle 293.

Incidentally, under the state that the rotor 234 is inserted into the outside chamber 271a, the pure water or the drying gas spurted from the spurting nozzle 255 is unlikely to strike directly that surface of the disc 235b which faces the lid 233. Likewise, the particular pure water or the drying gas is unlikely to strike directly that surface of the disc 235a which faces the disc 292a. To overcome this difficulty, it is made possible to spurt a cleaning liquid or a drying gas from the spurting nozzle 273a mounted to the disc 292a in order to clean and dry the disc 235a. It is possible to spurt a predetermined gas such as an oxygen ($O_2$) gas or a carbon dioxide ($CO_2$) gas by using the spurting nozzle 273a and the spurting nozzle 273b referred to above in order to establish a predetermined gaseous atmosphere within the process chambers 251 and 252. It is possible to exhaust the gas supplied into the process chambers 251, 252 through not only the exhaust gas/waste liquid discharge §pipes 265a, 265b but also the exhaust pipe 273c mounted to the disc 292a.

The cleaning treatment process will now be described, covering the case where the wafers W housed in the FOUP F disposed on the FOUP stage 202a, i.e., the FOUP F1, and the FOUP F disposed on the FOUP stage 202b, i.e., the FOUP F2, are subjected to the cleaning treatment in the cleaning process apparatus 200. In the first step, the FOUPs F1 and F2 each having 25 wafers W disposed therein in parallel a predetermined distance apart from each other are disposed on the FOUP stages 202a and 202b, respectively, such that the wafer delivery ports 212a, 212b of these FOUPs F1, F2 through which the wafers W are transferred into and out of the FOUPs F1 and F2 are allowed to face the window portions 212a. 212b.

In the first step, in order to take the wafers W out of the FOUP F1, the window portion 212a is opened so as to allow the inner space of the FOUP F1 to communicate with the inner space of the wafer transfer unit 204. Then, the number of wafers W housed in the FOUP F1 is counted by using the wafer inspecting mechanism 310. At the same time, the housed state of the wafers W within the FOUP F1 is inspected by the wafer inspecting mechanism 310. If an abnormality has been found in the housed state of the wafers W, the processing of the wafers W housed in the FOUP F1 is interrupted, and the operation is changed to the processing of the wafers W housed in, for example, the FOUP F2.

If an abnormality has not been found in the housed state of the wafers W within the FOUP F1, the wafer transfer device 216 is operated so as to transplant all the wafers W housed in the FOUP F1 onto the transfer arm 217a and, then, the linear driving mechanism 219 and the rotating mechanism 222 are operated so as to move the wafer transfer device 216 to the position where the transfer arm 217a is capable of gaining access to the rotor 234. The height position of the transfer arm 217a is adjusted by operating the lift mechanism 223, and the window portion 225a is opened. Under this condition, the transfer arm 217a holding the wafers W is inserted into the rotor 234, followed by operating the holder 236b, etc. by using the holder opening/closing mechanism 280 so as to transplant the wafers W into the rotor 234.

If the wafers W are housed in the rotor 234, the Z-axis driving mechanism 229, the posture changing mechanism 228 and the X-axis driving mechanism 230 are operated so as to insert the rotor 234 into the outside chamber 271a and move the rotor rotating mechanism 227 such that the lid 233 is positioned in the rotor delivery port 262c in accordance with the mode of movement of the rotor rotating mechanism 227 described previously in conjunction with FIGS. 26A to 26E. If the rotor rotating mechanism 227 has been moved to the predetermined position, the clamp levers 276a, 276b are moved from the retreat positions to the operating positions so as to have the clamp pads 275a, 275b sandwiched therebetween, thereby holding the pivot cover 232.

In the next step, the seal mechanism 263a is operated so as to seal the clearance between the side surface of the lid 233 and the rotor delivery port 262c, followed by moving the inside chamber 271b to the operating position. Then, the seal mechanism 267a is operated so as to seal the clearance between the side surface of the lid 233 and the rotor delivery port 266c. Further, the seal mechanisms 263b, 267b are operated so as to seal the clearances between the ring member 262b and the ring member 266b and between the ring member 266b and the disc 292a, respectively, thereby forming the process chamber 252. Incidentally, it is also possible to move in advance the inside chamber 271b into the operating position and to insert the rotor 234 into the inside chamber 271b. In this case, the clearances between the side surface of the lid 233 and rotor delivery port 262c and between the side surface of the lid 233 and the rotor delivery port 266c are sealed by operating the seal mechanisms 263a and 267a, respectively.

If the process chamber 252 has been formed, a predetermined chemical liquid is supplied from the cleaning liquid spurting ports 256 onto the wafers W while rotating the rotor 234 by driving the motor 231a, thereby performing the treatment of the wafers W with a chemical liquid. It should be noted that, since the pivot cover 232 is held by the clamp levers 276a, 276b, the movement of the pivot 250 can be prevented even if the rotor 234 is rotated at different speeds or is rotated in the reverse direction.

After completion of the treatment of the wafers W with a chemical liquid, the operation of the seal mechanisms other than the seal mechanism 263a, i.e., the operation of the seal mechanisms 263b, 267a and 267b, is released, and the inside chamber 271b is moved to the retreat position. Then, the seal mechanisms 263b, 267a and 267b are operated so as to seal the clearances of the ring member 262b, the ring member 266a and the disc 292a. Further, the clearance between the ring member 266b and the disc 292b is also sealed. As a result, formed is the cleaning process chamber 272. In the cleaning process chamber 272 thus formed, the washing and drying treatments of the inside chamber 271b are carried out by using the cleaning mechanism 290 in preparation for the processing of the wafers W in the next lot. On the other hand, washing treatment is carried out in the process chamber 251 formed by the outside chamber 271a by spurting a pure water from the spurting nozzle 253 and the spurting nozzles 273a, 273b while rotating the wafers W, followed by performing a drying treatment with, for example, a $N_2$ gas.

While the wafers W are being processed in the cleaning process unit 203 as described above, the wafer transfer device 216, which is in the state of not holding the wafers W, is moved in the wafer transfer unit 204 to permit the transfer arm 217a to be capable of gaining access to the FOUP F2 disposed on the FOUP stage 202b. Then, the wafers W housed in the FOUP F2 are transplanted into the transfer arm 217a by employing the method similar to that employed for taking the wafers W out of the FOUP F1. Further, the wafer transfer device 216 is moved to the position where the transfer arm 217b not holding the wafers W is capable of gaining access to the rotor 234 via the window portion 225a under the state that the transfer arm 217a holds the unprocessed wafers W.

After completion of the cleaning treatment within the cleaning process unit 203, the operation of the seal mechanism 263a is released. Also, the clamp levers 276a, 276b are moved to the retreat positions so as to release the holding of the pivot cover 232. Further, the X-axis driving mechanism 230, etc. are driven so as to bring the rotor rotating mechanism 227 holding the wafers W back to the position where the wafers W can be transplanted between the transfer arms 217a, 217b and the rotor 234.

The holder opening/closing mechanism 280 is moved to the operating position so as to open the window portion 225a. Then, after the transfer arm 217b is allowed first to gain access to the rotor 234, the holder 236b is opened so as to transplant the wafers W held in the rotor 234 into the transfer arm 217b, followed by rotating the table 221 by 180° by operating the rotating mechanism 222 such that the transfer arm 217a is capable of gaining access to the rotor 234 and subsequently transplanting the unprocessed wafers W held by the transfer arm 217a into the rotor 234.

The cleaning treatment is applied to the unprocessed wafers W taken out of the FOUP F2 held by the rotor 234 by the process similar to that of the cleaning treatment of the wafers W taken out of the FOUP F1, which was described previously. Then, the wafers W are moved to the position where the delivery of the wafers W can be performed between the transfer arms 217a and 217b. On the other hand, the wafer transfer device 216 is moved to permit the transfer arm 217b to be capable of gaining access to the FOUP F1 so as to transplant the wafers W after the cleaning treatment into the FOUP F1, followed by allowing the wafer transfer device 216 to permit the transfer arm 217b to gain access to the rotor 234.

After completion of the cleaning treatment, the transfer arm 217b receives the wafers W taken out of the FOUP F2 from the rotor 234, and these wafers W are housed in the FOUP F2, thereby finishing the cleaning treatment of the wafers W housed in the FOUPs F1 and F2. Where, for example, a FOUP F3 is disposed on a FOUP stage 202c, a predetermined cleaning treatment can be performed in succession by transplanting the wafers W housed in the FOUP F3 into the transfer arm 217a after completion of the processing of the wafers W housed in the FOUP F1 and by transplanting the wafers W held by the transfer arm 217a into the rotor 234 after the wafers W taken out of FOUP F2 whose cleaning treatment has been finished have been taken out of the rotor 234.

The liquid processing apparatus of the present invention is not limited to the cleaning process apparatuses 1, 100, 101 and 200 described above, and the present invention can be worked in variously modified fashions.

First of all, the cleaning was performed while rotating the wafer W with the wafer W held substantially horizontal in each of the cleaning process apparatuses 1, 100, 101 and 200. However, it is also possible to perform the cleaning while rotating the wafer W with the wafer W held inclined such that the surface of the wafer W and the horizontal plane form an optional angle falling within a range of, for example, 45° to 90°.

When it comes to the cleaning process apparatus 100, it is possible to perform the liquid processing by arranging the wafers W in the process chamber 151 with the angle of inclination of the posture changing mechanism 109 set optionally. The particular state can be realized by, for example, inclining the arranged state of the process chamber 151 and the shape of the rotor delivery port 153 to conform with the angle of inclination of the wafer W, or by changing the angle at which the pivot 137 extends through the disc 138 though the pivot 137 in the cleaning process apparatus 100 extends through the disc 138 in a direction perpendicular to the disc 138.

It should also be noted that the process chamber in the embodiments described above is of a double wall structure consisting of the outside chamber and the inside chamber. However, it is possible for the cleaning process apparatus of the present invention to include at least three process chambers or to include only one process chamber. It is also possible to use one of the outside chamber and the inside chamber exclusively for the cleaning treatment, with the other being used exclusively for the drying treatment.

Also, in any of the embodiments described above, the cleaning treatment was carried out by moving the wafers W to the position where the process chamber is arranged. Alternatively, it is also possible to carry out the cleaning treatment by sliding the process chamber toward the spin plate 31 or the rotors 131, 234 holding the wafers W without arranging the slide mechanism in the horizontal direction in respect of the spin plate 31 and the rotors 131, 234 holding the wafers W.

Figure 30:
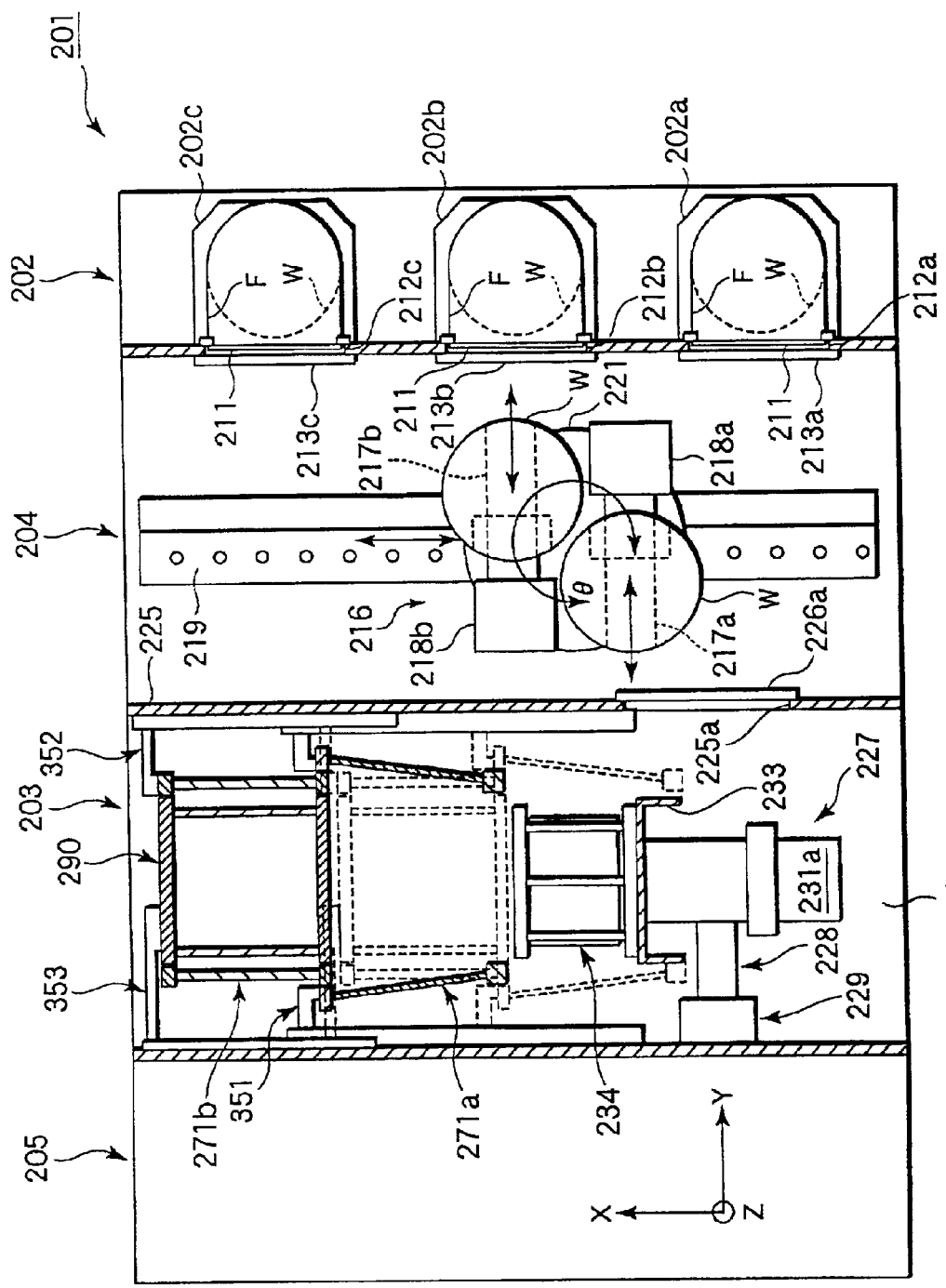
FIG. 30 is a cross-sectional plan view schematically showing the construction of a batch type cleaning process apparatus according to still another embodiment of the liquid processing apparatus of the present invention.
Figure 31:
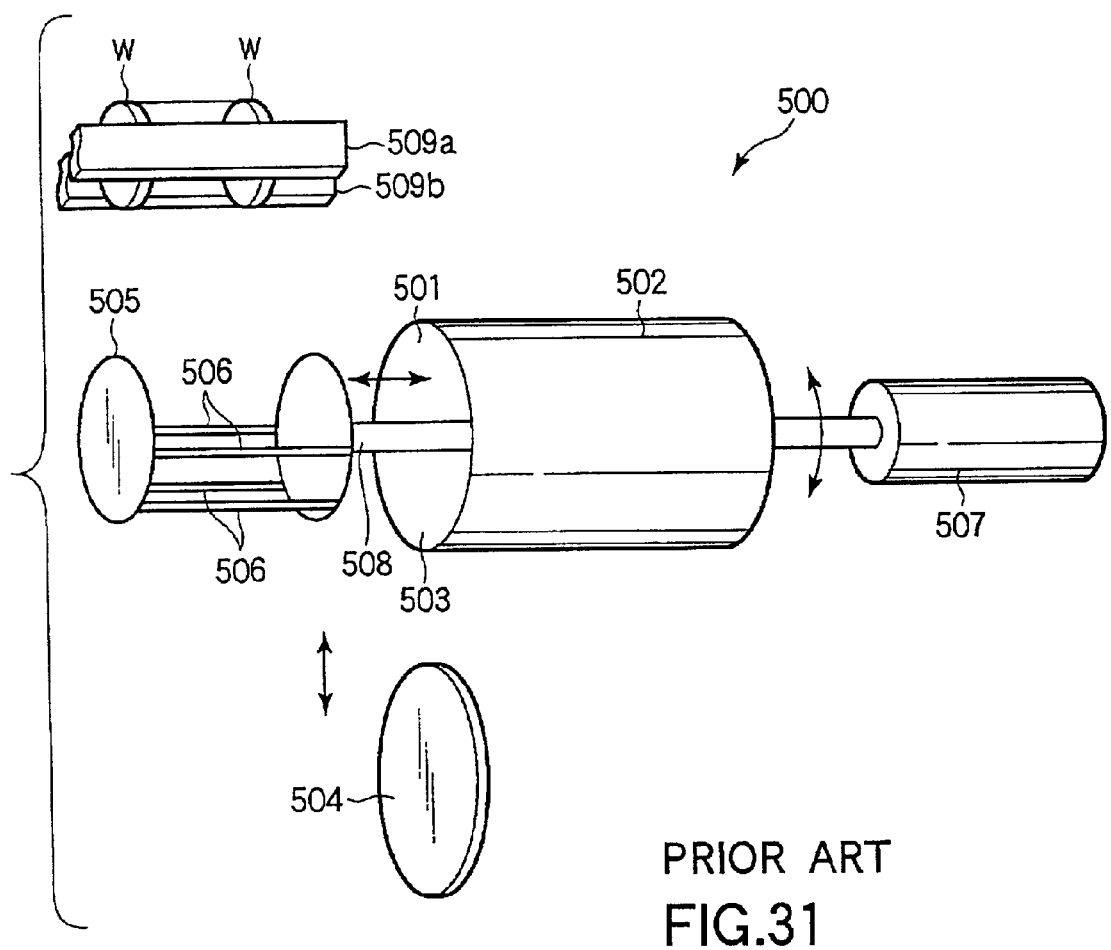
FIG. 31 schematically shows the construction of a conventional batch type cleaning process apparatus.

FIG. 30 is a cross-sectional plan view schematically showing the construction of a cleaning process apparatus 201 prepared by modifying the construction of the cleaning process apparatus 200. As apparent from the drawing, the cleaning process apparatus 201 is not provided with the X-axis driving mechanism 230 included in the liquid process apparatus 200 and, thus, the rotor driving mechanism 227 is incapable of movement in the X-direction. However, a first slide mechanism 351 is mounted to the outside chamber 271a, a second slide mechanism 352 is mounted to the inside chamber 271b, and a third slide mechanism 353 is mounted to the cleaning mechanism 290, thereby allowing the outside chamber 271a, the inside chamber 271b and the cleaning mechanism 290 to be slidable in the X-direction.

In FIG. 30, the process position at which the outside chamber 271a, the inside chamber 271b and the cleaning mechanism 290 carry out the cleaning treatment of the wafer W is denoted by dotted lines, and the retreat position at which the cleaning treatment of the wafer W is not carried out is denoted by solid lines.

In the cleaning process apparatus 201, the rotor rotating mechanism 227 held in its lateral posture by the posture changing mechanism 228 is held elevated to a predetermined height by the Z-axis driving mechanism 229, and the outside chamber 271a, the inside chamber 271b, and the cleaning mechanism 290 are slid together toward the rotor 234 so as to allow the rotor 234, which is held stationary, to be housed in the outside chamber 271a.

If the second slide mechanism 352 alone is further driven from the state noted above so as to allow the inside chamber 271b to be housed in the outside chamber 271a, it is possible to carry out the cleaning treatment of the wafer W by using the inside chamber 271b.

After completion of the liquid processing carried out in the inside chamber 271b, the second slide mechanism 352 is driven so as to retreat the inside chamber 271b from within the outside chamber 271a. In this case, the washing and the drying treatments using the cleaning mechanism 290 is carried out in the inside chamber 217b, and the washing and the drying treatments are carried out in the outside chamber 271a.

After completion of the cleaning treatment of the wafer W, the first to third slide mechanisms 351 to 353 are driven so as to bring the outside chamber 271a, the inside chamber 271b, and the cleaning mechanism 290 back to the original positions simultaneously. On the other hand, the posture of the rotor rotating mechanism 227 is changed into the vertical posture and the rotor rotating mechanism 227 is held in the position where the wafer W is delivered to the wafer transfer device 216.

What should also be noted is that the liquid processing apparatus of the present invention is applied to the cleaning process apparatus in any of the embodiments described above. However, it is also possible to apply the liquid processing apparatus of the present invention to a coating process apparatus for coating a predetermined coating liquid, to an etching process apparatus, etc. Further, in any of the embodiments described above, a semiconductor wafer is used as the substrate to be processed. However, it is also possible to apply the present invention to the liquid processing that handles other substrates such as a substrate for a liquid crystal display device (LCD).

The embodiments described above are intended to clarify the technical idea of the present invention. The present invention should not be limited to only the embodiments described above for interpretation of the technical scope of the present invention. In other words, the present invention can be worked in variously modified fashions within the scope of the spirit of the present invention and within the range defined in the claims which follow.

What is claimed is:

1. A liquid processing apparatus, in which a process liquid is supplied to a substrate for performing a liquid processing, comprising:

a substrate rotating device including a holder for holding a substrate and a motor for rotating said holder;

a process chamber for applying said liquid processing to the substrate held substantially vertical by said holder;

a posture changing mechanism located outside of the process chamber for changing the posture of said substrate rotating device outside of said process chamber such that a state of the substrate held by said holder changes between substantially vertical and substantially horizontal; and a position adjusting mechanism for relatively adjusting the positions of said process chamber and said substrate rotating device such that said holder is housed in said process chamber.

2. The liquid processing apparatus according to claim 1, wherein said process chamber is of a double wall structure comprising an outside chamber and an inside chamber movable between the process position within said outside chamber and the retreat position outside said outside chamber.

3. A liquid processing apparatus according to claim 1, further comprising a container delivery section for performing the delivery of a container having a plurality of substrates housed therein substantially horizontal a predetermined distance apart from each other and a substrate transfer device for transferring the substrate in substantially a horizontal state between the container disposed in said container delivery section and said holder.

4. A liquid processing apparatus according to claim 3, wherein said substrate transfer device includes a transfer arm for transferring the unprocessed substrates and another transfer arm for transferring the processed substrates.

5. A liquid processing apparatus according to claim 3, comprising a plurality of said process chambers and a plurality of said substrate rotating devices, said substrate transfer device including a moving mechanism for gaining access to said plural substrate rotating device.

6. A liquid processing apparatus, in which a process liquid is supplied to a substrate for performing a liquid processing, comprising:

a substrate rotating device including a holder for holding a substrate and a motor for rotating said holder;

a process chamber for applying said liquid processing to the substrate held substantially vertical by said holder;

a posture changing mechanism located outside of the process chamber for changing the posture of said substrate rotating device outside of said process chamber such that a state of the substrate held by said holder change between substantially vertical and substantially horizontal;

a position adjusting mechanism for relatively adjusting the positions of said process chamber and said substrate rotating device together with said posture changing mechanism such that said holder is housed in said process chamber.

7. A liquid processing apparatus according to claim 6, wherein said holder is shaped to hold a single substrate.

8. A liquid processing apparatus according to claim 7, further comprising a container delivery section for performing the delivery of a container having a plurality of substrates housed therein substantially horizontal a predetermined distance apart from each other and a substrate transfer device for transferring the substrate in substantially a horizontal state between the container disposed in said container delivery section and said holder.

9. A liquid processing apparatus according to claim 8, wherein said substrate transfer device includes a transfer arm for transferring the unprocessed substrates and another transfer arm for transferring the processed substrates.

10. A liquid processing apparatus according to claim 8, comprising a plurality of said process chambers and a plurality of said substrate rotating devices, said substrate transfer device including a moving mechanism for gaining access to said plural substrate rotating device.

11. The liquid processing apparatus according to claim 7, wherein said process chamber is of a double wall structure comprising an outside chamber and an inside chamber movable between the process position within said outside chamber and the retreat position outside said outside chamber.

12. A liquid processing apparatus according to claim 6, wherein said holder is shaped to hold substantially in parallel a plurality of substrates.

13. A liquid processing apparatus according to claim 12, further comprising a container delivery section for performing the delivery of a container having a plurality of substrates housed therein substantially horizontal a predetermined distance apart from each other and a substrate transfer device for transferring the substrate in substantially a horizontal state between the container disposed in said container delivery section and said holder.

14. A liquid processing apparatus according to claim 13, wherein said substrate transfer device includes a plurality of transfer arms for transferring the substrates housed in the container in a single operation, each of said plural arms holding a single substrate.

15. A liquid processing apparatus according to claim 14, wherein said substrate transfer device includes a mechanism for adjusting the distance between adjacent arms of said plural transfer arms.

16. A liquid processing apparatus according to claim 13, wherein said holder is capable of holding the substrates housed in two containers in a single operation.

17. The liquid processing apparatus according to claim 12, wherein said process chamber is of a double wall structure comprising an outside chamber and an inside chamber movable between the process position within said outside chamber and the retreat position outside said outside chamber.

18. A liquid processing apparatus, in which a process liquid is supplied to a substrate for performing a liquid processing, comprising:

a substrate rotating device including a holder for holding a substrate and a rotating device for rotating said holder;

a posture changing mechanism for changing the posture of said substrate rotating device such that a state of the substrate held by said holder changes between substantially vertical and substantially horizontal;

a process chamber for applying said liquid processing to the substrate held substantially vertical by said holder; and a position adjusting mechanism for relatively adjusting the positions of said process chamber and said holder such that said holder is housed in said process chamber, wherein said process chamber is of a double wall structure comprising an outside chamber and an inside chamber movable between the process position within said outside chamber and the retreat position outside said outside chamber.

19. A liquid processing apparatus, in which a process liquid is supplied to a substrate for performing a liquid processing, comprising:

a substrate rotating device including a holder for holding a substrate and a rotating device for rotating said holder;

a posture changing mechanism for changing the posture of said substrate rotating device such that a state of the substrate held by said holder changes between substantially vertical and substantially horizontal;

a process chamber for applying said liquid processing to the substrate held substantially vertical by said holder; and a position adjusting mechanism for relatively adjusting the positions of said process chamber and said holder such that said holder is housed in said process chamber, wherein said holder holds substantially in parallel a plurality of substrates, and wherein said process chamber is of a double wall structure comprising an outside chamber and an inside chamber movable between the process position within said outside chamber and the retreat position outside said outside chamber.

20. A liquid processing apparatus, comprising:

a cleaning unit, said cleaning unit comprising;

a process chamber having a spin plate insertion port;

a wafer rotating device having a spin plate, a pivot, and a motor; and a posture changing mechanism having a leg portion connected to a disc holding member, said disc holding member being connected to a stationary disc having a shape that covers the spin plate insertion port, said stationary disc having an opening for said pivot.

* * * * *